US012598869B2

(12) United States Patent
Kubota et al.

(10) Patent No.: US 12,598,869 B2
(45) Date of Patent: Apr. 7, 2026

(54) IMAGING DEVICE, DISPLAY APPARATUS, AND METHOD FOR MANUFACTURING DISPLAY APPARATUS

(71) Applicant: Semiconductor Energy Laboratory Co., Ltd., Atsugi (JP)

(72) Inventors: Daisuke Kubota, Atsugi (JP); Kazuya Sugimoto, Hadano (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 487 days.

(21) Appl. No.: 18/122,773

(22) Filed: Mar. 17, 2023

(65) Prior Publication Data

US 2023/0309346 A1 Sep. 28, 2023

(30) Foreign Application Priority Data

Mar. 25, 2022 (JP) ................................. 2022-049798

(51) Int. Cl.
*H10K 59/122* (2023.01)
*H10K 39/34* (2023.01)
*H10K 59/35* (2023.01)

(52) U.S. Cl.
CPC ........... *H10K 59/122* (2023.02); *H10K 39/34* (2023.02); *H10K 59/35* (2023.02)

(58) Field of Classification Search
CPC ............................... H10K 39/32; H10K 39/34
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |
| 7,399,991 | B2 | 7/2008 | Seo et al. |
| 7,663,149 | B2 | 2/2010 | Seo et al. |
| 2002/0072139 | A1 | 6/2002 | Kashiwabara |

(Continued)

FOREIGN PATENT DOCUMENTS

| | | |
|---|---|---|
| JP | 2000-036385 A | 2/2000 |
| JP | 2002-324673 A | 11/2002 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Daniel P Shook
(74) *Attorney, Agent, or Firm* — Eric J. Robinson; Robinson Intellectual Property Law Office, P.C.

(57) ABSTRACT

A display apparatus with a high aperture ratio can be provided. A display apparatus with a personal authentication function can be provided. A display apparatus having high display quality can be provided. A highly reliable display apparatus can be provided. A display apparatus that can have a higher resolution can be provided. A display apparatus with low power consumption can be provided. An imaging device includes a pixel electrode, a first layer over the pixel electrode, an insulating layer covering part of the top surface of the first layer, and a common electrode covering the first layer and the insulating layer, and the first layer includes a photoelectric conversion layer.

14 Claims, 33 Drawing Sheets

(56) References Cited

U.S. PATENT DOCUMENTS

| | | | |
|---|---|---|---|
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2014/0056493 A1 | 2/2014 | Gozzini | |
| 2015/0060826 A1 | 3/2015 | Matsumoto. et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2020/0203662 A1 | 6/2020 | Mollard et al. | |
| 2021/0005669 A1* | 1/2021 | Kamada | H10K 39/34 |
| 2021/0305320 A1* | 9/2021 | Lim | H10K 85/40 |
| 2021/0327979 A1 | 10/2021 | Kamada et al. | |
| 2022/0173174 A1 | 6/2022 | Hatsumi et al. | |
| 2022/0278177 A1 | 9/2022 | Kubota et al. | |

FOREIGN PATENT DOCUMENTS

| | | | |
|---|---|---|---|
| JP | 2003-059663 A | 2/2003 | |
| JP | 2008-098106 A | 4/2008 | |
| JP | 2008-147072 A | 6/2008 | |
| JP | 2008-251270 A | 10/2008 | |
| JP | 2012-160473 A | 8/2012 | |
| JP | 2014-120218 A | 6/2014 | |
| JP | 2014-135251 A | 7/2014 | |
| JP | 2014-232568 A | 12/2014 | |
| JP | 2015-115178 A | 6/2015 | |
| JP | 2016-197494 A | 11/2016 | |
| JP | 2019-179696 A | 10/2019 | |
| JP | 2020-160305 A | 10/2020 | |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner 405R, 405G, 405B 405R, 405G, 405B 405R, 405G, 405B 405R, 405G, 405B FIG. 24A                     FIG. 24B
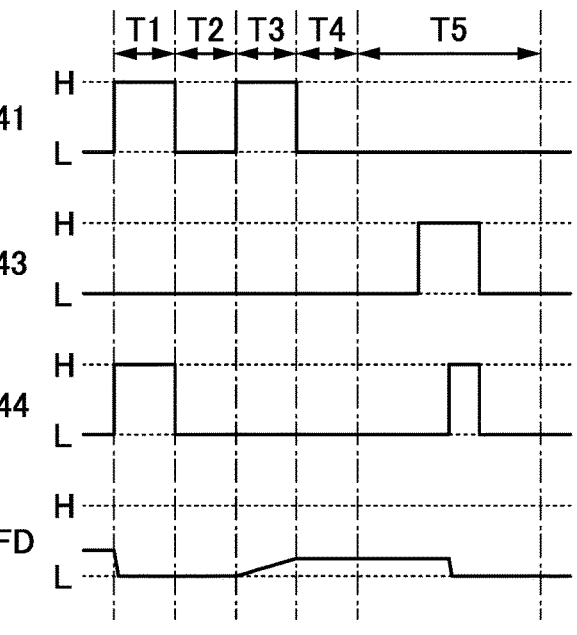

200A

FIG. 27A
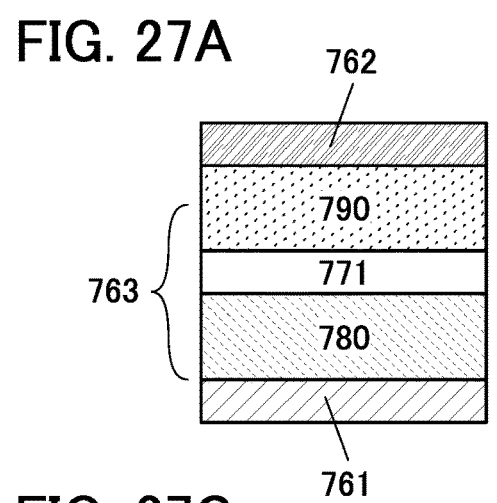
FIG. 27B
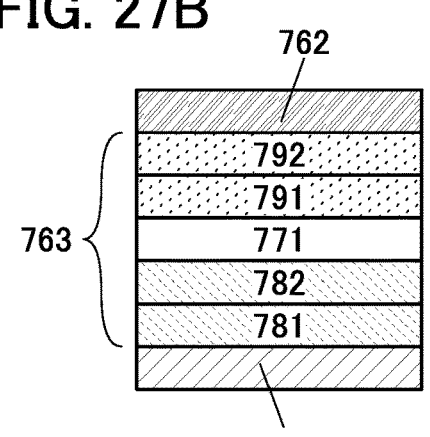
FIG. 27C
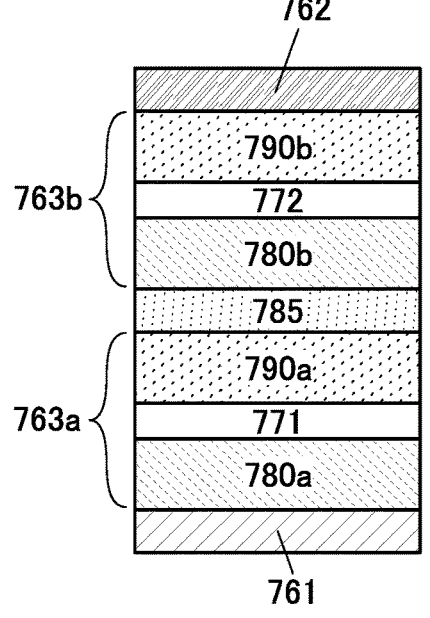
FIG. 27D
FIG. 27E
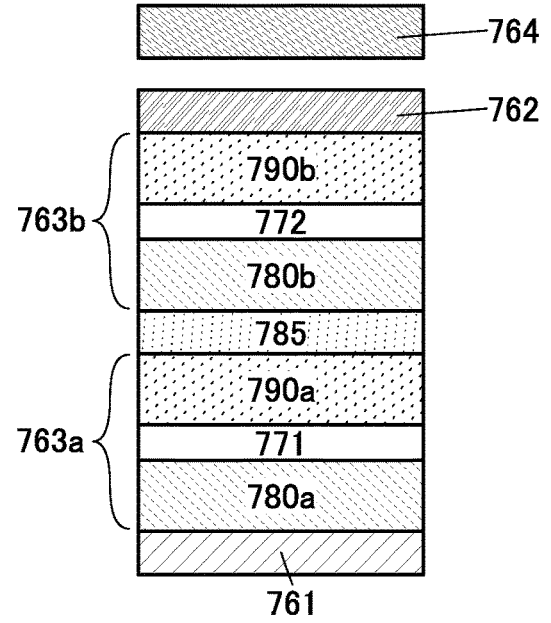
FIG. 27F

FIG. 29A
FIG. 29B
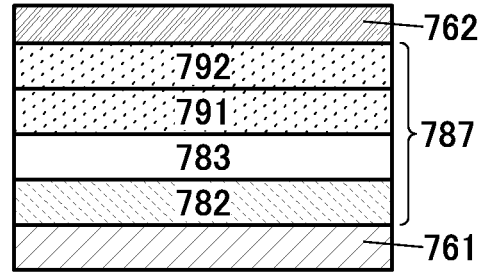
FIG. 29C
FIG. 29D
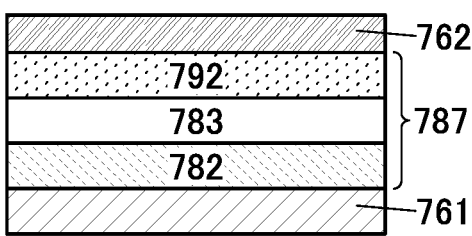
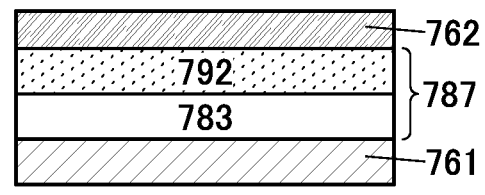
FIG. 29E
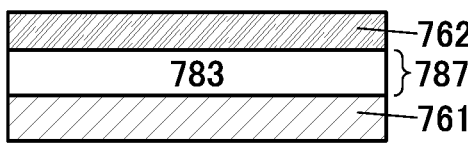

FIG. 31A
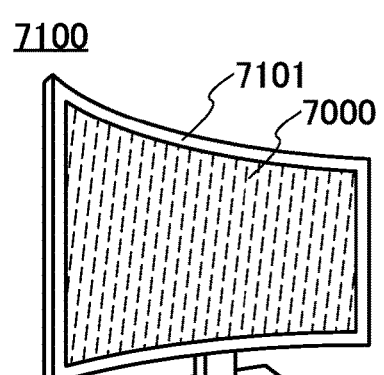
7100
7101
7000
7103
FIG. 31B
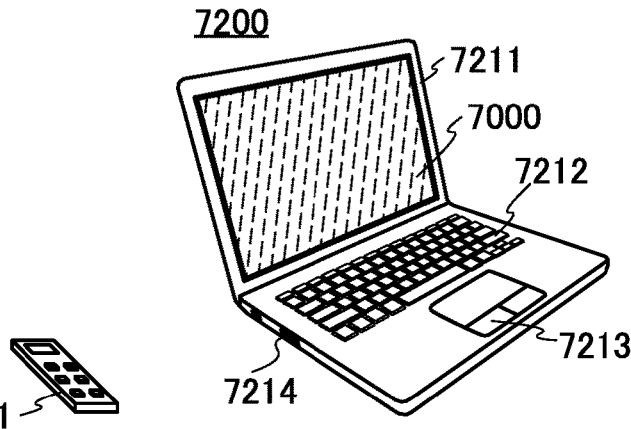
7200
7211
7000
7212
7213
7214
7111
FIG. 31C
7300
7301
7303
7000
7311
FIG. 31D
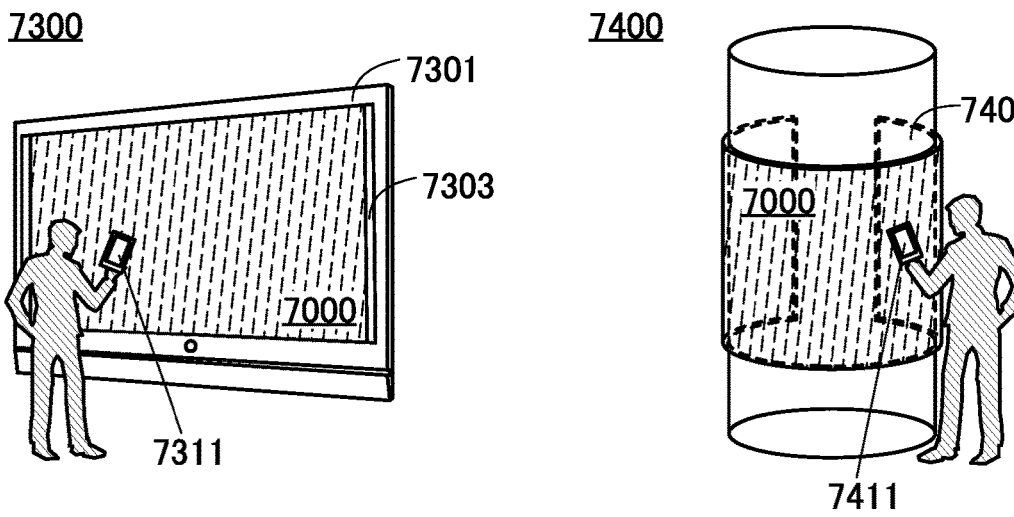
7400
7401
7000
7411

FIG. 32A
9101
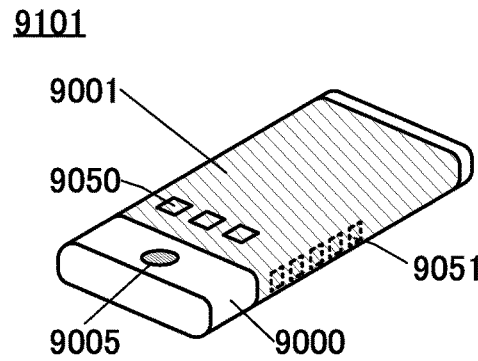
FIG. 32B
9102
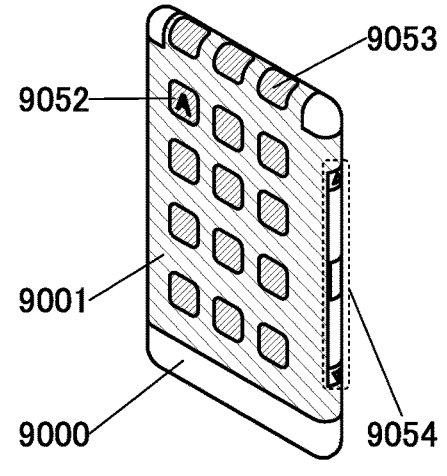
FIG. 32C
9103
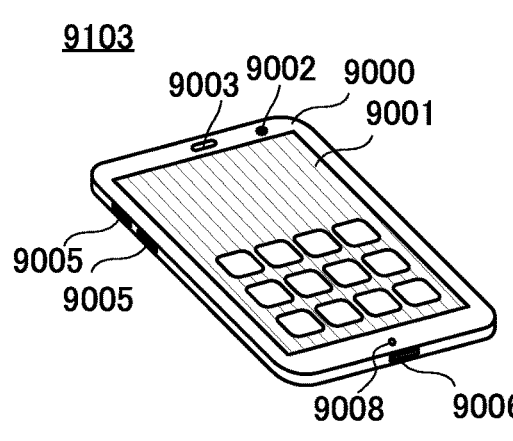
FIG. 32D
9200
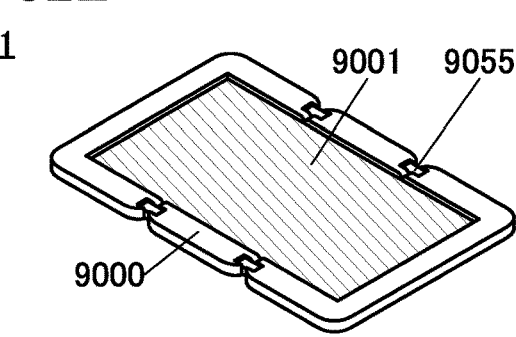
FIG. 32E
9201
FIG. 32F
9201
FIG. 32G
9201
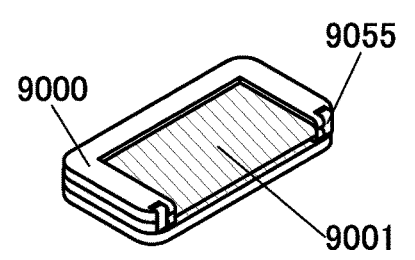

FIG. 33A1
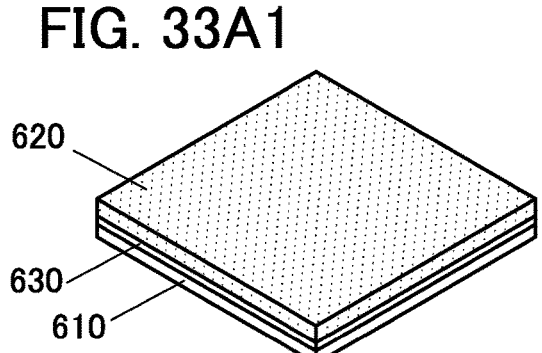
FIG. 33B1
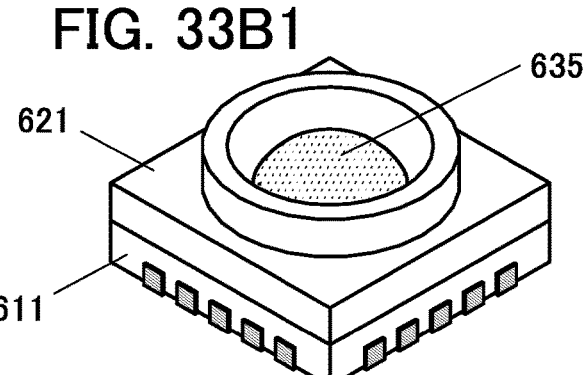
FIG. 33A2
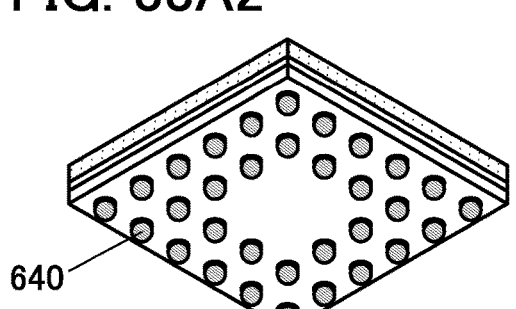
FIG. 33B2
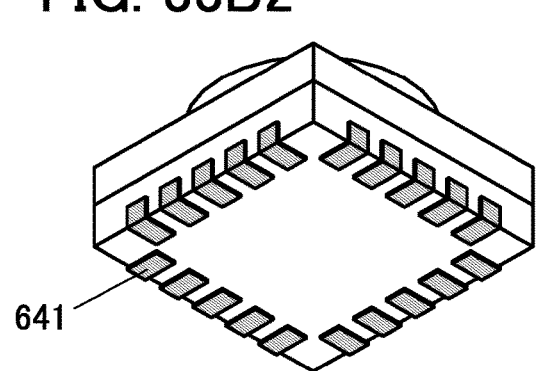
FIG. 33A3
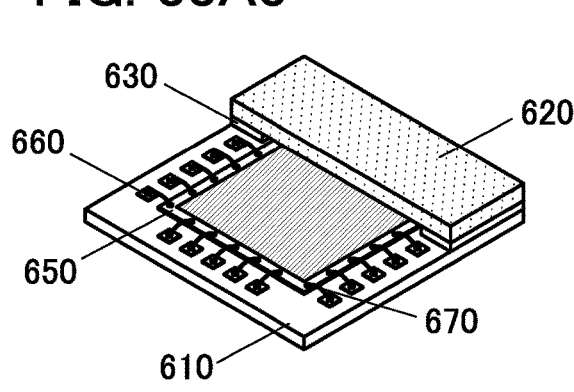
FIG. 33B3
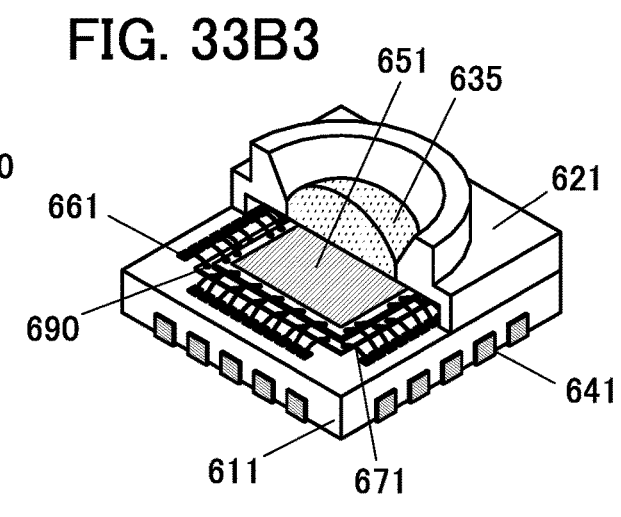

IMAGING DEVICE, DISPLAY APPARATUS, AND METHOD FOR MANUFACTURING DISPLAY APPARATUS

BACKGROUND OF THE INVENTION

1. Field of the Invention

One embodiment of the present invention relates to a display apparatus. One embodiment of the present invention relates to an electronic device.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

2. Description of the Related Art

In recent years, higher resolution has been required for display panels. Examples of devices that require high-resolution display panels include a smartphone, a tablet terminal, and a laptop computer. Furthermore, higher resolution has been required for a stationary display apparatus such as a television device or a monitor device along with a higher definition. A device absolutely required to have the highest resolution display panel is a device for virtual reality (VR) or augmented reality (AR).

Examples of the display apparatus that can be used for a display panel include, typically, a liquid crystal display apparatus, a light-emitting apparatus including a light-emitting device such as an organic electroluminescence (EL) device or a light-emitting diode (LED), and electronic paper performing display by an electrophoretic method or the like.

An organic EL device generally has a structure in which, for example, a layer containing a light-emitting organic compound is provided between a pair of electrodes. By voltage application to the light-emitting device, light emission from the light-emitting organic compound can be obtained. A display apparatus including such an organic EL device needs no backlight which is necessary for a liquid crystal display apparatus and the like and thus can have advantages such as thinness, lightweight, high contrast, and low power consumption. Patent Document 1, for example, discloses an example of a display apparatus using an organic EL device.

In addition, information terminals such as smartphones, tablet terminals, and notebook computers given above often contain personal information and thus various authentication techniques to prevent an abuse have been developed.

For example, Patent Document 2 discloses an electronic device including a fingerprint sensor in a push button switch portion.

REFERENCE

[Patent Document 1] Japanese Published Patent Application No. 2002-324673
[Patent Document 2] United States Patent Application Publication No. 2014/0056493

SUMMARY OF THE INVENTION

An object of one embodiment of the present invention is to provide a display apparatus with a high aperture ratio. An object of one embodiment of the present invention is to provide a display apparatus having a personal authentication function. Another of one embodiment of the present invention is to provide a display apparatus with high display quality. An object of one embodiment of the present invention is to provide a highly reliable display apparatus. An object of one embodiment of the present invention is to provide a display apparatus that can have higher resolution. An object of one embodiment of the present invention is to provide a display apparatus with low power consumption.

An object of one embodiment of the present invention is to reduce at least one of problems of the conventional technique.

Note that the description of these objects does not preclude the existence of other objects. In one embodiment of the present invention, there is no need to achieve all these objects. Objects other than these can be derived from the description of the specification, the drawings, the claims, and the like.

One embodiment of the present invention is an imaging device including a pixel electrode, a first layer over the pixel electrode, an insulating layer covering part of a top surface of the first layer, and a common electrode covering the first layer and the insulating layer, in which the first layer includes a photoelectric conversion layer.

Another embodiment of the present invention is an imaging device including a first pixel electrode, a second pixel electrode, a first layer over the first pixel electrode, a second layer over the second pixel electrode, an insulating layer covering part of a top surface of the first layer and part of a top surface of the second layer, and a common electrode covering the first layer, the second layer, and the insulating layer, in which each of the first layer and the second layer includes a photoelectric conversion layer.

In a preferred mode of the above structure, the insulating layer includes an inorganic material, and the inorganic material is an oxide, a nitride, an oxynitride, or a nitride oxide.

In another preferred mode of the above structure, the insulating layer includes at least one of hafnium oxide, aluminum oxide, silicon oxide, gallium oxide, germanium oxide, yttrium oxide, zirconium oxide, lanthanum oxide, neodymium oxide, tantalum oxide, silicon nitride, aluminum nitride, silicon oxynitride, aluminum oxynitride, silicon nitride oxide, and aluminum nitride oxide.

Another embodiment of the present invention is a display apparatus including a first pixel electrode, a second pixel electrode, a first layer over the first pixel electrode, a second layer over the second pixel electrode, an insulating layer covering part of a top surface of the first layer and part of a top surface of the second layer, and a common electrode covering the first layer, the second layer, and the insulating layer, in which the first layer includes a photoelectric conversion layer, and the second layer includes a light-emitting layer.

Another embodiment of the present invention is a display apparatus including a first pixel electrode, a second pixel electrode, a first layer over the first pixel electrode, a second layer over the second pixel electrode, an insulating layer over the first pixel electrode, the second pixel electrode, the first layer, and the second layer, and a common electrode covering the first layer, the second layer, and the insulating layer, in which the first layer includes a photoelectric conversion layer, the second layer includes a light-emitting layer, the insulating layer includes a first opening portion, and the first opening portion overlaps with the first pixel electrode, the first layer, and the common electrode.

In a preferred mode of the above structure, the insulating layer includes an inorganic material, and the inorganic material includes an oxide, a nitride, an oxynitride, or a nitride oxide.

In another preferred mode of the above structure, the insulating layer includes at least one of hafnium oxide, aluminum oxide, silicon oxide, gallium oxide, germanium oxide, yttrium oxide, zirconium oxide, lanthanum oxide, neodymium oxide, tantalum oxide, silicon nitride, aluminum nitride, silicon oxynitride, aluminum oxynitride, silicon nitride oxide, and aluminum nitride oxide.

Another embodiment of the present invention is a display apparatus including a first pixel electrode, a second pixel electrode, a first insulating layer covering part of a top surface of the first pixel electrode and part of a top surface of the second pixel electrode, a first layer over the first pixel electrode and the first insulating layer, a second layer over the second pixel electrode and the first insulating layer, a second insulating layer covering part of a top surface of the first layer and part of a top surface of the second layer and including a region overlapping with the first insulating layer, and a common electrode covering the first layer, the second layer, and the second insulating layer, in which the first layer includes a photoelectric conversion layer, and the second layer includes a light-emitting layer.

In a preferred mode of the above structure, the first layer overlaps with the first pixel electrode and the common electrode and includes a first region overlapping with neither the first insulating layer nor the second insulating layer, and the second layer overlaps with the second pixel electrode and the common electrode and includes a second region overlapping with neither the first insulating layer nor the second insulating layer.

In another preferred mode of the above structure, the first insulating layer includes an organic material, the second insulating layer includes an inorganic material, and the inorganic material is an oxide, a nitride, an oxynitride, or a nitride oxide.

In another preferred mode of the above structure, the first insulating layer includes at least one of an acrylic resin, an epoxy resin, a polyimide resin, a polyamide resin, a poly-imide-amide resin, a polysiloxane resin, a benzocy-clobutene-based resin, and a phenol resin, and the second insulating layer includes at least one of hafnium oxide, aluminum oxide, silicon oxide, gallium oxide, germanium oxide, yttrium oxide, zirconium oxide, lanthanum oxide, neodymium oxide, tantalum oxide, silicon nitride, aluminum nitride, silicon oxynitride, aluminum oxynitride, silicon nitride oxide, and aluminum nitride oxide.

Another embodiment of the present invention is a method for manufacturing a display apparatus, including the steps of forming a first conductive layer and a second conductive layer over a substrate; forming a first insulating layer to cover an end portion of the first conductive layer and an end portion of the second conductive layer; forming a first layer including a photoelectric conversion layer over the first conductive layer using a first metal mask; forming a second layer including a light-emitting layer over the second conductive layer using a second metal mask; forming a second insulating layer to cover part of a top surface of the first layer and part of a top surface of the second layer using a third metal mask; and forming a third conductive layer to cover the first layer, the second layer, and the second insulating layer.

In a preferred mode of the above structure, the first insulating layer includes an organic material, the second insulating layer includes an inorganic material, and the inorganic material is an oxide, a nitride, an oxynitride, or a nitride oxide.

In another preferred mode of the above structure, the first insulating layer comprise at least one of an acrylic resin, an epoxy resin, a polyimide resin, a polyamide resin, a poly-imide-amide resin, a polysiloxane resin, a benzocy-clobutene-based resin, and a phenol resin, and the second insulating layer includes at least one of hafnium oxide, aluminum oxide, silicon oxide, gallium oxide, germanium oxide, yttrium oxide, zirconium oxide, lanthanum oxide, neodymium oxide, tantalum oxide, silicon nitride, aluminum nitride, silicon oxynitride, aluminum oxynitride, silicon nitride oxide, and aluminum nitride oxide.

According to one embodiment of the present invention, a display apparatus with a high aperture ratio can be provided. A display apparatus with a personal authentication function can be provided. A display apparatus having high display quality can be provided. A highly reliable display apparatus can be provided. A display apparatus that can have higher resolution can be provided. A display apparatus with low power consumption can be provided. At least one of problems of the conventional technique can be reduced.

Note that the description of these effects does not preclude the existence of other effects. One embodiment of the present invention does not necessarily have all these effects. Effects other than these can be derived from the description of the specification, the drawings, the claims, and the like.

BRIEF DESCRIPTION OF THE DRAWINGS

In the accompanying drawings:

FIG. 24A illustrates an example of a pixel circuit and FIG. 24B illustrates an example of a driving method of the pixel circuit;

FIGS. 27A to 27F each illustrate a structure example of a light-emitting device;

FIGS. 29A to 29E each illustrate a structure example of a light-receiving device;

FIGS. 31A to 31D illustrate examples of electronic devices;

FIGS. 32A to 32G illustrate examples of electronic devices; and

FIGS. 33A1 to 33A3 and 33B1 to 33B3 are perspective views illustrating an example of a sensor module.

DETAILED DESCRIPTION OF THE INVENTION

Figure 1A:
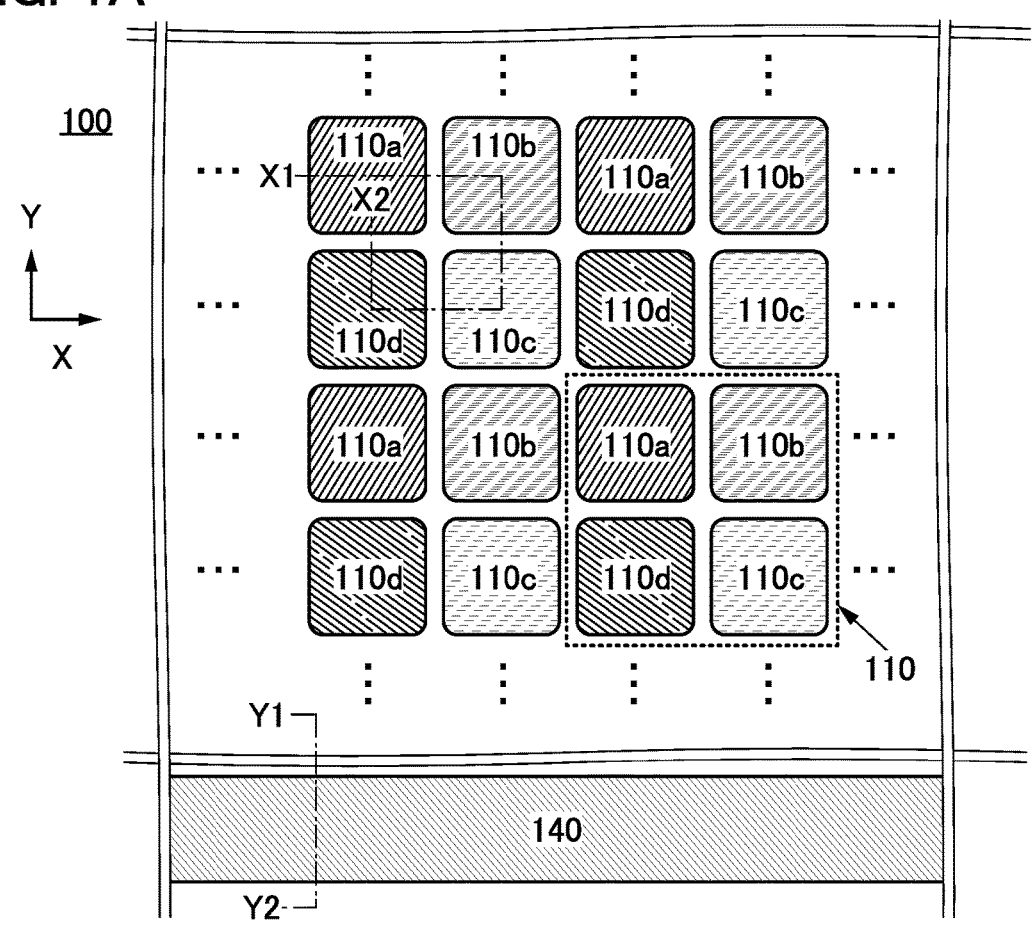
FIG. 1A is a top view illustrating an example of a display apparatus and FIG. 1B is a cross-sectional view illustrating an example of the display apparatus.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

In this specification and the like, a display apparatus may be rephrased as an electronic device.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a hole or an electron is sometimes referred to as a carrier. Specifically, a hole-injection layer or an electron-injection layer may be referred to as a carrier-injection layer, a hole-transport layer or an electron-transport layer may be referred to as a carrier-transport layer, and a hole-blocking layer or an electron-blocking layer may be referred to as a carrier-blocking layer. Note that the above-described carrier-injection layer, carrier-transport layer, and carrier-blocking layer cannot be distinguished from each other depending on the cross-sectional shape or properties in some cases. One layer may have two or three functions of the carrier-injection layer, the carrier-transport layer, and the carrier-blocking layer in some cases.

In this specification and the like, a light-emitting device (also referred to as a light-emitting element) includes an EL layer between a pair of electrodes. The EL layer includes at least a light-emitting layer. Examples of layers (also referred to as functional layers) in the EL layer include a light-emitting layer, a carrier-injection layer (a hole-injection layer and an electron-injection layer), a carrier-transport layer a (hole-transport layer and an electron-transport layer), and a carrier-blocking layer (a hole-blocking layer and an electron-blocking layer).

In this specification and the like, a light-receiving device (also referred to as a light-receiving element) includes a PS layer between a pair of electrodes. The PS layer includes at least a photoelectric conversion layer (also referred to as an active layer). Examples of layers (also referred to as functional layers) in the PS layer include a photoelectric conversion layer, a carrier-injection layer (a hole-injection layer and an electron-injection layer), a carrier-transport layer (a hole-transport layer and an electron-transport layer), and a carrier-blocking layer (a hole-blocking layer and an electron-blocking layer).

Embodiment 1

In this embodiment, a display apparatus of one embodiment of the present invention will be described.

One embodiment of the present invention is a display apparatus including a display portion capable of full-color display. The display portion includes a first subpixel and a second subpixel that emit light of different colors, and a third subpixel that senses light. The first subpixel includes a first light-emitting device that emits light of a first color and the second subpixel includes a second light-emitting device that emits light of a color different from the first color of light emitted from the first light-emitting device. For example, the first color is any of the following colors: blue, purple, bluish purple, green, yellowish green, yellow, orange, and red. The second color is any of the following colors: blue, purple, bluish purple, green, yellowish green, yellow, orange, and red, and is different from the first color. The third pixel includes a light-receiving device that senses light. At least one kind of material is different between the first light-emitting device and the second light-emitting device; for example, a light-emitting material in the first light-emitting device is different from a light-emitting material in the second light-emitting device. That is, light-emitting devices for different emission colors are separately formed in the display apparatus of one embodiment of the present invention. The light-receiving device includes a photoelectric conversion material. Moreover, a structure in which white light emission is transmitted through one or both of a color conversion layer and a coloring layer (also referred to as a color filter) so as to exhibit a desired color may be employed as the light-emitting devices included in the first and the second subpixels. In the case where white light-emitting devices are used for the first and second subpixels, one common island-shaped light-emitting layer may be shared by the first and second subpixels, without being formed separately for each subpixel.

One embodiment of the present invention is capable of capturing an image by a plurality of light-receiving devices and thus functions as an imaging device. In this case, light-emitting devices can be used as a light source for capturing an image. Moreover, one embodiment of the present invention is capable of displaying images by a plurality of light-emitting devices and thus functions as a display apparatus. Accordingly, one embodiment of the present invention can be regarded as a display apparatus having an image capturing function or an imaging device having a display function.

For example, in the display apparatus of one embodiment of the present invention, light-emitting devices are arranged in a matrix in a display portion, and light-receiving devices are also arranged in a matrix in the display portion. Hence, the display portion has a function of displaying images and a function of a light-receiving portion. An image can be captured by the plurality of light-receiving devices provided in the display portion, so that the display apparatus can function as an image sensor or the like. That is, the display portion can capture an image or sense an object approaching or touching, for example. Furthermore, since the light-emitting devices provided in the display portion can be used as a light source at the time of receiving light, a light source does not need to be provided separately from the display apparatus; thus, a highly functional display apparatus can be provided without increasing the number of electronic components.

In the display apparatus of one embodiment of the present invention, when an object reflects light emitted from the light-emitting device included in the display portion, the light-receiving device can sense the reflected light; thus, image capturing or touch (including non-contact touch) sensing or the like can be performed even in a dark environment. Note that in the display apparatus, a surface where the display portion is placed may be referred to as a display surface.

Furthermore, when a finger, a palm, or the like touches the display portion of the display apparatus of one embodiment of the present invention, an image of the fingerprint, the palm print, or the like can be captured. Thus, an electronic device including the display apparatus of one embodiment of the present invention can perform personal authentication by using the captured image of the fingerprint, the palm print, or the like. Accordingly, an imaging device for the fingerprint authentication, the palm-print authentication, or the like does not need to be additionally provided, and the number of components of the electronic device can be reduced. Furthermore, since the light-receiving devices are arranged in a matrix in the display portion, an image of a fingerprint, a palm print, or the like can be captured in any part in the display portion, which can provide a convenient electronic device.

The display apparatus of one embodiment of the present invention includes the touch sensor that acquires the positional data of an object that touches or approaches the display surface. A touch sensor of any of various types such as a resistive type, a capacitive type, an infrared ray type, an electromagnetic induction type, and a surface acoustic wave type can be used.

Examples of the capacitive touch sensing device include a surface capacitive touch sensing device and a projected capacitive touch sensing device. Examples of the projected capacitive touch sensing device include a self-capacitive touch sensing device and a mutual capacitive touch sensing device. The use of a mutual capacitive touch sensing device is preferred because multiple points can be sensed simultaneously.

A mutual capacitive touch sensor can include a plurality of electrodes to which pulse potentials are supplied and a plurality of electrodes to which a sensor circuit is connected. The touch sensor can sense the approach of a finger or the like using a change in capacitance between the electrodes. The electrodes included in the touch sensor are preferably positioned closer to the display surface side than the light-emitting device (or the light-receiving device).

The light-emitting devices and the light-receiving devices can be provided between a pair of substrates. As the substrate, a rigid substrate such as a glass substrate or a flexible film may be used. In this case, an electrode of the touch sensor can be provided between the light-emitting and light-receiving devices and the substrate positioned on the display surface side of the pair of substrates. For example, after an electrode of a touch sensor is provided over the light-emitting and light-receiving devices, the substrate may be attached onto the electrode of the touch sensor with an adhesive layer provided therebetween. Alternatively, the electrode of the touch sensor can be formed over the substrate on the display surface side. Alternatively, the electrode of the touch sensor may be formed over another substrate and attached to the display surface side.

For example, the light-receiving device has a structure in which a photoelectric conversion layer is interposed between a lower electrode and an upper electrode. Specifically, the light-receiving device includes the lower electrode, the upper electrode, a PS layer interposed between the upper electrode and the lower electrode, the PS layer includes the photoelectric conversion layer, an island-shaped pixel electrode provided for each light-receiving device is used as the lower electrode, a common electrode that is provided to cover a plurality of light-receiving devices is used as the upper electrode, and the bottom surface of the PS layer has a region that is in contact with the pixel electrode. Furthermore, the top surface of the PS layer is preferably in contact with the common electrode.

Note that the PS layer is partly formed to have an island shape in each light-receiving device in some cases. In such a case, for example, the common layer is provided to cover the plurality of light-receiving devices over part of the PS layer having an island shape included in each light-receiving device, and the PS layer includes part of the island-shaped PS layer and the common layer.

Here, for example, a region of the light-receiving device in which the PS layer is interposed between the pixel electrode and the common electrode and the bottom surface of the PS layer is in contact with the pixel electrode is regarded as a light-receiving region of the light-receiving device.

Alternatively, part of the region in which the PS layer is interposed between the pixel electrode and the common electrode and the bottom surface of the PS layer is in contact with the pixel electrode is referred to as a light-receiving region in some cases. For example, in the structure of one embodiment of the present invention as described later, an insulating layer is provided between the PS layer and the common electrode. In such a case, a region in which the bottom surface of the PS layer is in contact with the pixel electrode and the top surface thereof not overlapping with the insulating layer is referred to as the light-receiving region in some cases.

As described below, photoelectric conversion may occur also in a region other than the light-receiving region when carriers are induced by light reception.

When light enters the light-receiving device, carriers are induced in the PS layer in the light-receiving region. However, as well as in the light-receiving region, carriers are sometimes induced in the PS layer by incident light also in a peripheral region of the light-receiving region, for example, a region in which the bottom surface of the PS layer is not in contact with the pixel electrode and the top surface thereof is in contact with the common electrode. When carriers are induced also in the peripheral region in addition to the light-receiving region, the light-receiving area of the light-receiving device becomes large; however, the amount of incident light with a large incident angle might be increased undesirably. A current due to light with a large incident angle is a noise, and the noise could unfavorably reduce the sensitivity (signal-noise ratio (S/N ratio)) of the light-receiving device and degrade the resolution of imaging. In particular, as the distance between an object and the light-receiving device is increased, the amount of incident light with a large incident angle is increased, which makes it difficult to increase the thickness of a counter substrate or the like.

In the display apparatus of one embodiment of the present invention, an insulating layer is provided between the photoelectric conversion layer included in the PS layer and the common electrode in a peripheral region of the light-receiving region, whereby the common electrode is insulated from the photoelectric conversion layer in the peripheral region and thus current due to carriers induced by light with a large incident angle is reduced, resulting in increases of the resolution of the light-receiving device and the S/N ratio.

Furthermore, a light-blocking layer (also referred to as black matrix) is provided to overlap with the peripheral region of the light-receiving region above the light-receiving device, so that light with a large incident angle can be blocked. However, light with an extremely large incident angle might be difficult to block even when the light-blocking layer is provided. Even when the light-blocking layer is provided, light with an extremely large incident angle easily enters the peripheral region of the light-receiving region and causes a noise. Thus, there is a concern that the S/N ratio of the light-receiving device may be decreased.

Furthermore, an interface with a refractive difference is present in the optical path from the light-emitting device to an object, e.g., a fingerprint, which is to be photographed. For example, an interface between a sealing resin and a counter substrate is given. Light is reflected by such an interface and part of the reflected light enters the peripheral region of the light-receiving region to cause a noise. That is, there is a concern that the S/N ratio of the light-receiving device may be decreased.

In the display apparatus of one embodiment of the present invention, as described above, an insulating layer is provided between the photoelectric conversion layer and the common electrode in the peripheral region of the light-receiving region, so that current due to carriers induced by light that has entered the peripheral region of the light-receiving region can be reduced. Thus, adverse effect of light with an extremely large incident angle, which is still difficult to block by providing the light-blocking layer, can be reduced to increase the resolution of the light-receiving device and the S/N ratio.

In other words, in the display apparatus of one embodiment of the present invention, current due to induced carriers in the peripheral region of the light-receiving region is reduced, whereby the resolution of the light-receiving device and the S/N ratio can be increased. Moreover, in the structure of the display apparatus of one embodiment of the present invention, the light-blocking layer can also be provided, whereby the resolution and the ratio of S/N ratio can be further increased and thus a light-receiving device with high accuracy can be provided.

Note that in the light-receiving device, the insulating layer provided between the photoelectric conversion layer included in the PS layer and the common electrode may be shared by the light-receiving device and a light-emitting device adjacent to the light-receiving device. For example, the insulating layer may be provided in the region between the photoelectric conversion layer included in the light-receiving device and the common electrode and in a region between the light-emitting layer included in the light-emitting device and the common electrode. Such a structure can weaken an electric field between the pixel electrode and the region (peripheral region) other than the region overlapping with the pixel electrode in the common electrode, which can reduce a leakage current that might be generated between the photoelectric conversion layer in the light-receiving device and the light-emitting layer in the light-emitting device (the leakage current is sometimes referred to as a lateral direction leakage current, a lateral leakage current, a lateral leak current) in some cases.

Furthermore, the insulating layer may be shared by adjacent light-receiving devices. For example, in two adjacent light-receiving devices (here, first and second light-receiving devices), the insulating layer may include a region between the photoelectric conversion layer included in the first light-receiving device and the common electrode and a region between the photoelectric conversion layer included in the second light-receiving device and the common electrode. This structure can reduce a leakage current that might be generated between adjacent light-receiving devices in some cases.

Similarly, the insulating layer may be shared by adjacent light-emitting devices. For example, in two adjacent light-emitting devices (here, first and second light-emitting devices), the insulating layer may include a region positioned between the light-emitting layer included in the first light-emitting device and the common electrode and a region positioned between the light-emitting layer included in the second light-emitting device and the common electrode. This structure can reduce a leakage current that might be generated between adjacent light-emitting devices in some cases.

The display apparatus of one embodiment of the present invention can improve the resolution and sensitivity of the light-receiving device as described above. Thus, the area of the light-receiving device can be reduced and the area of a pixel can be reduced in some cases. For example, in even a high-resolution display apparatus having a resolution of 400 ppi or higher, a light-receiving device can be provided in each pixel.

In the light-receiving device, the insulating layer provided between the photoelectric conversion layer and the common electrode is preferably formed over a functional layer (for example, a carrier-blocking layer, a carrier-transport layer, or a carrier-injection layer, more specifically, a hole-blocking layer, an electron-transport layer, or an electron-injection layer) placed above the photoelectric conversion layer. The functional layer placed above the photoelectric conversion layer is positioned between the photoelectric conversion layer and the insulating layer, whereby damages to the photoelectric conversion layer in processing the insulating layer can be reduced, and thus a light-receiving device with high reliability can be provided. Specifically, after an island-shaped layer including the functional layer is formed as part of the PS layer over the photoelectric conversion layer, the insulating layer may be formed over the island-shaped layer.

In the case where a common layer is provided between part of the island-shaped PS layer and the common electrode, the insulating layer may be provided over the part of the island-shaped PS layer, the common layer may be provided over part of the PS layer and the insulating layer, and the common electrode may be provided over the common layer.

Preferably, the light-emitting layer included in the light-emitting device and the photoelectric conversion layer included in the light-receiving device are separately formed in a side-by-side manner. Therefore, the light-emitting layer included in the light-emitting device and the photoelectric conversion layer included in the light-receiving device are each preferably formed to have an island shape.

A structure in which light-emitting layers in light-emitting devices with different emission wavelengths (e.g., blue (B), green (G), and red (R)) are separately formed or separately patterned may be referred to as a side-by-side (SBS) structure. The SBS structure can optimize materials and structures of light-emitting devices and thus can extend freedom of choice of materials and structures, whereby the luminance and the reliability can be easily improved.

In the case of manufacturing a display apparatus including a plurality of light-emitting devices emitting light of different colors, light-emitting layers different in emission color are formed to have island shapes.

The light-emitting devices exhibiting the same color can be provided without separately forming the light-emitting layers. Thus, the light-emitting layers of the light-emitting devices exhibiting the same emission wavelength need not be separately formed to have island-shapes, and an island-shaped light-emitting layer may be shared by a plurality of light-emitting devices. Alternatively, an island-shaped light-emitting layer may be formed in each light-emitting device.

Alternatively, the light-emitting device may have a structure in which white light is transmitted through one or both of a color conversion layer and a coloring layer (also referred to as a color filter) to exhibit a desired color. When light-emitting devices emitting white light are used, a common light-emitting layer can be provided for light-emitting devices of different colors. Thus, one island-shaped light-emitting layer may be provided for a plurality of light-emitting devices, without being separated for each light-emitting device.

Note that in this specification and the like, the term "island shape" refers to a state where two or more layers formed using the same material in the same step are physically separated from each other. For example, "island-shaped light-emitting layer" means a state where the light-emitting layer and its adjacent light-emitting layer are physically separated from each other.

An island-shaped light-emitting layer and an island-shaped photoelectric conversion layer can be formed, for example, by a vacuum evaporation method using a metal mask (also referred to as a shadow mask).

Alternatively, the island-shaped light-emitting layer and the island-shaped photoelectric conversion layer can be formed, for example, by processing the light-emitting layer (the photoelectric conversion layer) by a photolithography process. In the case of the structure, when processing is performed directly over the light-emitting layer (the photoelectric conversion layer), the light-emitting layer (the photoelectric conversion layer) is damaged, so that the reliability of the display apparatus is significantly reduced in some cases. Therefore, a mask layer or the like is formed over the functional layer (for example, a carrier-blocking layer, a carrier-transport layer, or a carrier-injection layer, more specifically, a hole-blocking layer, an electron-transport layer, or an electron-injection layer) placed above the light-emitting layer (the photoelectric conversion layer), and the light-emitting layer (the photoelectric conversion layer) is processed to have an island shape, in which case damages to the light-emitting layer (the photoelectric conversion layer) can be reduced and the reliability of the display apparatus can be improved. The mask layer used here may be partly left and used as an insulating layer to insulate the photoelectric conversion layer from the common electrode.

In the description below of matters in common between the light-emitting device and the light-receiving device, the light-emitting device (or the light-receiving device) is merely stated in some cases. Similarly, in the description below of matters in common between the EL layer and the PS layer, the EL layer (or the PS layer) is merely stated in some cases. Similarly, in the description below of matters in common between the light-emitting layer and the photoelectric conversion layer, the light-emitting layer (or the photoelectric conversion conversion) is merely stated in some cases.

In the method for manufacturing a display apparatus of one embodiment of the present invention, an insulating film is preferably formed after a layer containing the photoelectric conversion layer (the PS layer or part of the PS layer) is formed to have an island shape. Furthermore, a resist mask is formed over the insulating film by a photolithography process, and the insulating film is processed with use of the resist mask, whereby an island-shaped insulating layer or a grid-like insulating layer is preferably formed over the PS layer or part of the PS layer. Since the photolithography process has very high accuracy in position alignment with a pattern formed over a formation surface, the photolithography process can be favorably employed for manufacturing a high-resolution display apparatus.

Alternatively, a preferred mode in the method for manufacturing the display apparatus of one embodiment of the present invention is that the layer including the photoelectric conversion layer (the PS layer or part of the PS layer) is formed to have an island shape, and then an island-shaped insulating layer is formed over the PS layer or the part of the PS layer with an FMM. With use of an FMM, the island-shaped insulating layer can be easily formed without an etching step; thus, the photoelectric conversion layer is not damaged by the etching step and the reliability of the display apparatus can be improved.

When the PS layer or part of the PS layer is formed to have an island shape, a photolithography process or an FMM may be employed.

In the method for manufacturing a display apparatus of one embodiment of the present invention, the EL layer or part of the EL layer is preferably formed to have an island shape; when the EL layer or part of the EL layer is formed to have an island shape, a photolithography process or an FMM may be employed.

The EL layer (or the PS layer) includes at least the light-emitting layer (or the photoelectric conversion layer), preferably a plurality of layers. Specifically, one or more layers are preferably formed over the light-emitting layer (or the photoelectric conversion layer). For example, the EL layer (or the PS layer) preferably includes the light-emitting layer (or the photoelectric conversion layer) and a carrier-blocking layer (a hole-blocking layer and an electron-blocking layer) or a carrier-transport layer (an electron-transport layer and a hole-transport layer) over the light-emitting layer (or the photoelectric conversion layer).

Note that it is not necessary to separately form all layers included in the EL layers and the PS layer separately between the light-emitting devices emitting light of different colors and the light-receiving device, and some layers of the EL layers and the PS layer can be formed in the same step. Examples of layers in the EL layer (or the PS layer) include the light-emitting layer (or the photoelectric conversion layer), a carrier-injection layer (a hole-injection layer and an electron-injection layer), a carrier-transport layer (a hole-transport layer and an electron-transport layer), a carrier-blocking layer (a hole-blocking layer and an electron-blocking layer), and the like. For example, one or some of the layers included in the EL layer (or the PS layer) are formed to have an island shape for each color, and then each of the other layer(s) included in the EL layer (or the PS layer) and the common electrode (also referred to as the upper electrode) are formed so as to be shared by the light-emitting devices of different colors (to be one layer). For example, the carrier-injection layer and the common electrode can be formed so as to be shared by the light-emitting devices of different colors.

[Structure Example 1 of Display Apparatus]

FIG. 1A to FIG. 11E illustrate a display apparatus of one embodiment of the present invention. The structure illustrated in FIG. 1A to FIG. 11E has an imaging function. Therefore, the structure illustrated in FIG. 1A to FIG. 11E is referred to as an imaging device in some cases. The structure illustrated in FIG. 1A to FIG. 11E include a circuit such as a pixel circuit, and such a circuit includes a semiconductor device such as a transistor, for example. The structure illustrated in FIG. 1A to FIG. 11E is, for example, at least one of a circuit configured to drive a display device included in a display portion, and a circuit configured to drive a light-receiving device included in the display portion, and these circuits include semiconductor devices such as transistors, for example. Thus, the structure illustrated in FIG. 1A to FIG. 11E is referred to as a semiconductor device in some cases.

FIG. 1A is a top view of a display apparatus 100. The display apparatus 100 includes a display portion in which a plurality of pixels 110 are arranged, and a connection portion 140 outside the display portion. A plurality of subpixels are arranged in a matrix in the display portion. FIG. 1A illustrates subpixels arranged in four rows and four columns, which form pixels in two rows and two columns. The connection portion 140 can also be referred to as a cathode contact portion. The display portion is composed of a plurality of pixels. Thus, the display portion is referred to as a pixel portion in some cases.

The pixel 110 illustrated in FIG. 1A employs matrix arrangement. The pixel 110 illustrated in FIG. 1A is composed of four subpixels 110a, 110b, 110c, and 110d. The subpixels 110a, 110b, and 110c include light-emitting devices that emit light of different colors (light Lem_a, light Lem_b, and light Lem_c), and the subpixel 110d includes a light-receiving device that senses light Lin. The subpixels 110a, 110b, and 110c can be of three colors of red (R), green (G), and blue (B) or of three colors of yellow (Y), cyan (C), and magenta (M), for example. The number of types of subpixels is not limited to four, and five or more subpixels may be used. Examples of the five subpixels include five types of R, G, B, white (W) and a photosensor (PS); five types of R, G, B, Y, and PS; or five types of R, G, B, infrared (IR), and PS.

In this specification and the like, the row direction and the column direction are sometimes referred to as the X direction and the Y direction, respectively. The X direction and the Y direction intersect with each other and are, for example, orthogonal to each other (see FIG. 1A).

In the example illustrated in FIG. 1A, the subpixels 110a and 110b are alternately arranged in the same rows, and the subpixels 110c and 110d are alternately arranged in rows which are different from the rows in which the subpixels 110a and 110b are arranged. Although the subpixel 110d including the light-receiving device is provided in each pixel in the example in FIG. 1A, one embodiment of the present invention is not limited to the example and the subpixels 110d may be provided in some of the pixels.

Although the top view of FIG. 1A illustrates an example in which the connection portion 140 is positioned in the lower side of the display portion, one embodiment of the present invention is not limited thereto. The connection portion 140 is provided in at least one of the upper side, the right side, the left side, and the lower side of the display portion in the top view, or may be provided so as to surround the four sides of the display portion. The top surface shape of the connection portion 140 can be a belt-like shape, an L shape, a U shape, a frame-like shape, or the like. The number of the connection portions 140 can be one or more.

Figure 1B:
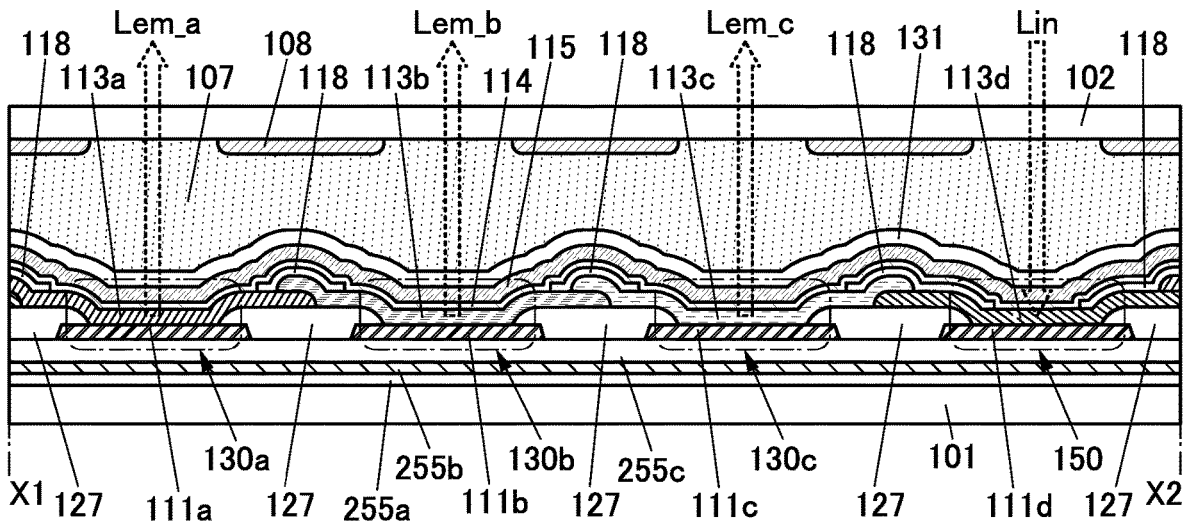

FIG. 1B is a cross-sectional view along the dashed-dotted line X1-X2 in FIG. 1A.

Figure 2A:
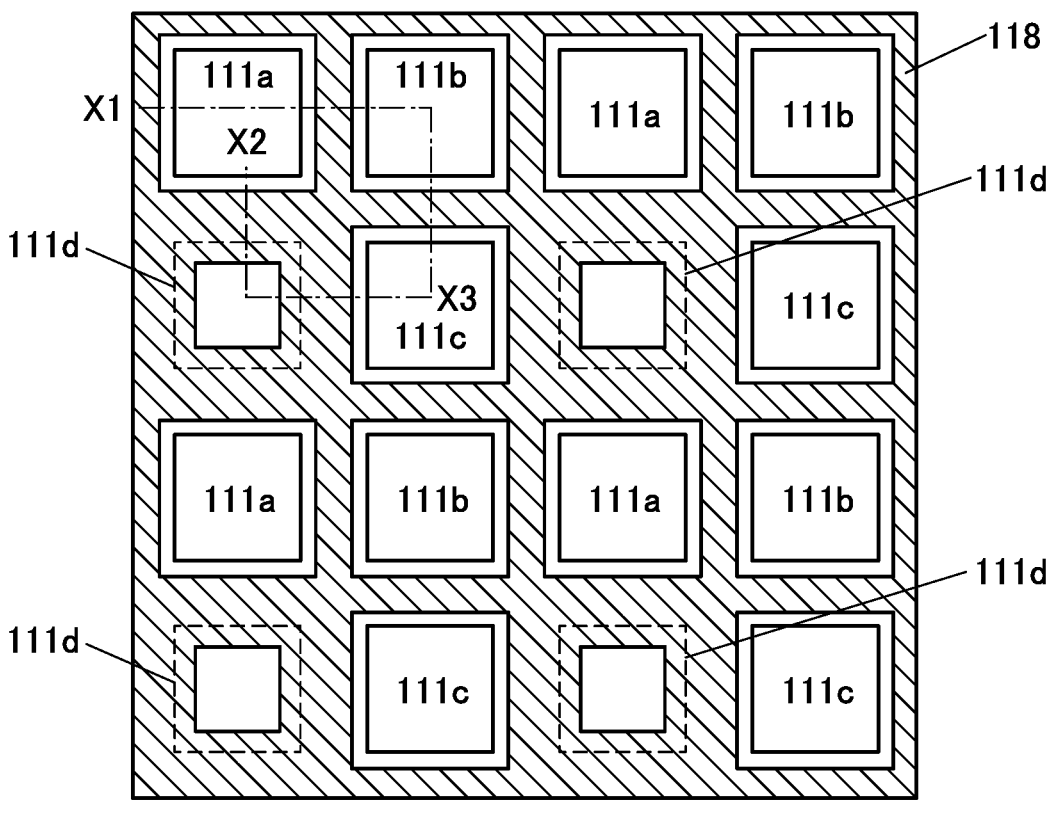
FIG. 2A is a top view illustrating an example of a display apparatus and FIG. 2B is a cross-sectional view illustrating an example of the display apparatus.
Figure 2B:
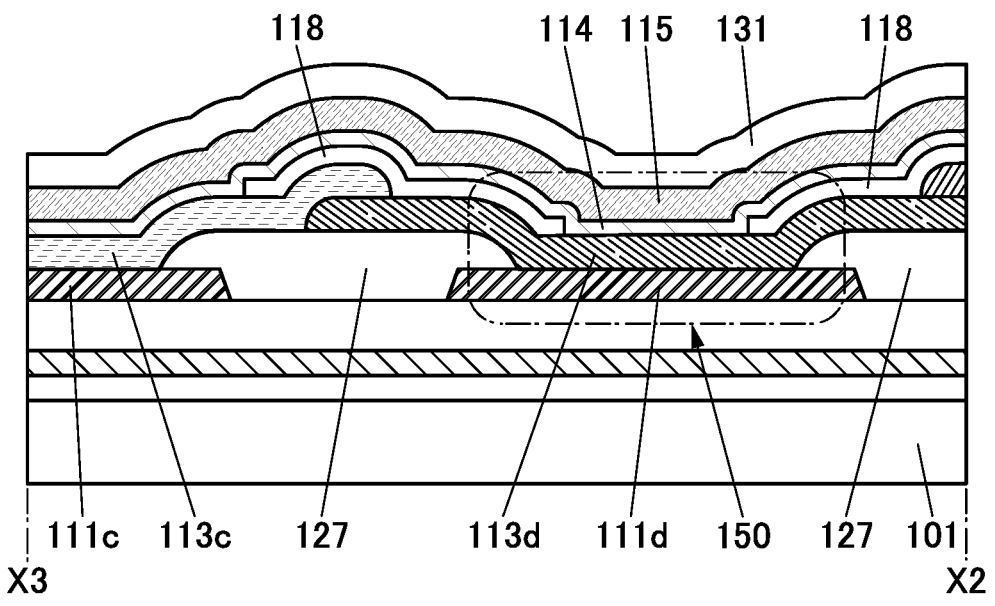

FIG. 2A is a top view illustrating part of components of the display apparatus 100 and will be described in detail later. FIG. 2B is an enlarged view of a light-receiving device 150 and its periphery in FIG. 1B.

In the display apparatus 100, a layer including a transistor is provided over a substrate 101, insulating layers 255a, 255b, and 255c are provided over the layer including the transistor, light-emitting devices 130a, 130b, and 130c and the light-receiving device 150 are provided over the insulating layers 255a, 255b, and 255c, and a protective layer 131 is provided to cover these light-emitting devices and light-receiving device. For example, the subpixel 110a is provided with the light-emitting device 130a, the subpixel 110b is provided with the light-emitting device 130b, the subpixel 110c is provided with the light-emitting device 130c, and the subpixel 110d is provided with the light-receiving device 150.

The top end portions of pixel electrodes (pixel electrodes 111*a*, 111*b*, 111*c*, and 111*d* described later) of the light-emitting devices 130*a*, 130*b*, and 130*c* and the light-receiving device 150 are each covered with an insulating layer 127. The insulating layer 127 functions as a partition (also referred to as a bank or a spacer). The display apparatus 100 includes an insulating layer 118, and the insulating layer 118 is provided between an island-shaped layer (layer 113*d* described later) included in the light-receiving device 150 and the common electrode (common electrode 115 described later), for example. Note that in the description below, the light-emitting devices 130*a*, 130*b*, and 130*c* are collectively referred to as a light-emitting device 130 in some cases.

As illustrated in FIG. 1B, in the display apparatus 100, an adhesive layer 107 and a substrate 102 are provided over the protective layer 131.

The display apparatus of one embodiment of the present invention can have any of the following structures: a top-emission structure in which light is emitted in a direction opposite to the substrate where the light-emitting devices are formed, a bottom-emission structure in which light is emitted toward the substrate where the light-emitting devices are formed, and a dual-emission structure in which light is emitted toward both surfaces.

The layer including transistors over the substrate 101 can employ a stacked-layer structure in which a plurality of transistors are provided over a substrate and an insulating layer is provided to cover the transistors, for example. The insulating layer over the transistors may have a single-layer structure or a stacked-layer structure. In FIG. 1B and other drawings, an insulating layer 255*a*, an insulating layer 255*b* over the insulating layer 255*a*, and an insulating layer 255*c* over the insulating layer 255*b* are illustrated as the insulating layer over the transistors. The insulating layers may have a depressed portion between adjacent light-emitting devices.

As each of the insulating layers 255*a*, 255*b*, and 255*c*, any of a variety of inorganic insulating films such as an oxide insulating film, a nitride insulating film, an oxynitride insulating film, and a nitride oxide insulating film can be suitably used. As the insulating layers 255*a* and 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as the insulating layers 255*a* and 255*c* and a silicon nitride film be used as the insulating layer 255*b*. The insulating layer 255*b* preferably has a function of an etching protective film.

Note that in this specification and the like, oxynitride refers to a material that contains more oxygen than nitrogen, and nitride oxide refers to a material that contains more nitrogen than oxygen. For example, silicon oxynitride refers to a material in which an oxygen content is higher than a nitrogen content, and silicon nitride oxide refers to a material in which a nitrogen content is higher than an oxygen content.

Structure examples of the layer including transistors over the substrate 101 will be described in Embodiment 4 and Embodiment 5.

The light-emitting devices 130*a*, 130*b*, and 130*c* emit light of different colors. Preferably, the light-emitting devices 130*a*, 130*b*, and 130*c* emit light of three colors, red (R), green (G), and blue (B), for example.

As the light-emitting devices 130*a*, 130*b*, and 130*c*, light-emitting devices such as organic light-emitting diodes (OLEDs) or quantum-dot light-emitting diodes (QLEDs) are preferably used. Examples of a light-emitting substance contained in the light-emitting device include a substance exhibiting fluorescence (fluorescent material), a substance exhibiting phosphorescence (phosphorescent material), a substance exhibiting thermally activated delayed fluorescence (thermally activated delayed fluorescent (TADF) material), and an inorganic compound (e.g., a quantum dot material). As a TADF material, a material that is in thermal equilibrium between a singlet excited state and a triplet excited state may be used. Since such a TADF material enables a short emission lifetime (excitation lifetime), the efficiency of a light-emitting device in a high-luminance region can be less likely to decrease. A light-emitting diode (LED) such as a micro-LED can also be used as the light-emitting device.

Embodiment 6 can be referred to for the structure and the materials of the light-emitting device.

As the light-receiving device 150, a PN photodiode or a PIN photodiode can be used, for example. The light-receiving device 150 functions as a photoelectric conversion device (also referred to as a photoelectric conversion element) that senses light entering the light-receiving device 150 and generate electric charge. The amount of generated charge in the photoelectric conversion device is determined depending on the amount of incident light.

The light-receiving device can sense one or both of visible light and infrared light. In the case of sensing visible light, for example, one or more of blue light, violet light, bluish violet light, green light, yellowish green light, yellow light, orange light, red light, and the like can be sensed. Infrared light is preferably sensed because an object can be sensed even in a dark environment.

It is particularly preferable to use an organic photodiode including a layer containing an organic compound as the light-receiving devices 150. An organic photodiode, which is easily made thin, lightweight, and large in area and has a high degree of freedom for shape and design, can be used in a variety of devices.

Here, the display apparatus of one embodiment of the present invention includes a layer common to the light-emitting devices and the light-receiving device (the layer can be regarded as a continuous layer shared by the light-emitting devices and the light-receiving device) in some cases. The function of such a layer may be different between the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer common to the light-receiving device and the light-emitting device may have the same function in both the light-receiving device and the light-emitting device. For example, the hole-transport layer functions as a hole-transport layer in both the light-emitting device and the light-receiving device, and the electron-transport layer functions as an electron-transport layer in both the light-emitting device and the light-receiving device.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in a display apparatus including the organic EL device.

The light-receiving device is driven by application of reverse bias between the pixel electrode and the common electrode, whereby light entering the light-receiving device can be sensed and electric charge can be generated and extracted as a current.

Embodiment 6 can be referred to for the structure and the materials of the light-receiving device.

Here, a function of the display apparatus 100 including light-emitting devices 130R, 130G, and 130B, and the light-receiving device 150 is described with reference to the schematic view of FIG. 4A. Here, light emission from the light-emitting device 130R is red (R), light emission from the light emitting device 130G is green (G), and light emission from the light-emitting device 130B is blue (B). The light-emitting device 130R, the light-emitting device 130G, and the light-emitting device 130B each correspond to any of the light-emitting devices 130a, 130b, and 130c, illustrated in FIG. 1B and the like.

Figure 4A:
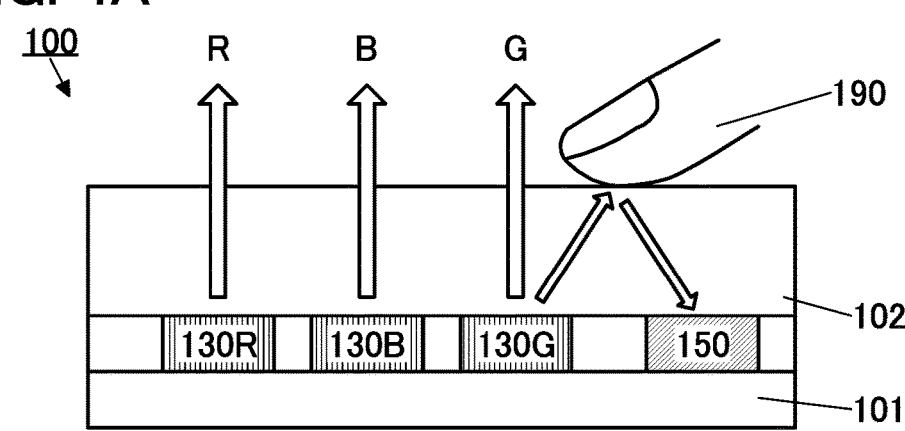
FIGS. 4A to 4C are cross-sectional views each illustrating an example of a display apparatus and FIG. 4D illustrates an example of an image.

FIG. 4A illustrates a state where a finger 190 touches a surface of the substrate 102. Part of light emitted from the light-emitting device 130 (e.g., light emitted from the light-emitting device 130G) is reflected by the contact portion between the substrate 102 and the finger 190. In the case where part of reflected light enters the light-receiving device 150, the contact of the finger 190 with the substrate 102 can be sensed. In this manner, the display apparatus 100 can sense a fingerprint of the finger 190 and perform personal authentication.

Figure 4B:
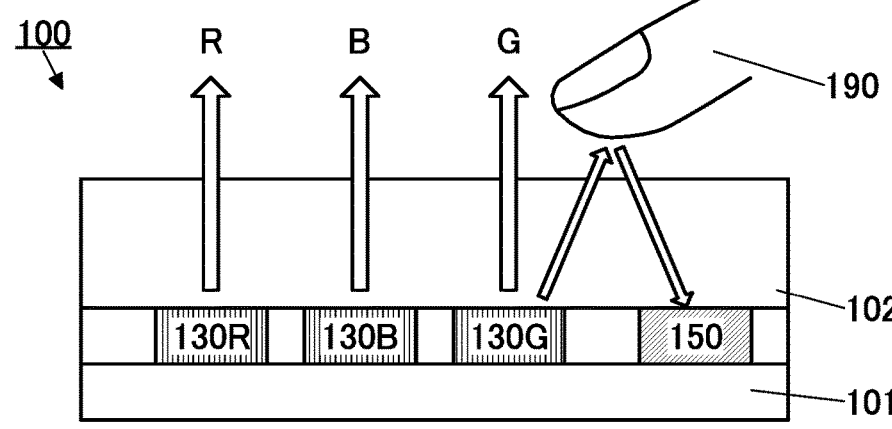
Figure 4C:
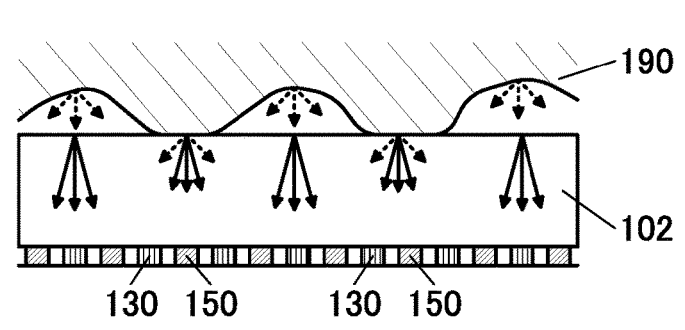

FIG. 4C schematically illustrates an enlarged view of the contact portion in a state where the finger 190 touches the substrate 102. FIG. 4C illustrates the light-emitting devices 130 and the light-receiving devices 150 which are arranged alternately.

The finger 190 has a fingerprint with valleys and ridges. Accordingly, as illustrated in FIG. 4C, the ridges of the fingerprint touch the substrate 102.

Light reflection by a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected by the surface of the finger 190. On the other hand, regular reflection components are dominant in the light reflected by the interface between the substrate 102 and the air.

The intensity of light that is reflected by contact surfaces or non-contact surfaces between the finger 190 and the substrate 102 and enters the light-receiving device 150 which are positioned directly below the contact surfaces or the non-contact surfaces is the sum of intensities of regularly reflected light and diffusely reflected light. As described above, regularly reflected light (indicated by solid arrows) is dominant in the valleys of the finger 190, where the finger 190 is not in contact with the substrate 102; whereas diffusely reflected light (indicated by dashed arrows) by the finger 190 is dominant in the ridges of the finger 190, where the finger 190 is in contact with the substrate 102. Thus, the intensity of light received by the light-receiving devices 150 positioned directly below the valleys is higher than the intensity of light received by the light-receiving devices 150 positioned directly below the ridges. Accordingly, an image of the fingerprint of the finger 190 can be captured.

In the case where the interval between the light-receiving devices 150 is smaller than a distance between two ridges of the fingerprint, preferably a distance between a valley and a ridge adjacent to each other, a clear fingerprint image can be captured. A distance between a valley and a ridge of a human's fingerprint is approximately 200 μm; thus, the interval between the light-receiving devices 150 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 4D:
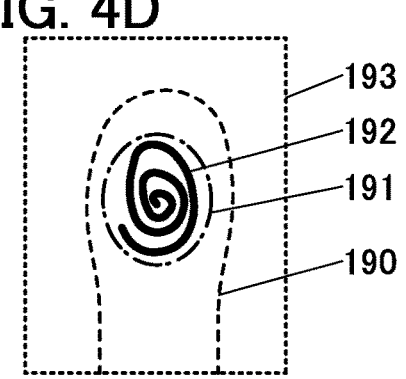

FIG. 4D illustrates an example of a fingerprint image captured with the display apparatus 100. In FIG. 4D, in an imaging area 193, the outline of the finger 190 is indicated by a dashed line and the outline of a contact portion 191 is indicated by a dashed-dotted line. In the contact portion 191, a high-contrast image of a fingerprint 192 can be captured by a difference in light incident on the light-receiving device 150.

Although FIG. 4A illustrates the example in which the finger 190 is in contact with the substrate 102, the finger 190 is not necessarily in contact with the substrate 102. For example, as illustrated in FIG. 4B, sensing can be performed while the finger 190 is at a distance from the substrate 102, in some cases. In a preferred mode, the distance between the finger 190 and the substrate 102 is relatively short, and the mode is referred to as hover touch in some cases.

In this specification and the like, "hover touch" means that an object (finger 190) can be sensed in the state where the object (finger 190) is not in contact with the display apparatus, for example. For example, the display apparatus is preferably capable of sensing the object (finger 190) positioned in the range of 0.1 mm to 300 mm inclusive, more preferably 3 mm to 50 mm inclusive from the display apparatus. This structure enables the display apparatus to be operated without direct contact of the object (finger 190). In other words, the display apparatus can be operated in a contactless (touchless) manner. This structure can reduce the risk of the display apparatus being dirty or damaged or enables the object (finger 190) to operate the display apparatus without directly touching a dirt (e.g., dust, bacteria, or a virus) attached to the display apparatus.

The light-emitting device includes an EL layer between a pair of electrodes. The EL layer includes at least a light-emitting layer. In this specification and the like, one of the pair of electrodes may be referred to as a pixel electrode and the other may be referred to as a common electrode. Similarly, the light-receiving device includes a PS layer between a pair of electrodes. The PS layer includes at least a photoelectric conversion layer.

One of the pair of electrodes of each of the light-emitting device and the light-receiving device functions as an anode, and the other electrode functions as a cathode. The case where the pixel electrode functions as an anode and the common electrode functions as a cathode is described below as an example in some cases. Embodiment 6 can be referred to for the details of structures and materials of the pixel electrode and the common electrode.

The light-emitting device 130a includes the pixel electrode 111a over the insulating layer 255c, an island-shaped layer 113a over the pixel electrode 111a, the common layer 114 over the island-shaped layer 113a, and the common electrode 115 over the common layer 114. In the light-emitting device 130*a*, the layer 113*a* and the common layer 114 can be collectively referred to as an EL layer.

The light-emitting device 130*b* includes the pixel electrode 111*b* over the insulating layer 255*c*, the island-shaped layer 113*b* over the pixel electrode 111*b*, the common layer 114 over the island-shaped layer 113*b*, and the common electrode 115 over the common layer 114. In the light-emitting device 130*b*, the layer 113*b* and the common layer 114 can be collectively referred to as an EL layer.

The light-emitting device 130*c* includes the pixel electrode 111*c* over the insulating layer 255*c*, the island-shaped layer 113*c* over the pixel electrode 111*c*, the common layer 114 over the island-shaped layer 113*c*, and the common electrode 115 over the common layer 114. In the light-emitting device 130*c*, the layer 113*c* and the common layer 114 can be collectively referred to as an EL layer.

There is no particular limitation on the structure of the light-emitting device in this embodiment, and the light-emitting device can have a single structure or a tandem structure.

The light-receiving device 150 includes the pixel electrode 111*d* over the insulating layer 255*c*, the island-shaped layer 113*d* over the pixel electrode 111*d*, the common layer 114 over the island-shaped layer 113*d*, and the common electrode 115 over the common layer 114. In the light-receiving device 150, the layer 113*d* and the common layer 114 can be collectively referred to as a PS layer.

The top end portions of the pixel electrodes 111*a*, 111*b*, 111*c*, and 111*d* are covered with the insulating layer 127. The insulating layer 127 can be a layer containing an organic material or an insulating layer containing an inorganic material. The insulating layer 127 may have a stacked-layer structure of an insulating layer containing an inorganic material and an insulating layer containing an organic material. The insulating layer 127 can prevent the pixel electrodes 111*a*, 111*b*, 111*c*, and 111*d* from being in contact with the common layer 114 and the common electrode 115, which can inhibit short circuits of the light-emitting devices and the light-receiving device.

The end portions of the pixel electrodes 111*a*, 111*b*, 111*c*, and 111*d* each preferably have a tapered shape. In the case where the pixel electrodes each have an end portion with a tapered shape, the EL layer and the PS layer that are provided along side surfaces of the pixel electrodes also have tapered shapes. When the side surfaces of the pixel electrodes are tapered, coverages with the EL layer and the PS layer provided along the side surfaces of the pixel electrodes can be improved. The pixel electrodes having tapered side surfaces are preferred because a foreign matter (such as dust or particles) mixed during the manufacturing process can be easily removed by treatment such as cleaning.

In this specification and the like, a tapered shape indicates a shape in which at least part of a side surface of a structure is inclined to a substrate surface. For example, a tapered shape preferably includes a region where the angle between the inclined side surface and the substrate surface (such an angle is also referred to as a taper angle) is less than 90°. Note that the side surface of the component and the substrate surface is not necessarily completely flat, and may have a substantially planar shape with a small curvature or slight unevenness.

The display apparatus 100 includes the insulating layer 118 over the layer 113*d*. The insulating layer 118 includes a region between the layer 113*d* and the common electrode 115. The insulating layer 118 has a function of insulating a region of the layer 113*d* overlapping with the insulating layer 118 from a region of the common electrode 115 overlapping with the insulating layer 118.

In addition, the display apparatus 100 in FIG. 1B includes the insulating layer 118 over the layers 113*a*, 113*b*, and 113*c*. The insulating layer 118 includes a region between the layer 113*a* and the common electrode 115, a region between the layer 113*b* and the common electrode 115, and a region between the layer 113*c* and the common electrode 115.

The insulating layer 118 is provided to cover part of the layer 113*d*. The insulating layer 118 in FIG. 1B is provided to cover part of the layer 113*a*, part of the layer 113*b*, and part of the layer 113*c*. The insulating layer 118 is preferably in contact with the top surfaces of the layers 113*a*, 113*b*, 113*c*, and 113*d* in the regions of the insulating layer 118 covering the part of the layer 113*a*, the part of the layer 113*b*, the part of the layer 113*c*, and the part of the layer 113*d*.

The common layer 114 includes a region between the layer 113*d* and the common electrode 115. The common layer 114 in FIG. 1B further includes a region between the layer 113*a* and the common electrode 115, a region between the layer 113*b* and the common electrode 115, and a region between the layer 113*c* and the common electrode 115.

In regions not covered with the insulating layer 118 in the layers 113*a*, 113*b*, 113*c*, and 113*d*, the top surfaces of the layers 113*a*, 113*b*, 113*c*, and 113*d* are preferably in contact with the common layer 114. In the case where the common layer 114 is not provided, the top surfaces of the layers 113*a*, 113*b*, 113*c*, and 113*d* are preferably in contact with the common electrode 115.

The common layer 114 is provided so as to cover the insulating layer 118. The common layer 114 is preferably in contact with the top surface of the insulating layer 118. In the case where the common layer 114 is not provided, the common electrode 115 is preferably in contact with the top surface of the insulating layer 118.

Although FIG. 1B and other drawings illustrate cross sections of a plurality of insulating layers 118, the insulating layer 118 is one layer when the display apparatus 100 is seen from above. In other words, the display apparatus 100 can be configured to include one insulating layer 118, for example. Alternatively, the display apparatus 100 may include a plurality of insulating layers 118 which are separated from each other.

FIG. 2A is a top view corresponding to the structure of FIG. 1B. FIG. 2A illustrates a relationship between the insulating layer 118 and the pixel electrodes (pixel electrodes 111*a*, 111*b*, 111*c*, and 111*d*) included in the pixels in two rows and two columns illustrated in FIG. 1A. The insulating layer 118 has an opening portion on the inner side of the pixel electrode 111*d* in a region overlapping with the light-receiving device 150. In the display apparatus of one embodiment of the present invention, the opening portion of the insulating layer 118 in a region overlapping with the pixel electrode 111*d* used in the light-receiving device is smaller than the opening portions of the insulating layer 118 in regions overlapping with the pixel electrodes 111*a*, 111*b*, and 111*c* used in the light-emitting devices, which can provide a display apparatus with a high emission efficiency and a high S/N ratio at the time of light reception. In the cross section of FIG. 2B, the insulating layer 118 is positioned on the inner side of the opening portion of the insulating layer 127 in the region overlapping with the pixel electrode 111*d*. The insulating layer 118 is formed to be thick enough to prevent electrical conduction between the layer 113*d* and the common electrode 115, and an example of the thickness of the insulating layer 118 is greater than or equal to 1 nm and less than or equal to 3 μm, or greater than or equal to 3 nm and less than or equal to 1 µm. For example, an aluminum oxide film formed by an ALD method is used as the insulating layer 118, and the thickness of the insulating layer 118 may be greater than or equal to 6 nm and less than or equal to 30 nm.

Figure 3A:
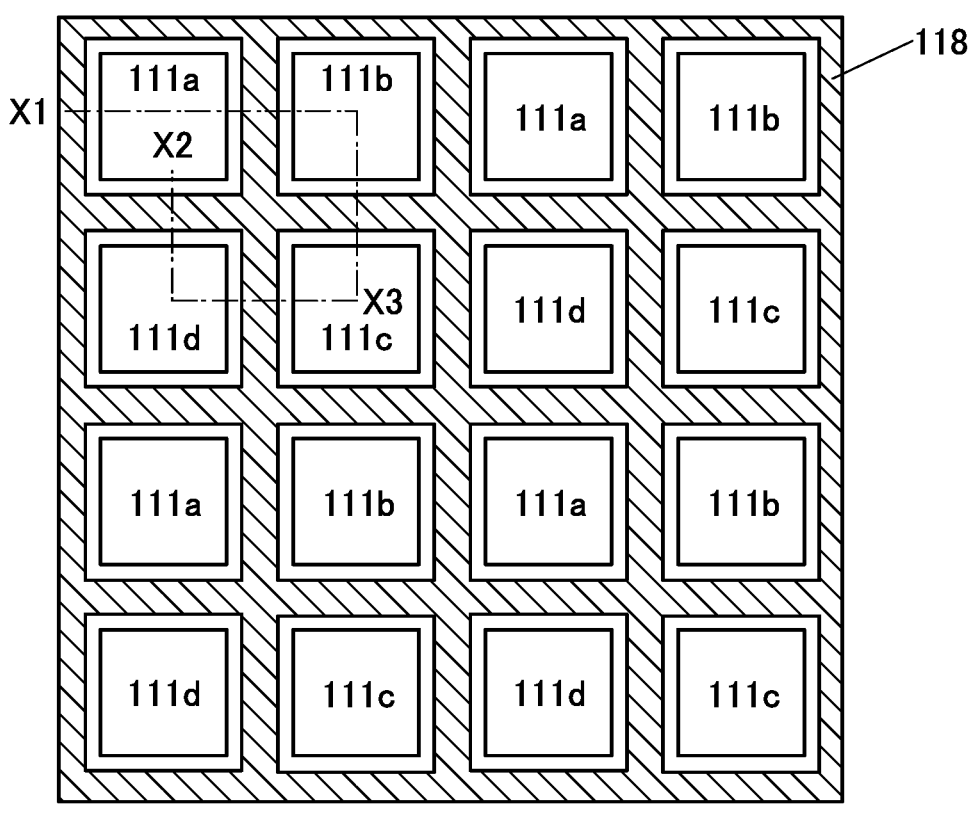
FIG. 3A is a top view illustrating an example of a display apparatus and FIG. 3B is a cross-sectional view illustrating an example of the display apparatus.

In the example illustrated in FIG. 2A, the insulating layer 118 has the region overlapping with the pixel electrode 111d, the opening portion of the insulating layer 118 is positioned in the pixel electrode 111d, the opening portion of the insulating layer 118 is positioned on the inner side of the outer edge of the pixel electrode 111d. FIG. 3A illustrates another example in which the insulating layer 118 does not overlap with the pixel electrode 111d and end portions of the insulating layer 118 are positioned on the outer side of the pixel electrode 111d.

Figure 3B:
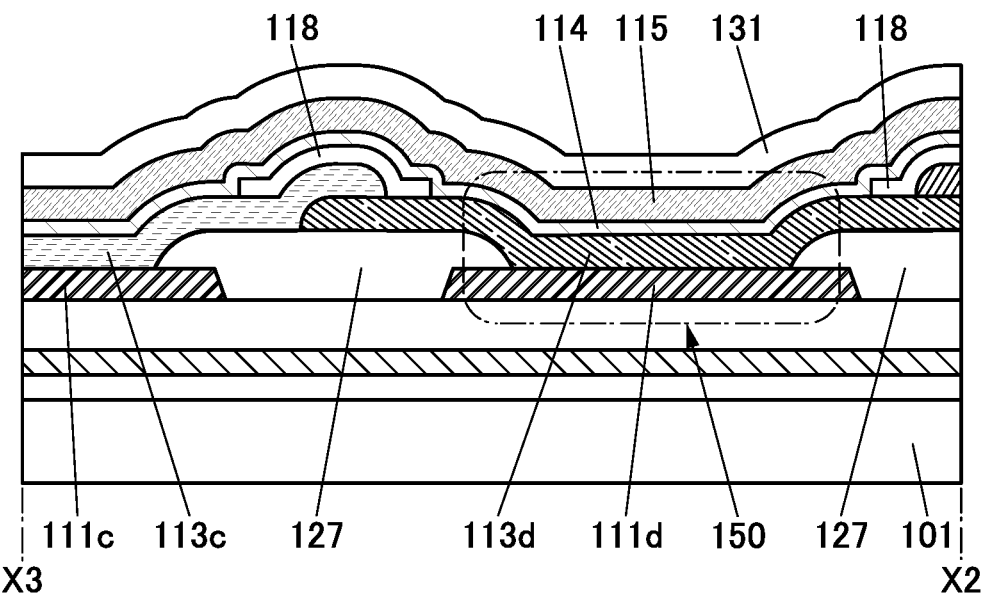

FIG. 3B is a cross-sectional view corresponding to FIG. 3A. The cross-sectional view in FIG. 3B is different from that in FIG. 2B in the area where the insulating layer 118 covers the layer 113d. In the cross-sectional view in FIG. 3B, the insulating layer 118 does not overlap with the pixel electrodes (pixel electrodes 111a, 111b, 111c, and 111d), and the end portion of the insulating layer 118 is positioned outside the pixel electrodes (pixel electrodes 111a, 111b, 111c, and 111d).

Although the pixel electrodes 111a, 111b, 111c, and 111d in the example illustrated in FIG. 2A each have a rectangular top surface, the shape of the top surface is not limited to the rectangular shape and may be a polygonal shape, a circular shape, an elliptical shape, a shape whose perimeter includes a curve and a line, or other shapes. In addition, part of the pixel electrodes (pixel electrodes 111a, 111b, 111c, and 111d) may extend to the outside of the subpixels. For example, a pixel electrode may extend to an adjacent subpixel.

In this embodiment, in the EL layers included in the light-emitting devices, island-shaped layers provided for the light-emitting devices are referred to as the layers 113a, 113b, and 113c. In the PS layer included in the light-receiving device, an island-shaped layer provided for the light-receiving device is referred to as the layer 113d. The layer shared by the plurality of light-emitting devices and light-receiving devices is referred to as the common layer 114.

The layers 113a, 113b, and 113c each include at least a light-emitting layer. Preferably, the layer 113a, the layer 113b, and the layer 113c include a red-light-emitting layer, a green-light-emitting layer, and a blue-light-emitting layer, respectively, for example.

The layer 113d includes a photoelectric conversion layer that has sensitivity in the visible light or infrared light wavelength range. A wavelength range to which the photoelectric conversion layer included in the layer 113d is sensitive preferably includes one or more of the wavelength range of light emitted from the layer 113a, the wavelength range of light emitted from the layer 113b, and the wavelength range of light emitted from the layer 113c.

The layers 113a, 113b, 113c, and 113d may each include one or more of a hole-injection layer, a hole-transport layer, a hole-blocking layer, a charge-generation layer, an electron-blocking layer, an electron-transport layer, and an electron-injection layer.

For example, the layers 113a, 113b, 113c, and 113d may each include a hole-injection layer, a hole-transport layer, a light-emitting layer (a photoelectric conversion layer in the case of the layer 113d), and an electron-transport layer. In addition, an electron-blocking layer may be provided between the hole-transport layer and the light-emitting layer (or the photoelectric conversion layer in the case of the layer 113d). Furthermore, an electron-injection layer may be provided over the electron-transport layer.

For example, the layers 113a, 113b, 113c, and 113d may each include the electron-injection layer, the electron-transport layer, the light-emitting layer (the photoelectric conversion layer in the case of the layer 113d), and the hole-transport layer in this order. In addition, a hole-blocking layer may be provided between the electron-transport layer and the light-emitting layer (or the photoelectric conversion layer in the case of the layer 113d). Furthermore, a hole-injection layer may be provided over the hole-transport layer.

The layers 113a, 113b, 113c, and 113d each preferably include the light-emitting layer (the photoelectric conversion layer in the case of the layer 113d) and the carrier-transport layer (the electron-transport layer or the hole-transport layer) which is over the light-emitting layer (the photoelectric conversion layer). When the surfaces of the layers 113a, 113b, 113c, and 113d are exposed in the manufacturing process of the display apparatus, providing the carrier-transport layer over the light-emitting layer (the photoelectric conversion layer) prevents the light-emitting layer (the photoelectric conversion layer) from being exposed on the outermost surface, so that damage to the light-emitting layer (the photoelectric conversion layer) can be reduced. Thus, the reliability of the light-emitting devices and the light-receiving device can be increased.

The layers 113a, 113b, and 113c, may each include a first light-emitting unit, a charge generation layer, and a second light-emitting unit, for example. Preferably, the layer 113a, the layer 113b, and the layer 113c include two or more light-emitting units that emit red light, two or more light-emitting units that emit green light, and two or more light-emitting units that emit blue light, respectively, for example.

It is preferable that the second light-emitting unit include a light-emitting layer and a carrier-transport layer (an electron-transport layer or a hole-transport layer) over the light-emitting layer. When the surface of the second light-emitting unit is exposed in the manufacturing process of the display apparatus, providing the carrier-transport layer over the light-emitting layer prevents the light-emitting layer from being exposed on the outermost surface, so that damage to the light-emitting layer can be reduced. Thus, the reliability of the light-emitting device can be increased.

As the insulating layer 118, one or more of a metal oxide film, a semiconductor film, an organic insulating film, an inorganic insulating film, and the like can be used, for example.

The insulating layer 118 can be, for example, a layer containing an inorganic insulating material. An oxide, a nitride, an oxynitride, a nitride oxide, or the like can be used as the inorganic insulating material included in the insulating layer 118. Examples of the oxide included in the insulating layer 118 include hafnium oxide, aluminum oxide, silicon oxide, gallium oxide, germanium oxide, yttrium oxide, zirconium oxide, lanthanum oxide, neodymium oxide, and tantalum oxide. Examples of the nitride included in the insulating layer 118 include silicon nitride and aluminum nitride. Examples of the oxynitride included in the insulating layer 118 include silicon oxynitride and aluminum oxynitride. Examples of the nitride oxide included in the insulating layer 118 include silicon nitride oxide and aluminum nitride oxide.

For example, a layer containing an inorganic insulating material such as aluminum oxide, hafnium oxide, or silicon oxide can be used suitably for the insulating layer 118.

As the insulating layer 118, an aluminum oxide film can be formed by an ALD method, for example. The use of an ALD method is preferable, in which case damage to a layer (especially, the EL layer or the like) under the insulating layer 118 can be reduced.

For example, when an aluminum oxide film is formed by an ALD method, two kinds of gases, i.e., $H_2O$ as an oxidizer and a source gas obtained by vaporization of a liquid containing a solvent and an aluminum precursor compound (e.g., trimethylaluminum (TMA, $Al(CH_3)_3$)) are used, for example. Alternatively, tris(dimethylamide)aluminum, tri-isobutylaluminum, aluminum tris(2,2,6,6-tetramethyl-3,5-heptanedionate), or the like may be used.

For example, the insulating layer 118 may be formed by a sputtering method, a CVD method, or a PECVD method, each of which has a higher deposition rate than an ALD method. In that case, a highly reliable display apparatus can be manufactured with high productivity.

For the insulating layer 118, a metal oxide such as In—Ga—Zn oxide can be used. As the insulating layer 118, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Moreover, indium tin oxide containing silicon can also be used, for example.

In addition, in place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used. In particular, M is preferably one or more of gallium, aluminum, and yttrium.

For example, the insulating layer 118 may have a stacked structure including two layers or more.

In the case where the insulating layer 118 has a stacked-layer structure of two or more layers and any of a metal oxide film, a semiconductor film, an organic insulating film, and an inorganic insulating film is used for at least one layer in the stacked-layer structure, a metal film may be used for at least one layer of the rest of the stacked-layer structure of the insulating layer 118.

Examples of a metal film include a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material. It is particularly preferable to use a low-melting-point material such as aluminum or silver. The use of a metal material capable of blocking ultraviolet light for the insulating layer 118 is preferable, in which case the EL layer can be prevented from being irradiated with ultraviolet light and deteriorating.

When the insulating layer 118 has a stacked structure of two or more layers, for example, a two-layer structure of an inorganic insulating film (e.g., an aluminum oxide film) formed by an ALD method as the lower layer and an inorganic film (e.g., an In—Ga—Zn oxide film, an aluminum film, or a tungsten film) formed by a sputtering method as the upper layer can be used.

The common layer 114 includes, for example, an electron-injection layer or a hole-injection layer. Alternatively, the common layer 114 may be a stacked-layer of an electron-transport layer and an electron-injection layer, or may be a stacked-layer of a hole-transport layer and a hole-injection layer. The common layer 114 is shared by the light-emitting devices 130a, 130b, and 130c and the light-receiving device 150.

Figure 5A:
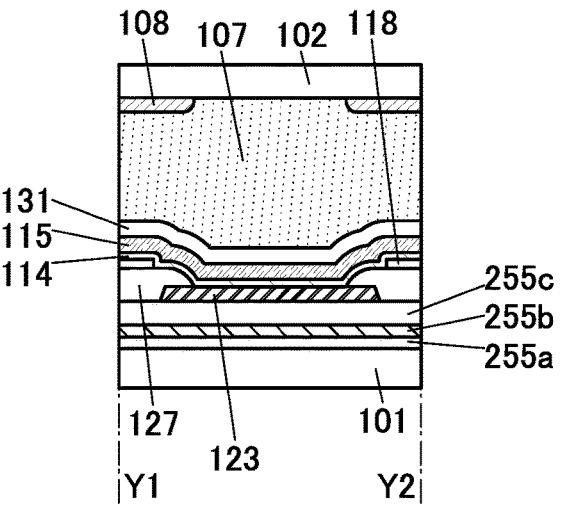
FIGS. 5A to 5C are cross-sectional views illustrating examples of a display apparatus.
Figure 5B:
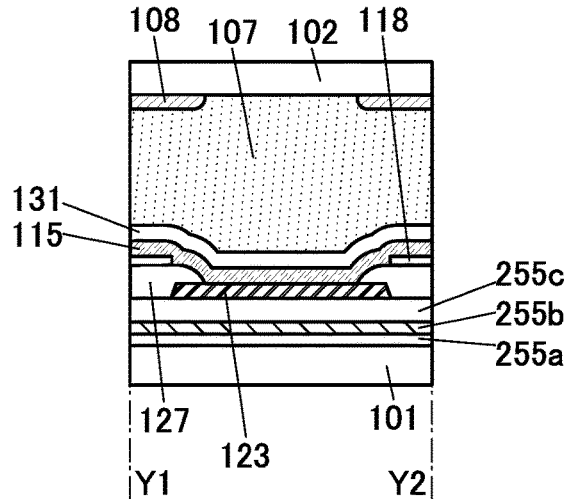

The common electrode 115 is shared by the light-emitting devices 130a, 130b, and 130c and the light-receiving device 150. As illustrated in FIGS. 5A and 5B, the common electrode 115 shared by the plurality of light-emitting devices is electrically connected to a conductive layer 123 provided in the connection portion 140. FIGS. 5A and 5B are cross-sectional views along the dashed-dotted line Y1-Y2 in FIG. 1A. The conductive layer 123 is preferably formed using a conductive layer formed using the same material and through the same steps as the pixel electrodes 111a, 111b, 111c and 111d or the like.

Note that FIG. 5A illustrates an example where the common layer 114 is provided over the conductive layer 123, and the conductive layer 123 and the common electrode 115 are electrically connected to each other through the common layer 114. The common layer 114 is not necessarily provided in the connection portion 140. In FIG. 5B, the conductive layer 123 and the common electrode 115 are directly connected to each other. For example, by using a mask for specifying a film formation area (also referred to as an area mask or a rough metal mask, which is distinguished from a fine metal mask), the common layer 114 and the common electrode 115 can be formed in different regions.

Figure 5C:
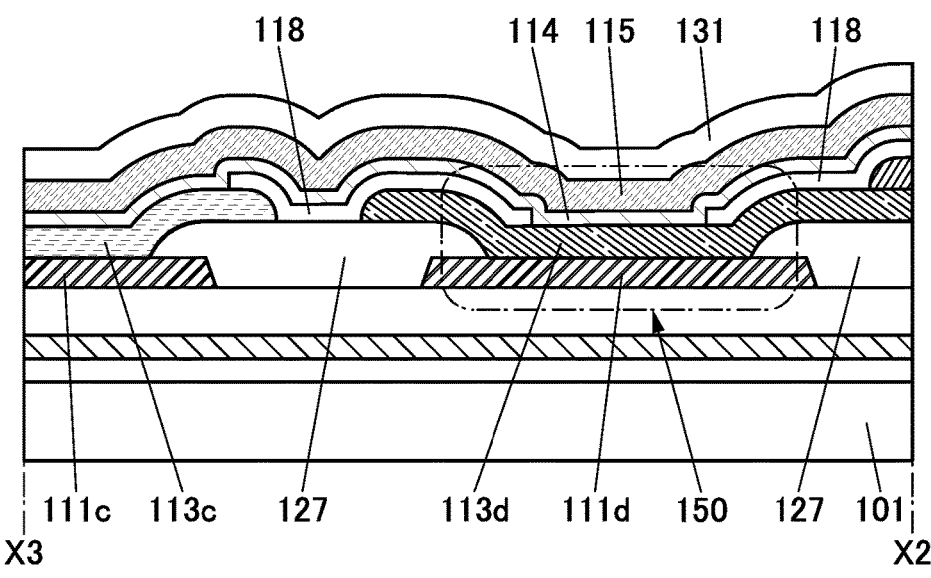

FIG. 5C illustrates an example in which the layer 113d and the layer 113c, the layer 113d and the layer 113a, and the like included in the adjacent subpixels are separated from each other without an overlap. In the structure illustrated in FIG. 5C, the insulating layer 118 covers an end portion of the layer 113d.

The pixel electrodes 111a, 111b, 111c, and 111d are provided for the respective light-emitting devices. Each of the common layer 114 and the common electrode 115 is provided as a continuous layer shared by the light-emitting devices and the light-receiving device. A conductive film that has a property of transmitting visible light is used for either the respective pixel electrodes or the common electrode 115, and a reflective conductive film is used for the other. When the pixel electrodes are light-transmitting electrodes and the common electrode 115 is a reflective electrode, a bottom-emission display apparatus is obtained. When the pixel electrodes are reflective electrodes and the common electrode 115 is a light-transmitting electrode, a top-emission display apparatus is obtained. Note that when both the pixel electrodes and the common electrode 115 transmit light, a dual-emission display apparatus can be obtained.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin enough to have a light-transmitting property. Alternatively, a stacked film of any of the above materials can be used for the conductive layers. For example, a stacked-layer of indium tin oxide and an alloy of silver and magnesium is preferably used, in which case conductivity can be increased. Moreover, graphene or the like may be used.

A conductive film that reflects the above visible light is preferably used for portions positioned on the layers 113a, 113b, 113c, and 113d sides of the pixel electrodes 111a, 111b, 111c, and 111d. For the conductive film, for example, a metal material such as aluminum, gold, platinum, silver, nickel, tungsten, chromium, molybdenum, iron, cobalt, copper, or palladium, or an alloy containing any of these metal materials can be used. Silver is preferably used because of its high reflectivity of visible light. In addition, aluminum is preferably used because an aluminum electrode is easily etched, processing of the electrode is easy, and the aluminum electrode has high reflectivity of visible light and near-infrared light. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance.

The pixel electrodes 111a, 111b, 111c, and 111d may have a structure in which a conductive metal oxide film is stacked over the conductive film reflecting visible light. Such a structure can avoid the conductive film reflecting visible light from being oxidized or corroded. For example, when a metal film or a metal oxide film is stacked in contact with an aluminum film or an aluminum alloy film, oxidation can be suppressed. Examples of a material for the metal film or the metal oxide film include titanium or titanium oxide. Alternatively, the above conductive film that transmits visible light and a film containing a metal material may be stacked. For example, a stacked-layer of silver and indium tin oxide, a stacked-layer of an alloy of silver and magnesium and indium tin oxide, or the like can be used.

When aluminum is used as the pixel electrodes 111a, 111b, 111c, and 111d, the thickness of aluminum is preferably greater than or equal to 40 nm, further preferably greater than or equal to 70 nm, in which case the reflectivity of visible light or the like can be sufficiently increased. When silver is used as the pixel electrodes 111a, 111b, 111c, and 111d, the thickness of silver is preferably greater than or equal to 70 nm, further preferably greater than or equal to 100 nm, in which case the reflectivity of visible light or the like can be sufficiently increased.

As the conductive film having light transmitting and reflecting properties that can be used for the common electrode 115, the conductive film reflecting visible light formed thin enough to transmit visible light can be used. In addition, with the stacked-layer structure of the conductive film and the conductive film transmitting visible light, the conductivity or the mechanical strength can be increased.

The conductive film having light transmitting and reflecting properties has a reflectivity with respect to visible light (e.g., the reflectivity with respect to light having a specific wavelength within the range of 400 nm to 700 nm) of higher than or equal to 20% and lower than or equal to 80%, preferably higher than or equal to 40% and lower than or equal to 70%. The conductive film having reflective property preferably has a reflectivity with respect to visible light higher than or equal to 40% and lower than or equal to 100%, further preferably higher than or equal to 70% and lower than or equal to 100%. The conductive film having light-transmitting property preferably has a reflectivity with respect to visible light higher than or equal to 0% and lower than or equal to 40%, further preferably higher than or equal to 0% and lower than or equal to 30%.

As the pixel electrodes 111a, 111b, 111c, and 111d serving as the lower electrodes, a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride); or the like can be used.

The electrodes included in the light-emitting device can be formed by an evaporation method, a sputtering method or the like. Alternatively, a discharging method such as an inkjet method, a printing method such as a screen printing method, or a plating method may be employed.

The protective layer 131 is preferably provided over the light-emitting devices 130a, 130b, 130c, and the light-receiving device 150. Providing the protective layer 131 can improve the reliability of the light-emitting devices and the light-receiving device. The protective layer 131 may have a single-layer structure or a stack-layered structure including two or more layers.

There is no limitation on the conductivity of the protective layer 131. As the protective layer 131, at least one type of an insulating film, a semiconductor film, and a conductive film can be used.

The protective layer 131 including an inorganic film can inhibit deterioration of the light-emitting devices and the light-receiving device by preventing oxidation of the common electrode 115 and inhibiting entry of impurities (e.g., moisture and oxygen) into the light-emitting devices and the light-receiving device, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, a tantalum oxide film, and the like. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stacked-layer of an aluminum oxide film and a silicon nitride film over the aluminum oxide film, or a stacked-layer of an aluminum oxide film and an IGZO film over the aluminum oxide film. Such a stacked-layer structure can suppress entry of impurities (such as water and oxygen) into the EL layer.

Furthermore, the protective layer 131 may include an organic film. For example, the protective layer 131 may include both an organic film and an inorganic film. Examples of an organic material that can be used for the protective layer 131 include organic insulating materials that can be used for the insulating layer 127 described later.

The protective layer 131 may have a stacked-layer structure of two layers formed by different formation methods. Specifically, the first layer of the protective layer 131 may be formed by an ALD method, and the second layer of the protective layer 131 may be formed by a sputtering method.

The common layer 114 and the common electrode 115 are provided over the layers 113a, 113b, 113c, and 113d, and the insulating layer 118.

As the insulating layer 127, an insulating layer containing an organic material can be favorably used. Preferred examples of an organic material included in the insulating layer 127 include an acrylic resin, an epoxy resin, a polyimide resin, a polyamide resin, a polyimide-amide resin, a polysiloxane resin, a benzocyclobutene-based resin, and a phenol resin. The insulating layer 127 may contain an inorganic material. Examples of the inorganic material that can be used for the insulating layer 127 include an oxide, a nitride, an oxynitride, and a nitride oxide. As the oxide included in the insulating layer 127, silicon oxide, aluminum oxide, gallium oxide, germanium oxide, yttrium oxide, zirconium oxide, lanthanum oxide, neodymium oxide, hafnium oxide, tantalum oxide, or the like can be used. As the nitride included the insulating layer 127, silicon nitride, aluminum nitride, or the like can be used. As the oxynitride included in the insulating layer 127, silicon oxynitride, aluminum oxynitride, or the like can be used. As the nitride oxide included in the insulating layer 127, silicon nitride oxide, aluminum nitride oxide, or the like can be used.

Although the thicknesses of the layers 113a, 113b, and 113c are equal in the example of FIG. 1B, the present invention is not limited to the example. The layers 113a, 113b, and 113c may have different thicknesses. The thicknesses may be set in accordance with optical path lengths that intensifies light emitted from the layers 113a, 113b, and 113c. A microcavity structure can be achieved in this manner, and the color purity of each light-emitting device can be increased.

For example, when the layer 113c emits light having the longest wavelength and the layer 113b emits light with the shortest wavelength, the layer 113c can have the largest thickness and the layer 113b can have the smallest thickness. Without limitation to this, the thicknesses of the EL layers can be adjusted in consideration of the wavelengths of light emitted from the light-emitting devices, the optical characteristics of layers included in the light-emitting devices, the electrical characteristics of the light-emitting devices, and the like.

As the adhesive layer 107, various curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

A light-blocking layer may be provided on the surface of the substrate 102 that faces the adhesive layer 107. In the example of FIG. 1B, a light-blocking layer 108 is provided on the surface of the substrate 102 that faces the adhesive layer 107. In the display apparatus of one embodiment of the present invention, the opening portion of the insulating layer 118 in a region overlapping with the pixel electrode 111d used in the light-receiving device is preferably smaller than the opening portions in the insulating layer 118 overlapping with the pixel electrodes 111a, 111b, and 111c used in the light-emitting devices, which can provide a display apparatus with a high emission efficiency and a high S/N ratio. In this case, the opening portion of the light-blocking layer 108 that covers a peripheral region of the pixel electrode 111d is also preferably smaller than the opening portions of the light-blocking layer 108 that covers the peripheral regions of the pixel electrodes 111a, 111b, and 111c, which can further improve the performance of the display apparatus. A variety of optical members can be arranged on the outer surface of the substrate 102. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 102. For example, it is preferable to provide, as the surface protective layer, a glass layer or a silica layer (SiO$_x$ layer) because the surface contamination or damage can be prevented. The surface protective layer may be formed using diamond like carbon (DLC), aluminum oxide (AlO$_x$), a polyester-based material, a polycarbonate-based material, or the like. For the surface protective layer, a material having a high transmitting property with respect to visible light is preferably used. The surface protective layer is preferably formed using a material with high hardness.

The light-blocking layer 108 preferably absorbs visible light. The light-blocking layer 108 preferably absorbs infrared light. The light-blocking layer 108 can be formed using a metal material or a resin material containing pigment (e.g., carbon black) or dye, for example. The light-blocking layer 108 may have a stacked-layer structure in which two or more of a red-coloring layer, a green-coloring layer, and a blue-coloring layer are stacked.

By providing the light-blocking layer 108, the amount of light entering a peripheral region of the light-receiving region in the light-receiving device 150 can be reduced. By providing the light-blocking layer 108, light emitted from the light-emitting device 130 can be prevented from leaking into an adjacent subpixel. In addition, light from the light-emitting device 130 provided in the subpixel can be prevented from leaking into the light-receiving device 150 provided in an adjacent subpixel. The light-blocking layer 108 has an opening portion at least in each of a position overlapping with the light-receiving device 150 and a position overlapping with the light-emitting device 130.

Note that in the display apparatus of one embodiment of the present invention, the light-blocking layer may be omitted.

For the substrates 101 and 102, glass, quartz, ceramics, sapphire, a resin, a metal, an alloy, a semiconductor, or the like can be used. The substrate on the side from which light from the light-emitting device is extracted is formed using a material which transmits the light. When flexible materials are used for the substrates 101 and 102, the flexibility of the display apparatus can be increased. Furthermore, polarizing plates may be used as the substrates 101 and 102.

For each of the substrates 101 and 102, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to be flexible may be used for the substrates 101 and 102.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display apparatus might be changed, e.g., creases might be caused. Thus, a film with a low water absorption rate is preferably used for the substrate. For example, the water absorption rate of the film is preferably 1% or lower, further preferably 0.1% or lower, still further preferably 0.01% or lower.

Thin films included in the display apparatus (e.g., insulating films, semiconductor films, and conductive films) can be formed by a sputtering method, a chemical vapor deposition (CVD) method, a vacuum evaporation method, a pulsed laser deposition (PLD) method, an ALD method, or the like. Examples of a CVD method include a plasma-enhanced CVD (PECVD) method and a thermal CVD method. An example of a thermal CVD method is a metal organic CVD (MOCVD) method.

Alternatively, the thin films included in the display apparatus (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method).

Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

The island-shaped EL layer and the island-shaped insulating layers included in the display apparatus can be formed using a metal mask having a fine pattern.

Alternatively, the island-shaped EL layers and the island-shaped insulating layers included in the display apparatus can be formed by processing thin films. When the island-shaped EL layers and the island-shaped insulating layers are formed by processing thin films, a photolithography process or the like may be employed. Alternatively, the thin films may be processed by a nanoimprinting method, a sandblasting method, a lift-off method, or the like. Alternatively, island-shaped thin films may be directly formed by a film formation method using a shielding mask such as a metal mask.

There are two typical examples of photolithography processes. In one of the methods, a resist mask is formed over a thin film to be processed, the thin film is processed by etching or the like, and then the resist mask is removed. In the other method, a photosensitive thin film is formed and then processed into a desired shape by light exposure and development.

As light for exposure in a photolithography process, it is possible to use light with the i-line (wavelength: 365 nm), light with the g-line (wavelength: 436 nm), light with the h-line (wavelength: 405 nm), or light in which two or more of the i-line, the g-line, and the h-line are mixed. Furthermore, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for exposure, an electron beam can be used. It is preferable to use EUV, X-rays, or an electron beam because extremely minute processing can be performed. Note that a photomask is not needed when light exposure is performed by scanning with a beam such as an electron beam.

For etching of thin films, a dry etching method, a wet etching method, a sandblast method, or the like can be used.

A coloring layer may be provided to overlap with the light-emitting device 130. The coloring layer can transmit at least part of the wavelength range of light emitted from the light-emitting device. For example, in the case where the light-emitting device 130 emits red light, the coloring layer has a function of transmitting light with an intensity in the red wavelength range. In the case where the light-emitting device 130 emits green light, the coloring layer has a function of transmitting light with an intensity in the green wavelength range, for example. In the case where the light-emitting device 130 emits blue light, the coloring layer has a function of transmitting light with an intensity in the blue wavelength range, for example. The coloring layer may be provided to overlap with the light-receiving device 150. For example, the coloring layer that transmits light with an intensity in a wavelength range to which the light-receiving device 150 has a high sensitivity may be provided to overlap with the light-receiving device 150.

By providing the coloring layer, reflection of external light can be significantly reduced. Moreover, when the light-emitting device has a microcavity structure, reflection of external light can be further reduced. By reducing reflection of external light in this manner, reflection of external light can be sufficiently suppressed without using an optical member such as a circularly polarizing plate for the display apparatus. Since a circularly polarizing plate is not used for the display apparatus, attenuation of light emitted from the light-emitting device 130 can be reduced, leading to lowering the power consumption of the display apparatus.

Although the above describes the example in which light of different colors is emitted from the light-emitting devices 130a, 130b, and 130c, the present invention is not limited to the example. For example, a structure in which the light-emitting devices 130a, 130b, and 130c can emit white light can be employed. In this case, when the light-emitting devices 130a, 130b, and 130c overlap with coloring layers that can transmit light with different wavelengths, the sub-pixels 110a, 110b, and 110c exhibit light of different colors. Coloring layers that can transmit visible light of different colors are used for the subpixels, whereby full color display is possible. In this case, light-emitting devices used in the subpixels can be formed using the same materials; thus, the manufacturing process can be simplified and the manufacturing cost can be reduced.

[Variation Example 1 of Display Apparatus]

Next, a variation example of the display apparatus 100 in which the structure of the insulating layer 118 is varied is described with reference to FIGS. 6A to 6C.

Figure 6A:
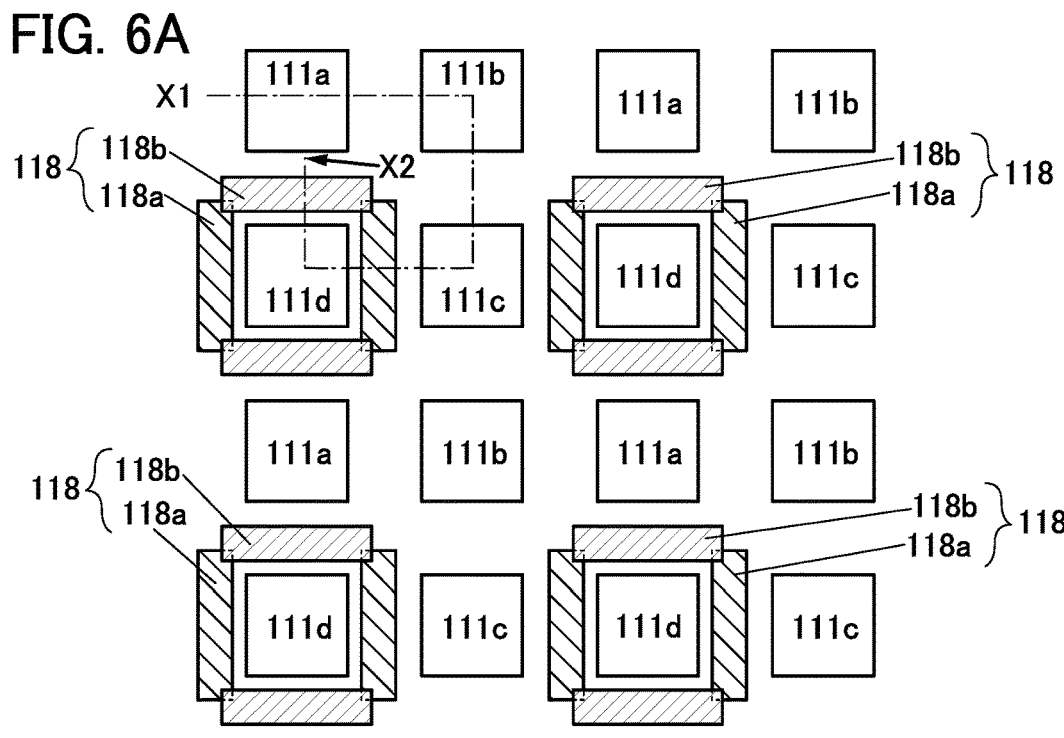
FIG. 6A is a top view of an example of a display apparatus and FIGS. 6B and 6C are cross-sectional views illustrating examples of the display apparatus.

FIG. 6A is a top view of an example in which an insulating layer is provided only in the periphery of the pixel electrode 111d included in the light-receiving device 150. In the example illustrated in FIG. 6A, the insulating layer 118 includes two layers, that is, insulating layers 118a and 118b. In the example of the structure illustrated in FIG. 6A, the insulating layers 118a and 118b replace the insulating layer 118 in the structures illustrated in FIG. 2A and the like, and are provided so as to surround the pixel electrode 111d.

For the insulating layers 118a and 118b, a material and a structure that can be used for the insulating layer 118 can be employed.

Figure 6B:
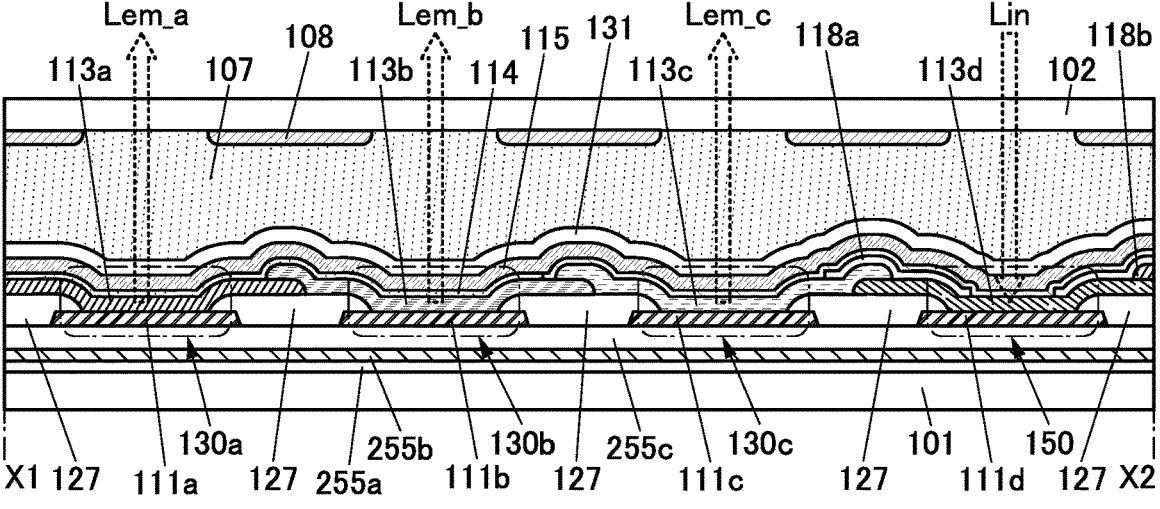
Figure 6C:
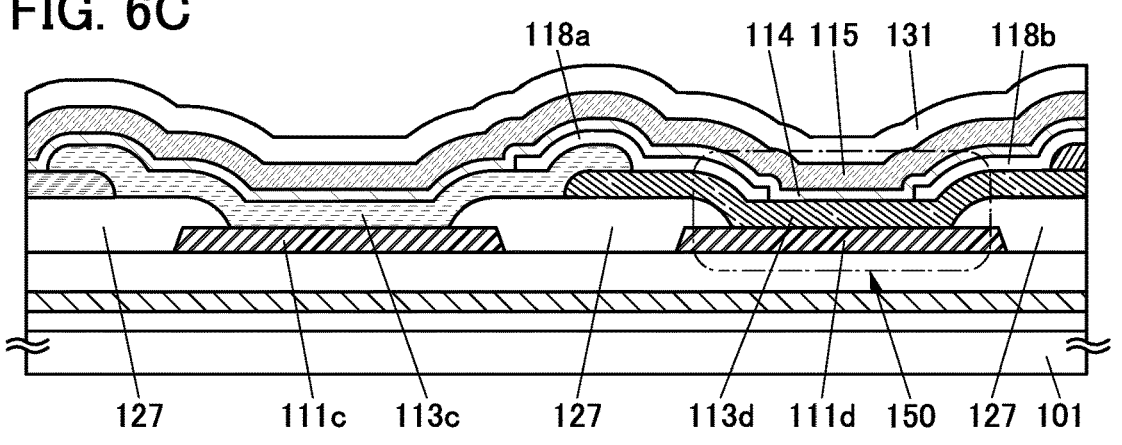

FIG. 6B illustrates an example of a cross section taken along X1-X2 in FIG. 6A in the case where the pixel electrodes 111a, 111b, 111c, and 111d and the insulating layers 118a and 118b in the display apparatus 100 adopt the structure in FIG. 6A. FIG. 6C is an enlarged view of part of FIG. 6B.

In manufacturing the display apparatus 100, the insulating layer 118 is divided into two layers, that is, the insulating layers 118a and 118b: the insulating layer 118a is formed and then the insulating layer 118b is formed, and the insulating layers 118a and 118b are processed with metal masks. The insulating layer 118b is provided to overlap with part of the insulating layer 118a, in which case the insulating layers 118a and 118b can be provided so as to favorably surround the pixel electrode 111d.

In the structure illustrated in FIG. 6B, the insulating layer 118a is positioned over the layers 113d and 113c, and the insulating layer 118b is positioned over the layers 113d and 113a. Thus, the insulating layer 118a is formed after the layers 113d and 113c are formed, and the insulating layer 118b is formed after the layers 113d and 113a are formed. For example, the structure illustrated in FIG. 6B can be obtained in the following manner: the insulating layers 118a and 118b are formed after the layers 113d, 113a, 113b, and 113c are formed.

The step of forming the layers 113d, 113a, 113b, and 113c and the step of forming the insulating layers 118a and 118b is preferably continuously performed and between the steps, and the substrate is preferably transferred under reduced pressure or an inert gas atmosphere such as a noble gas.

Figure 7A:
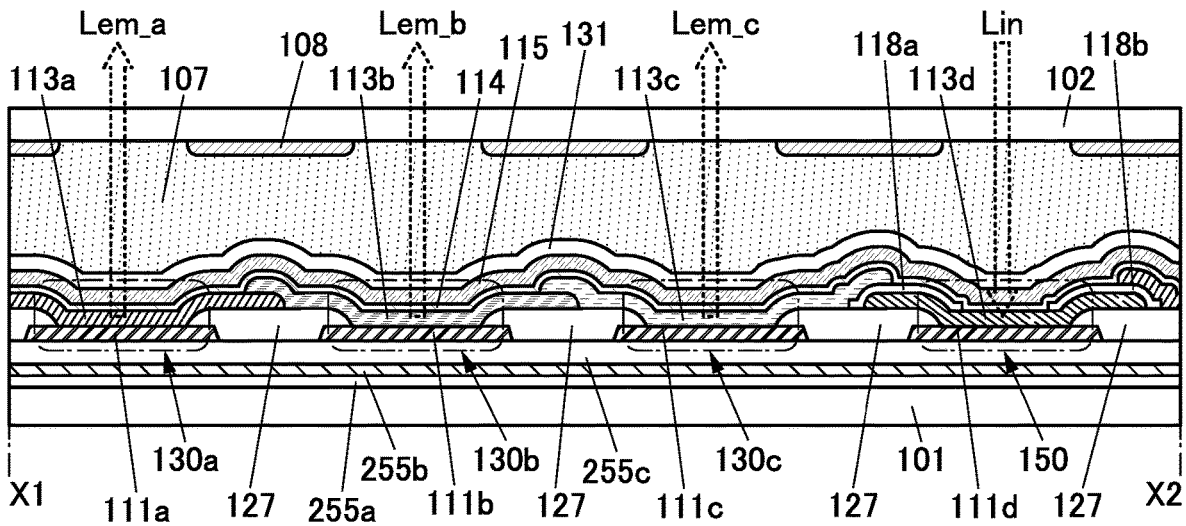
FIGS. 7A and 7B are cross-sectional views illustrating an example of a display apparatus.
Figure 7B:
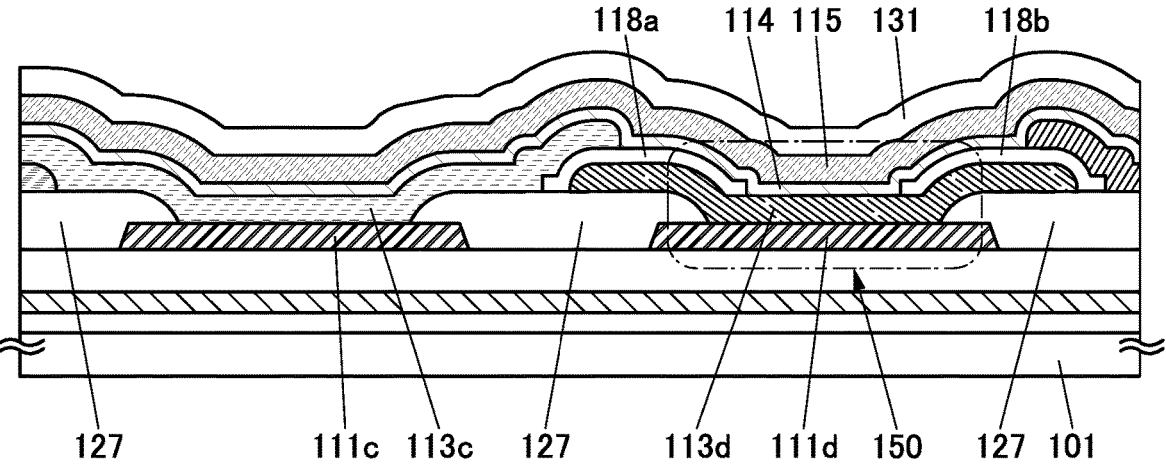

The structure illustrated in FIG. 7A is different from that in FIG. 6B in that the layer 113c is placed over the insulating layer 118a and the layer 113a is placed over the insulating layer 118b. FIG. 7B is an enlarged view of part of the region in FIG. 7A. The insulating layer 118a preferably includes a region in contact with the top surface of the layer 113d. The insulating layer 118a includes a region between the layer 113d and the layer 113c. The layer 113c preferably includes a region in contact with a top surface of the insulating layer 118a. The insulating layer 118b preferably includes a region in contact with a top surface of the layer 113d. The insulating layer 118b includes a region between the layer 113d and the layer 113a. The layer 113a preferably includes a region in contact with a top surface of the insulating layer 118b.

The structure illustrated in FIG. 7A can be obtained in the following manner, for example: the insulating layers 118a and 118b are formed after the layer 113d is formed, and then, the layers 113a, 113b, and 113c are formed. The layers 113a, 113b, and 113c are formed after the formation of the insulating layers 118a and 118b, whereby the layers 113a, 113b, and 113c can avoid damages in forming insulating layers 118a and 118b.

[Variation Example 2 of Display Apparatus]

Next, a variation example of the display apparatus 100 in which the structure of the insulating layer 118 is varied will be described with reference to FIGS. 8A and 8B.

Figure 8A:
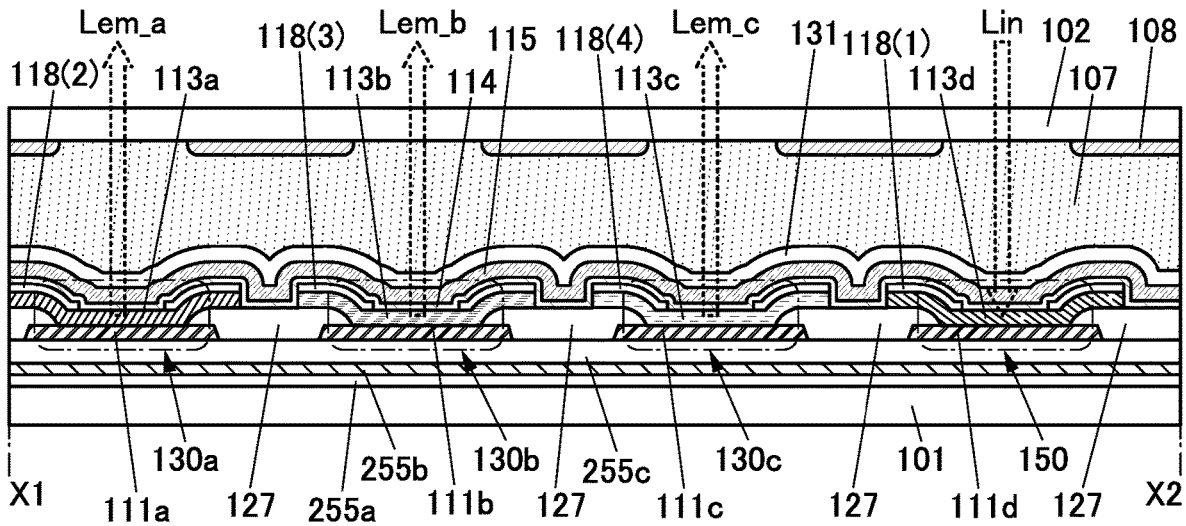
FIGS. 8A and 8B are cross-sectional views illustrating an example of a display apparatus.
Figure 8B:
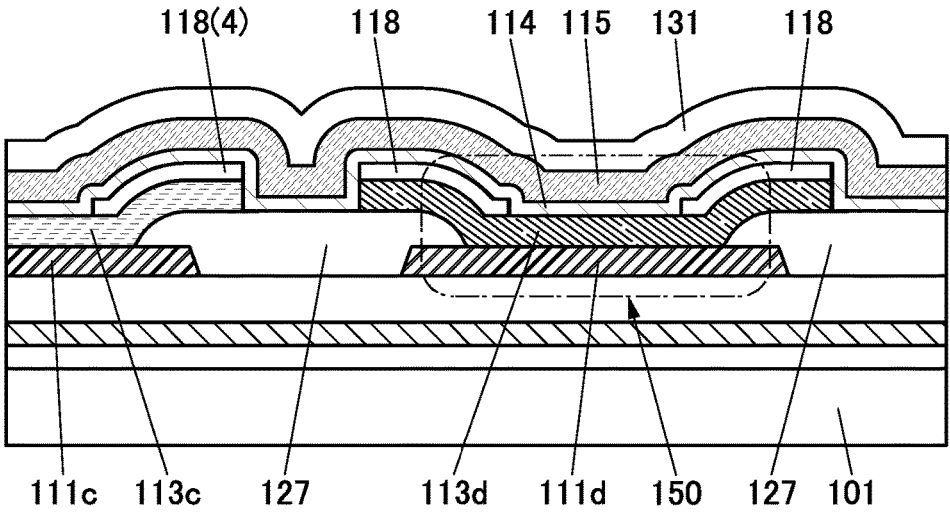

FIG. 8A is an example of the cross section taken along X1-X2 in FIG. 1A, and is different from FIGS. 1B, 6B, 7A and other drawings in the structure of the insulating layer 118. FIG. 8B is an enlarged view of part of FIG. 8A.

In the structure illustrated in FIG. 8A, the layers 113a, 113b, 113c, and 113d included in adjacent subpixels are provided so as to be separated from each other. In addition, the structure illustrated in FIG. 8A includes the insulating layer 118 (hereinafter, sometimes referred to as an insulating layer 118(1)) provided over the layer 113d, the insulating layer 118 (hereinafter, sometimes referred to as an insulating layer 118(2)) provided over the layer 113a, the insulating layer 118 (hereinafter, sometimes referred to as an insulating layer 118(3)) provided over the layer 113b, and the insulating layer 118 (hereinafter, sometimes referred to as an insulating layer 118(4)) provided over the layer 113c. Films to be the insulating layers 118(1), 118(2), 118(3), and 118(4) are separately formed in the manufacturing process in some cases. In other words, the films to be the insulating layers 118(1), 118(2), 118(3), and 118(4) are formed at different timings in some cases.

For the materials, structures, and the like usable for the insulating layers 118(1), 118(2), 118(3), and 118(4), the description of the insulating layer 118 can be referred to as appropriate.

In the structure illustrated in FIG. 8A, end portions of the layers 113a, 113b, 113c, and 113d are substantially aligned with the end portions of the insulating layers 118. The layer 113d is processed by etching using the insulating layer 118(1) as a mask layer, then at least part of the region overlapping with the pixel electrode 111d in the insulating layer 118(1) is removed, so that the insulating layer 118(1) and the layer 113d illustrated in FIG. 8A can be formed. An example of a method for manufacturing the structure illustrated in FIGS. 8A and 8B will be described later.

Example 1 of Manufacturing Method of Display Apparatus

FIGS. 9A to 9D illustrate an example of a method of manufacturing a display apparatus of one embodiment of the present invention.

First, the insulating layers 255a, 255b, and 255c are formed in this order over the substrate 101. After that, a conductive film to be the pixel electrodes 111a, 111b, 111c, and 111d is formed, the conductive film is partly removed to form the pixel electrodes 111a, 111b, 111c, and 111d. Then, the insulating layer 127 is formed.

Figure 9A:
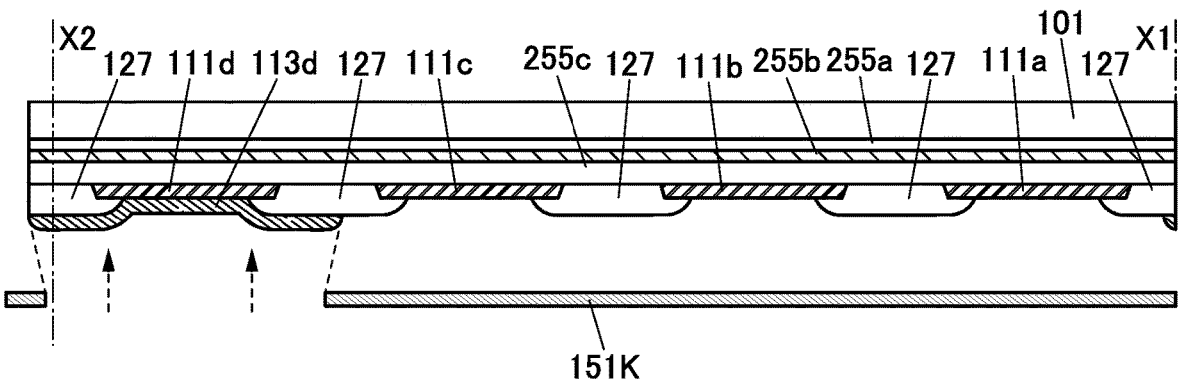
FIGS. 9A to 9D are cross-sectional views illustrating an example of a method for manufacturing a display apparatus.

The layer 113d is formed using a fine metal mask 151K (FIG. 9A). The layer 113d can be formed by, for example, an evaporation method.

Figure 9B:
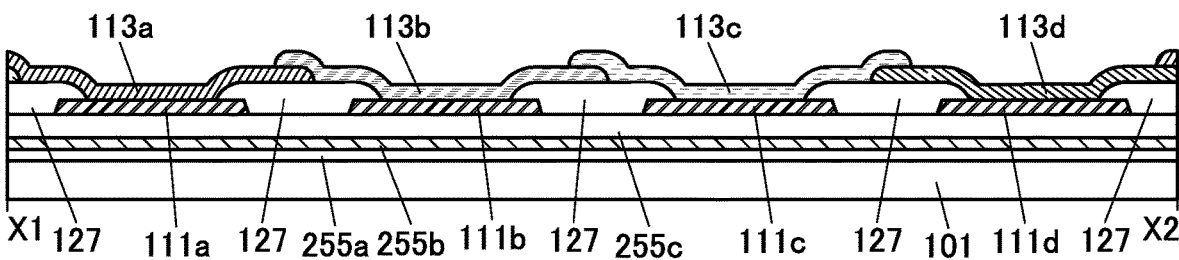

Next, the layers 113a, 113b, and 113c are formed using a fine metal mask (FIG. 9B). Note that the formation order of the layers 113a, 113b, and 113c is not limited to this order.

Figure 9C:
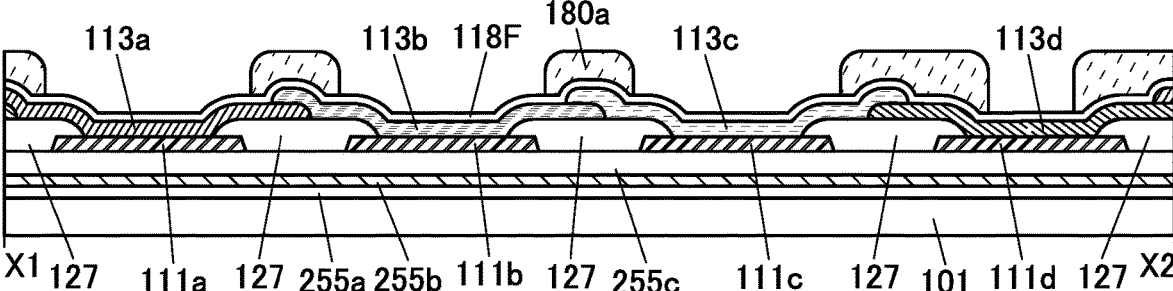

An insulating film 118F to be the insulating layer 118 is formed. Then, a resist mask 180a is formed by a photolithography process (FIG. 9C). The resist mask 180a is preferably provided so as to overlap with at least part of the insulating layer 127.

Figure 9D:
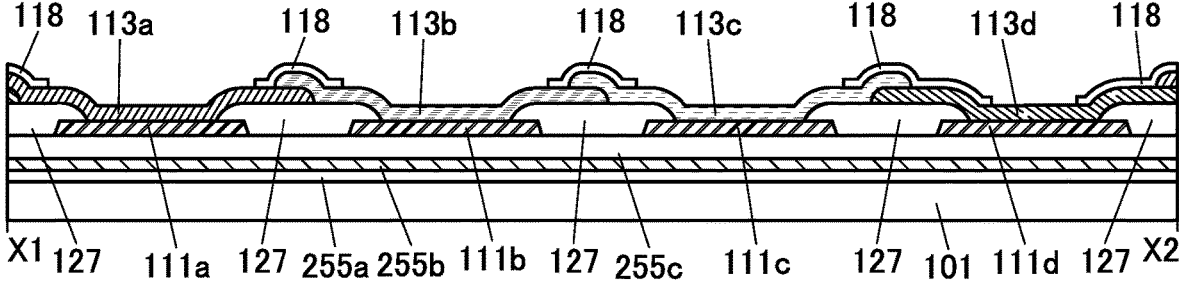

Next, a region not covered with the resist mask 180a, of the insulating film 118F, is removed by etching to form the insulating layer 118. After that, the resist mask 180a is removed (FIG. 9D). Then, the common layer 114, the common electrode 115, and the protective layer 131 are formed in this order. After that, the substrate 102 provided with the light-blocking layer 108 is attached by the adhesive layer 107, whereby the display apparatus 100 illustrated in FIG. 1B can be manufactured.

The etching treatment of the insulating layer 118 is preferably performed by a wet etching method. The use of a wet etching method can reduce damage to the layers 113a, 113b, 113c, and 113d compared with the case of using a dry etching method. A chemical solution used for the wet etching treatment may be alkaline or acid. For example, wet etching using an alkaline solution such as a tetramethyl ammonium hydroxide (TMAH) aqueous solution can be performed. Alternatively, an acid solution such as diluted hydrofluoric acid, oxalic acid, phosphoric acid, acetic acid, nitric acid, or a mixed solution thereof may be used for the wet etching. In the case of wet etching using an acid solution, a mixed acid chemical solution containing water, phosphoric acid, diluted hydrofluoric acid, and nitric acid may be used.

Furthermore, heat treatment may be further performed after parts of the layers 113a, 113b, 113c, and 113d are exposed by the etching treatment of the insulating layer 118. Through the heat treatment, water or the like that is contained in the layers 113a, 113b, 113c, and 113d or is adsorbed on surfaces of the layers 113a, 113b, 113c, and 113d can be removed. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case dehydration at a lower temperature is possible. Note that the temperature range of the heat treatment is preferably set as appropriate also in consideration of the upper temperature limits of the layers 113a, 113b, 113c, and 113d. In consideration of the upper temperature limits of the layers 113a, 113b, 113c, and 113d, a temperature higher than or equal to 70° C. and lower than or equal to 120° C. is particularly preferable in the above temperature ranges.

Example 2 of Manufacturing Method of Display Apparatus

Figure 10A:
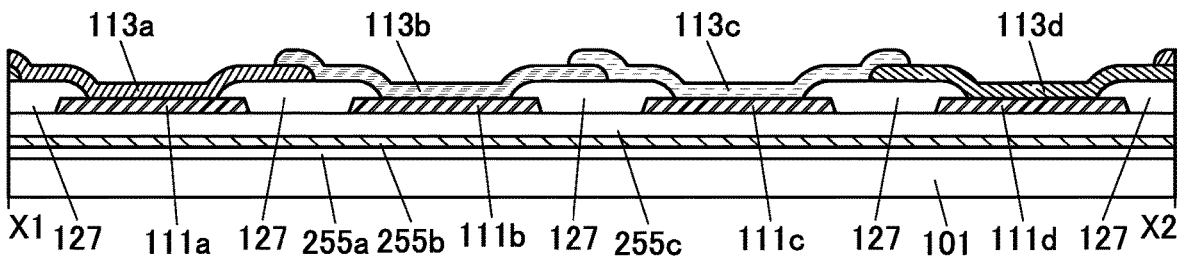
FIGS. 10A to 10C are cross-sectional views illustrating an example of a method for manufacturing a display apparatus.
Figure 10B:
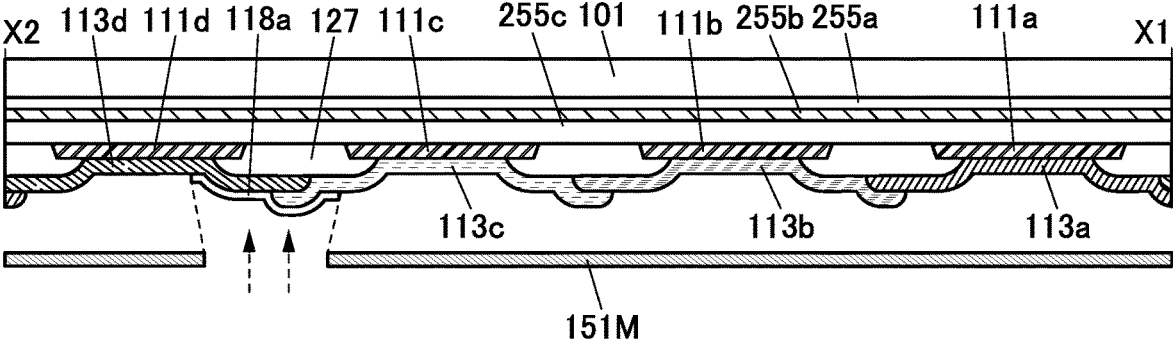
Figure 10C:
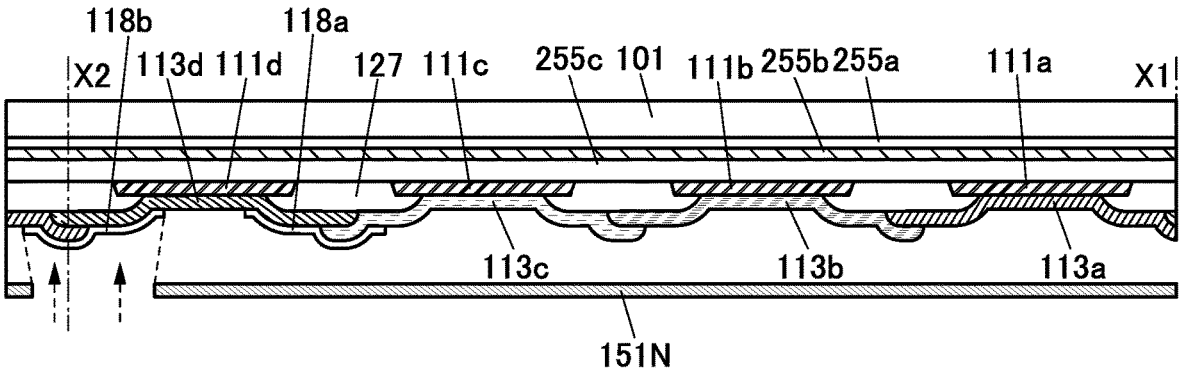

FIGS. 10A to 10C illustrate an example of a method of manufacturing a display apparatus of one embodiment of the present invention.

First, a structure illustrated in FIG. 10A is formed by the manufacturing method described in FIGS. 9A and 9B, for example.

Next, with the use of a fine metal mask 151M, the insulating layer 118a is formed so as to overlap with at least part of the insulating layer 127 placed between the pixel electrode 111d and the pixel electrode 111c (FIG. 10B).

Next, the insulating layer 118b is formed so as to overlap with at least part of the insulating layer 127 placed between the pixel electrode 111d and the pixel electrode 111a with use of a fine metal mask 151N (FIG. 10C). Then, the common layer 114, the common electrode 115, and the protective layer 131 are formed in this order. After that, the substrate 102 provided with the light-blocking layer 108 is attached by the adhesive layer 107, whereby the display apparatus 100 illustrated in FIG. 6B can be manufactured.

Example 3 of Manufacturing Method of Display Apparatus

An example of a method for manufacturing a display apparatus of one embodiment of the present invention is described with reference to FIGS. 11A to 11E.

First, the insulating layers 255a, 255b, and 255c are formed over the substrate 101. After that, a conductive film to be the pixel electrodes 111a, 111b, 111c, and 111d is formed, the conductive film is partly removed to form the pixel electrodes 111a, 111b, 111c, and 111d. After that, the insulating layer 127 is formed.

Figures 11A, 11B, 11C, 11D, 11E:
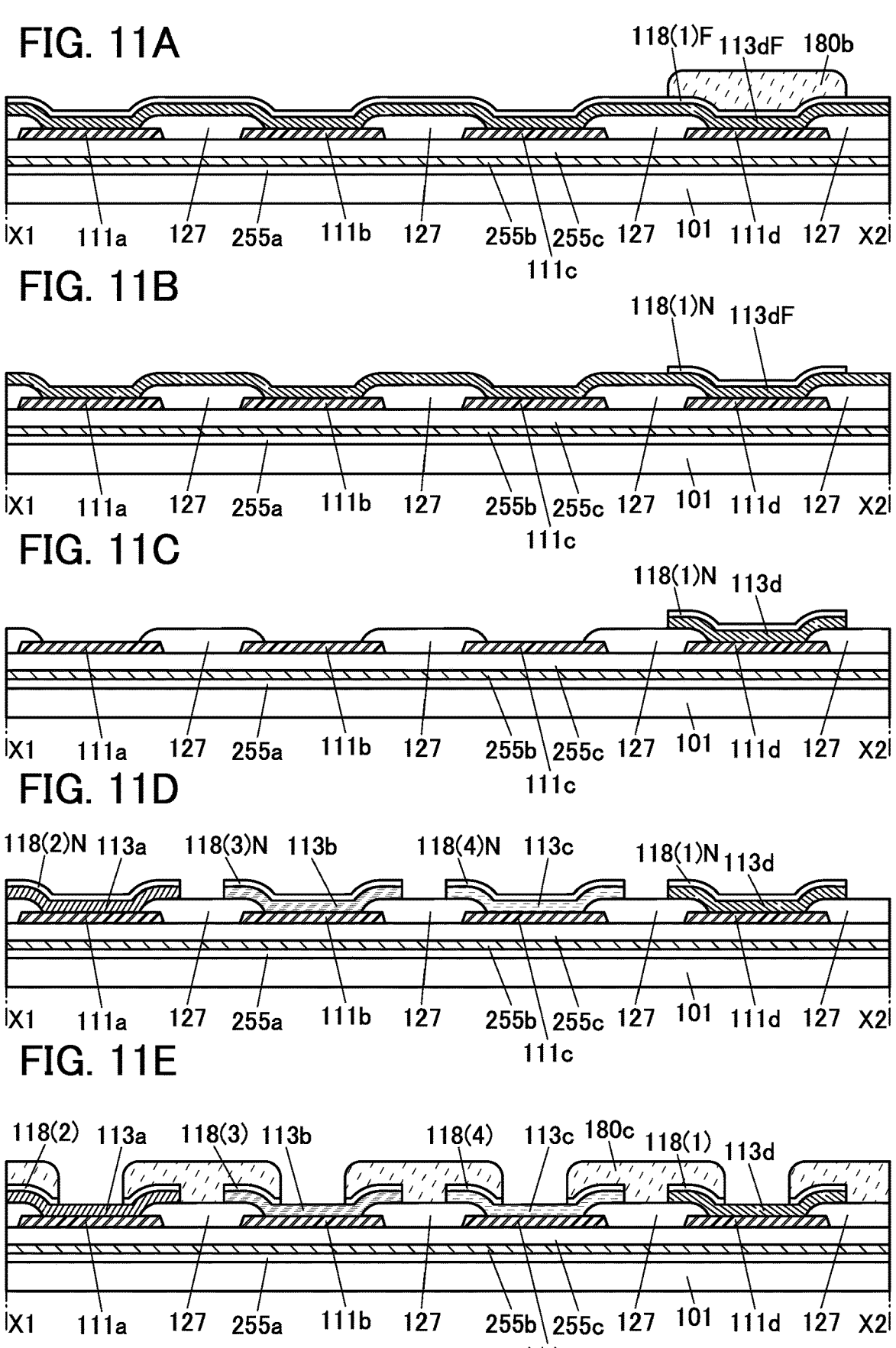
FIGS. 11A to 11E are cross-sectional views illustrating an example of a method for manufacturing a display apparatus.

Next, a film 113dF to be the layer 113d is formed. Then, an insulating film 118(1)F to be the insulating layer 118(1) is formed over the film 113dF. After that, a resist mask 180b is formed over the insulating film 118(1)F (FIG. 11A). The resist mask 180b is provided so as to overlap with at least part of the pixel electrode 111d.

Next, a region not covered with the resist mask 180b of the insulating film 118(1)F is removed by etching, whereby an insulating layer 118(1)N is formed. After that, the resist mask 180b is removed (FIG. 11B).

Next, the insulating layer 118(1)N is used as a hard mask, and a region not covered by the insulating layer 118(1)N in the film 113dF is removed by etching to form the layer 113d (FIG. 11C).

Similarly, an insulating layer 118(2)N is formed over the film to be the layer 113a, and the layer 113a is formed using the layer 118(2)N as a hard mask. Furthermore, an insulating layer 118(3)N is formed over the film to be the layer 113b, and the layer 113b is formed using the insulating layer 118(3)N as a hard mask. In addition, an insulating layer 118(4)N is formed over the film to be the layer 113c, and the layer 113c is formed using the insulating layer 118(4)N as a hard mask (FIG. 11D).

Incidentally, in formation of the layers 113d, 113a, 113b, and 113c, a recessed portion may be formed in the insulating layer 127.

Next, with use of a resist mask 180c, opening portions are provided in the insulating layers 118(1)N, 118(2)N, 118(3)N, and 118(4)N to form the insulating layers 118(1), 118(2), 118(3), and 118(4) (FIG. 11E). The opening portion provided in the insulating layer 118(1)N includes a region overlapping with the pixel electrode 111d. The opening portion provided in the insulating layer 118(2)N includes a region overlapping with the pixel electrode 111*a*. The opening portion provided in the insulating layer 118(3)N includes a region overlapping with the pixel electrode 111*b*.

The opening portion provided in the insulating layer 118(4)N includes a region overlapping with the pixel electrode 111*c*.

Then, the resist mask 180*c* is removed. Then, the common layer 114, the common electrode 115, and the protective layer 131 are formed in this order. After that, the substrate 102 provided with the light-blocking layer 108 is attached by the adhesive layer 107, whereby the display apparatus 100 illustrated in FIG. 8A can be manufactured.

This embodiment can be combined with any of the other embodiments as appropriate.

Embodiment 2

In this embodiment, a display apparatus of one embodiment of the present invention will be described with reference to FIGS. 12A to 12K, FIG. 13, FIGS. 14A and 14B, FIGS. 15A and 15B, FIGS. 16A and 16B, and FIGS. 17A and 17B.

[Pixel Layout]

In this embodiment, pixel layouts different from the pixel layout in FIG. 1A will be mainly described. There is no particular limitation on the arrangement of subpixels, and a variety of arrangements can be employed. Examples of the arrangement of subpixels include stripe layout, S stripe layout, matrix layout, delta layout, Bayer layout, and Pen-Tile layout.

Furthermore, top surfaces of the subpixels may have a triangular shape, a quadrangular shape (including a rectangular shape and a square shape), a polygonal shape such as a pentagonal shape, a polygonal shape with rounded corners, an elliptical shape, or a circular shape, for example. Here, the top surface shape of the subpixel corresponds to the top surface shape of a light-emitting region of the light-emitting device.

The circuit constituting the subpixel is not necessarily placed within the dimensions of the subpixel illustrated in the diagrams and may be placed outside the subpixel.

As illustrated in FIGS. 12A to 12K, the pixel can include four types of subpixels.

Figures 12A, 12B, 12C, 12D, 12E, 12F, 12G, 12H, 12I, 12J, 12K:
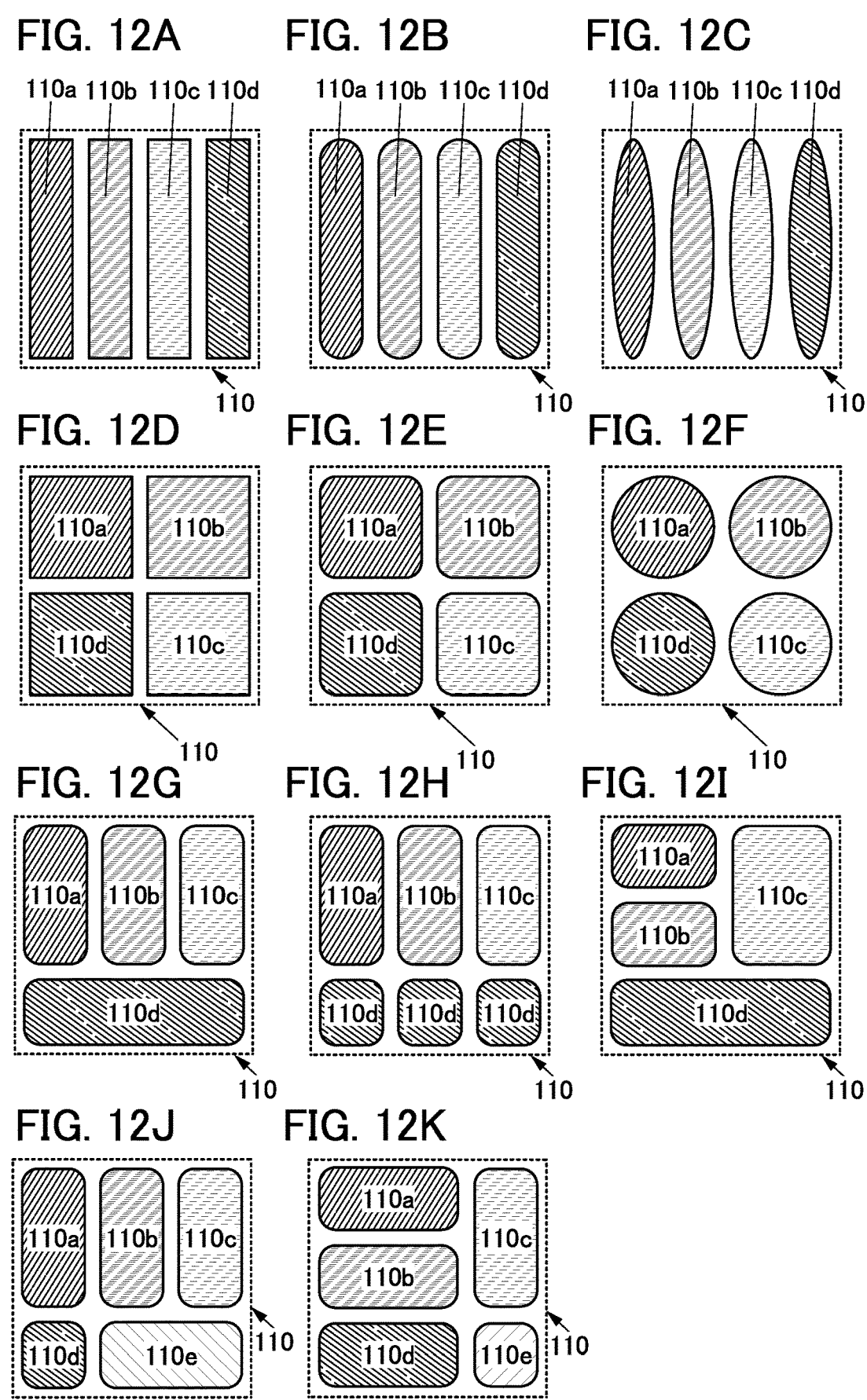
FIGS. 12A to 12K are each top views illustrating an example of a pixel.

The pixel 110 illustrated in FIGS. 12A to 12C employs a stripe layout.

FIG. 12A illustrates an example where each subpixel has a rectangular top surface. FIG. 12B illustrates an example where each subpixel has a top surface shape formed by combining two half circles and a rectangle. FIG. 12C illustrates an example where each subpixel has an elliptical top surface.

The pixel 110 illustrated in FIGS. 12D to 12F employs a matrix layout.

FIG. 12D illustrates an example where each subpixel has a square top surface. FIG. 12E illustrates an example where each subpixel has a substantially square top surface with rounded corners. FIG. 12F illustrates an example where each subpixel has a circular top surface.

FIGS. 12G and 12H each illustrate an example where one pixel 110 is composed of two rows and three columns.

The pixel 110 illustrated in FIG. 12G includes three subpixels (subpixels 110*a*, 110*b*, and 110*c*) in the upper row (first row) and one subpixel (subpixel 110*d*) in the lower row (second row). In other words, the pixel 110 includes the subpixel 110*a* in the left column (first column), the subpixel

110*b* in the center column (second column), the subpixel 110*c* in the right column (third column), and the subpixel 110*d* in these three columns.

The pixel 110 illustrated in FIG. 12H includes three subpixels (subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and another subpixel 110*d* in the center column (second column), and the subpixel 110*c* and the other subpixel 110*d* in the right column (third column). The positions of the subpixels in the upper row are aligned with the positions of the subpixels in the lower row as illustrated in FIG. 12H, whereby dusts and the like that would be produced in the manufacturing process can be removed efficiently. Thus, a display apparatus having high display quality can be provided.

FIG. 12I illustrates an example where one pixel 110 is composed of three rows and two columns.

The pixel 110 illustrated in FIG. 12I includes the subpixel 110*a* in the upper row (first row), the subpixel 110*b* in the center row (second row), the subpixel 110*c* in the first and second rows, and one subpixel (subpixel 110*d*) in the lower row (third row). In other words, the pixel 110 includes the subpixels 110*a* and 110*b* in the left column (first column), the subpixel 110*c* in the right column (second column), and the subpixel 110*d* in these two columns.

The pixel 110 illustrated in FIGS. 12A to 12I includes four types of subpixels 110*a*, 110*b*, 110*c*, and 110*d*. The subpixels 110*a*, 110*b*, 110*c*, and 110*d* each correspond to any of light-emitting devices that emit light of different colors or a light-receiving device that senses light.

In the pixel 110 illustrated in FIGS. 12A to 12I, for example, it is preferable that the subpixel 110*a* be the subpixel emitting red light, the subpixel 110*b* be the subpixel emitting green light, the subpixel 110*c* be the subpixel emitting blue light, and the subpixel 110*d* be the subpixel including a light-receiving device. In the case of such a structure, the pixels 110 in FIGS. 12G and 12H each have a stripe layout of the subpixel emitting red light, the subpixel emitting green light, and the subpixel emitting blue light, and thus the display quality can be improved. The pixel 110 in FIG. 12I has a S-stripe layout of the subpixel emitting red light, the subpixel emitting green light, and the subpixel emitting blue light, and thus the display quality can be improved.

The pixel 110 may include a subpixel including a light-receiving device.

In the pixel 110 illustrated in each of FIGS. 12A to 12I, any one of the subpixels 110*a* to 110*d* may be a subpixel including a light-receiving device.

In a preferred mode of the pixel 110 illustrated in each of FIGS. 12A to 12I, for example, the subpixel 110*a* is the subpixel emitting red light, the subpixel 110*b* is the subpixel emitting green light, the subpixel 110*c* is the subpixel emitting blue light, and the subpixel 110*d* is a subpixel including a light-receiving device. In the case of such a structure, the subpixel emitting red light, the subpixel emitting green light, and the subpixel emitting blue light are arranged in a stripe layout in the pixel 110 in each of FIGS. 12G and 12H, leading to the improvement of the display quality. In addition, the subpixel emitting red light, the subpixel emitting green light, and the subpixel emitting blue light are arranged in an S-stripe layout in the pixel 110 in FIG. 12I, leading to the improvement of the display quality.

There is no particular limitation on the wavelength of light sensed by the subpixel including a light-receiving device. The subpixel can have a structure in which one or both of infrared light and visible light can be sensed.

As illustrated in FIGS. 12J and 12K, the pixel can include five types of subpixels.

FIG. 12J illustrates an example where one pixel 110 is composed of two rows and three columns.

The pixel 110 illustrated in FIG. 12J includes three subpixels (subpixels 110a, 110b, and 110c) in the upper row (first row) and two subpixels (subpixels 110d and 110e) in the lower row (second row). In other words, the pixel 110 includes the subpixels 110a and 110d in the left column (first column), the subpixel 110b in the center column (second column), the subpixel 110c in the right column (third column), and the subpixel 110e in the second and third columns.

FIG. 12K illustrates an example where one pixel 110 is composed of three rows and two columns.

The pixel 110 illustrated in FIG. 12K includes the subpixel 110a in the upper row (first row), the subpixel 110b in the center row (second row), the subpixel 110c in the first and second rows, and two subpixels (subpixels 110d and 110e) in the lower row (third row). In other words, the pixel 110 includes the subpixels 110a, 110b, and 110d in the left column (first column), and the subpixels 110c and 110e in the right column (second column).

In a preferred mode of the pixel 110 illustrated in each of FIGS. 12J and 12K, for example, the subpixel 110a is the subpixel emitting red light, the subpixel 110b is the subpixel emitting green light, and the subpixel 110c is the subpixel emitting blue light. In the case of such a structure, the subpixel emitting red light, the subpixel emitting green light, and the subpixel emitting blue light are arranged in a stripe layout in the pixel 110 in FIG. 12J, leading to the improvement of the display quality. In addition, the subpixel emitting red light, the subpixel emitting green light, and the subpixel emitting blue light are arranged in an S-stripe layout in the pixel 110 in FIG. 12K, leading to the improvement of the display quality.

In a preferred mode of the pixel 110 illustrated in each of FIGS. 12J and 12K, for example, the subpixel including a light-receiving device is used for at least one of the subpixels 110d and 110e. In the case where light-receiving devices are used for both the subpixels 110d and 110e, the light-receiving devices may have different structures. For example, the wavelength ranges of sensed light may be at least partly. Specifically, one of the subpixels 110d and 110e may include a light-receiving device mainly sensing visible light and the other may include a light-receiving device mainly sensing infrared light.

In a preferred mode of the pixel 110 illustrated in each of FIGS. 12J and 12K, for example, the subpixel including a light-receiving device is used as one of the subpixels 110d and 110e and a subpixel including a light-receiving device that can be used as a light source is used as the other. For example, the subpixel 110d can be a subpixel including a light-receiving device that senses infrared light and the subpixel 110e can be a subpixel including a light-emitting device that emits infrared light.

In the structure illustrated in FIG. 13, two pixels 110 (hereinafter referred to as pixels 124a and 124b) with different structures are arranged side by side.

Figure 13:
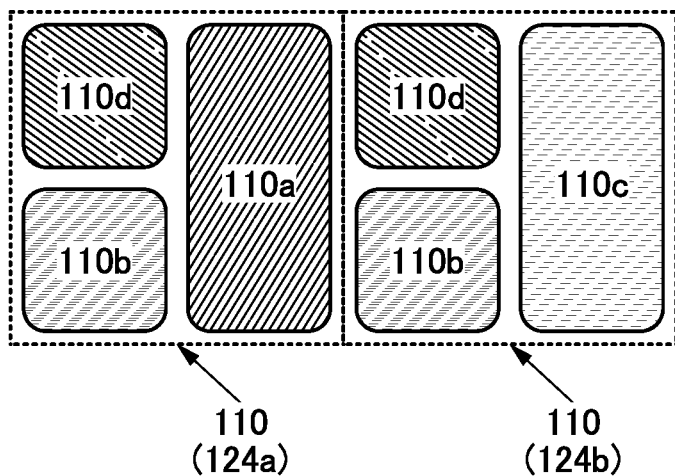
FIG. 13 is a top view illustrating an example of a pixel.

The pixel 124a illustrated in FIG. 13 includes the subpixel 110d arranged in the upper row (first row) and the subpixel 110b arranged in the lower row (second row), and the subpixel 110a arranged in the first and second rows. In other words, the pixel 124a includes the subpixels 110b and 110d in the left column (first column), and the subpixel 110a in the right column (second column).

The pixel 124b illustrated in FIG. 13 includes the subpixel 110d arranged in the upper row (first row), the subpixel 110b arranged in the lower row (second row), and the subpixel 110c arranged in the first and second rows. In other words, the pixel 124b includes the subpixels 110b and 110d in the left column (first column), and the subpixel 110c in the right column (second column).

In the structure illustrated in FIG. 13, one subpixel 110a and one subpixel 110c are arranged in two pixels and the area of each of the subpixels 110a and 110c is larger than the area of the subpixel 110b. This structure can increase the resolutions of the subpixels 110b and 110d, and increase the areas of the subpixels 110a and 110c, whereby luminance can be increased with lower power consumption; therefore, a display apparatus with high resolution, low power consumption, and high reliability can be provided.

Note that the light-receiving area of the subpixel 110d may be smaller than those of the other subpixels. A smaller light-receiving area leads to a narrower image-capturing range, inhibits a blur in a captured image, and improves the resolution. Thus, by using the subpixel 110d, high-resolution or high-definition image capturing is possible. For example, image capturing for personal authentication with the use of a fingerprint, a palm print, the iris, the shape of a blood vessel (including the shape of a vein and the shape of an artery), a face, or the like can be performed by using the subpixel 110d.

Moreover, the subpixel 110d can be used in a touch sensor (also referred to as a direct touch sensor), a hover touch sensor (also referred to as a hover sensor, a contactless sensor, or a touchless sensor), or the like. For example, the subpixel 110d preferably senses infrared light. Thus, touch sensing is possible even in a dark place.

Here, the touch sensor or the hover touch sensor can sense an approach or contact of an object (e.g., a finger, a hand, or a pen). The touch sensor can sense the object when the display apparatus and the object come in direct contact with each other. Furthermore, the hover touch sensor can sense the object even when the object is not in contact with the display apparatus. For example, the display apparatus is preferably capable of sensing an object positioned in the range of 0.1 mm to 300 mm inclusive, more preferably 3 mm to 50 mm inclusive from the display apparatus. This structure enables the display apparatus to be operated without direct contact of an object. In other words, the display apparatus can be operated in a contactless (touchless) manner. This structure can reduce the risk of the display apparatus' being dirty or damaged or enables the object to operate the display apparatus without directly touching a dirt (e.g., dust, bacteria, or a virus) attached to the display apparatus.

For high-resolution image capturing, the subpixel 110d is preferably provided in every pixel included in the display apparatus. Meanwhile, in the case where the subpixel 110d is used in a touch sensor, a hover touch sensor, or the like, high accuracy is not required as compared to the case of capturing an image of a fingerprint or the like; accordingly, the subpixel PS is provided in some subpixels in the display apparatus. When the number of subpixels 110d included in the display apparatus is smaller than the number of subpixels 110a or the like, higher sensing speed can be achieved.

Moreover, in a photolithography process, as a pattern for processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel may have a polygonal shape with rounded corners, an elliptical shape, a circular shape, or the like.

To obtain a desired top surface shape, a technique of correcting a mask pattern in advance so that a transferred pattern can agree with a design pattern (an optical proximity correction (OPC) technique) may be used. Specifically, with the OPC technique, a pattern for correction is added to a corner portion or the like of a figure on a mask pattern.

As described above, the pixel composed of the subpixels each including the light-emitting device can employ a variety of layouts in the display apparatus of one embodiment of the present invention. The display apparatus of one embodiment of the present invention can have a structure in which the pixel includes both a light-emitting device and a light-receiving device. Also in this case, a variety of layouts can be employed.

Figure 14A:
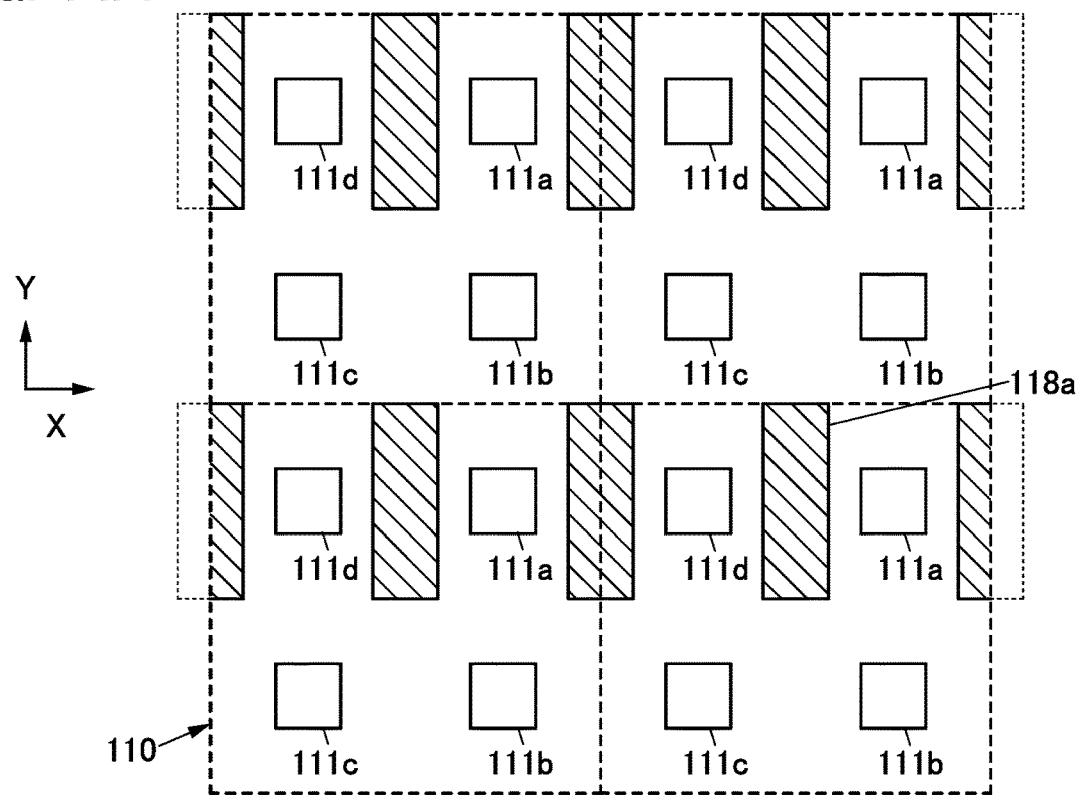
FIGS. 14A and 14B are top views illustrating examples of a display apparatus.
Figure 14B:
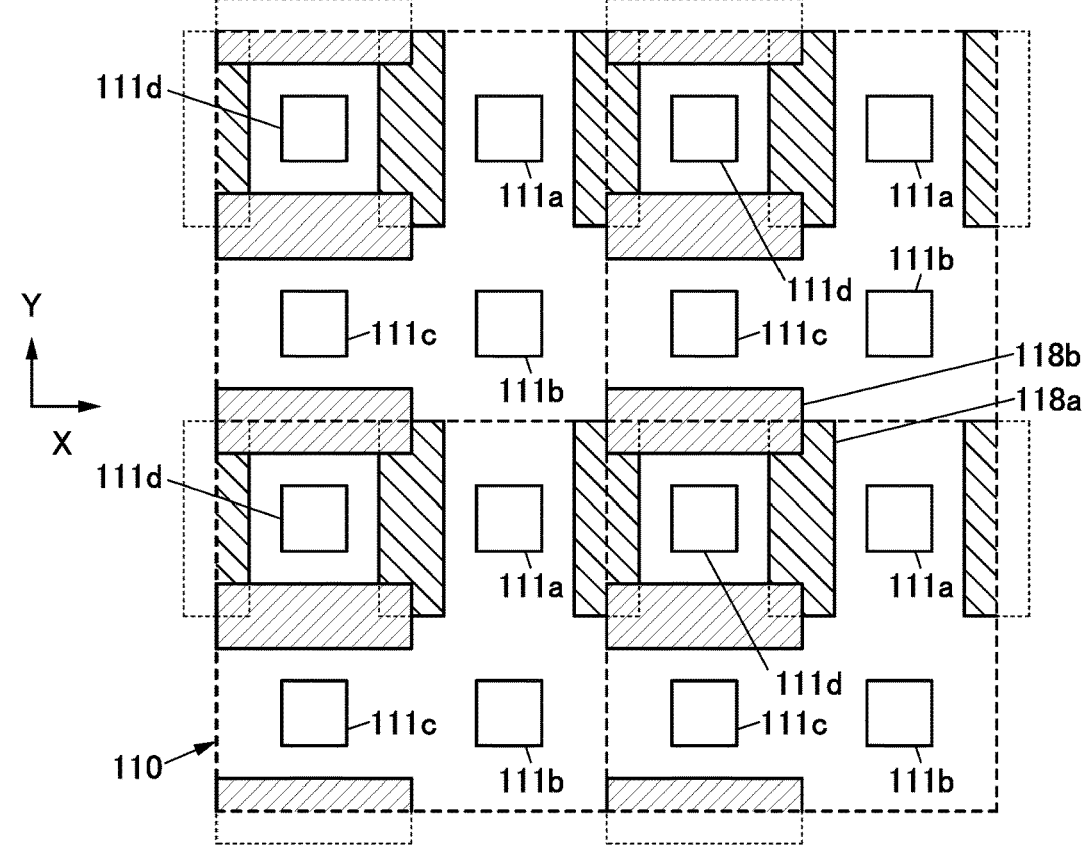

FIGS. 14A and 14B are top views each illustrating the arrangements of the pixel electrodes 111a, 111b, 111c, and 111d and the insulating layers 118a and 118b included in the subpixels 110a, 110b, 110c, and 110d.

The insulating layers 118a and 118b have a region partly overlapping with each other. In FIG. 14A, the insulating layer 118a is illustrated without illustration of the insulating layer 118b so that the region of the insulating layer 118a can be seen easily. FIG. 14B illustrates both the insulating layers 118a and 118b.

The pixels 110 are arranged in the X direction and the Y direction in a matrix. The pixel electrodes 111d and the pixel electrode 111a are alternately arranged in the X direction, and the pixel electrode 111d and the pixel electrode 111c are alternately arranged in the Y direction. The pixel electrode 111b and the pixel electrode 111c are alternately arranged in the X direction, and the pixel electrode 111b and the pixel electrode 111a are alternately arranged in the Y direction.

The pixel electrodes 111a, 111b, 111c, and 111d are each substantially square, and two opposite sides of the four sides of the square are substantially parallel to one of the X axis and the Y axis and the other two sides thereof are substantially parallel to the other of the X axis and the Y axis.

In FIG. 14B, the insulating layer 118a is positioned between the pixel electrode 111d and the pixel electrode 111a. The insulating layer 118b is positioned between the pixel electrode 111d and the pixel electrode 111c. The pixel electrode 111d is surrounded by the insulating layers 118a and 118b.

Figure 15A:
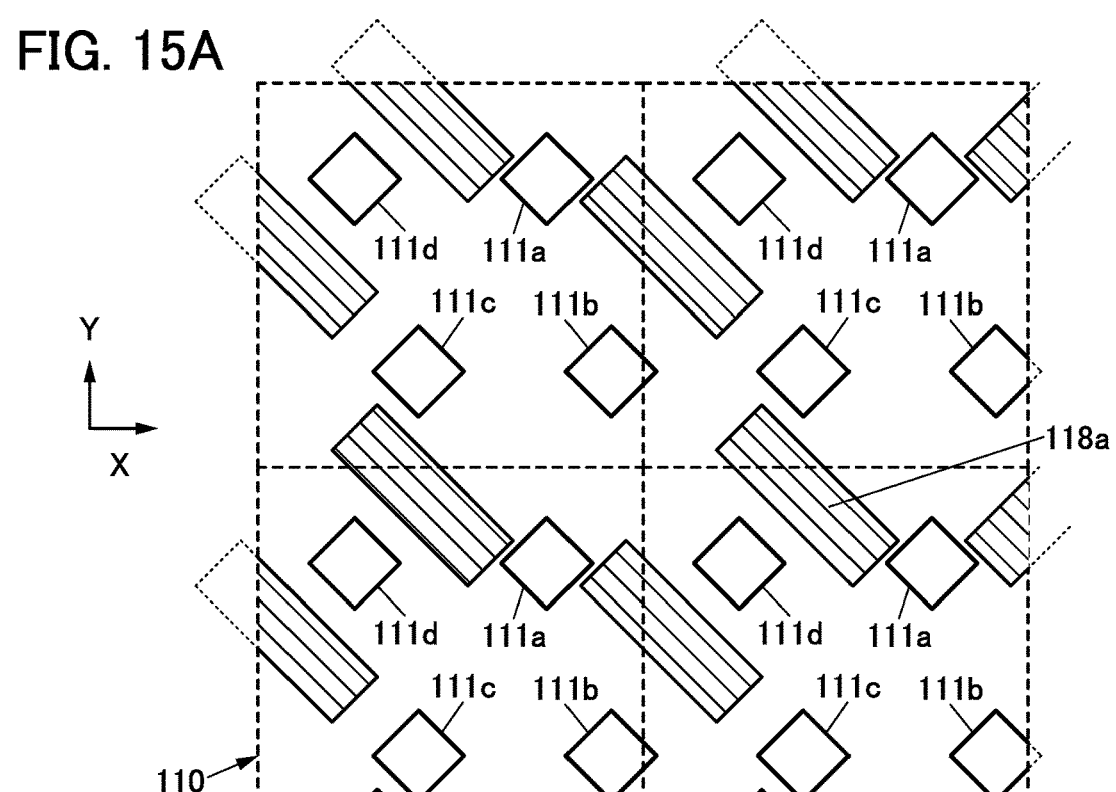
FIGS. 15A and 15B are top views illustrating examples of a display apparatus.
Figure 15B:
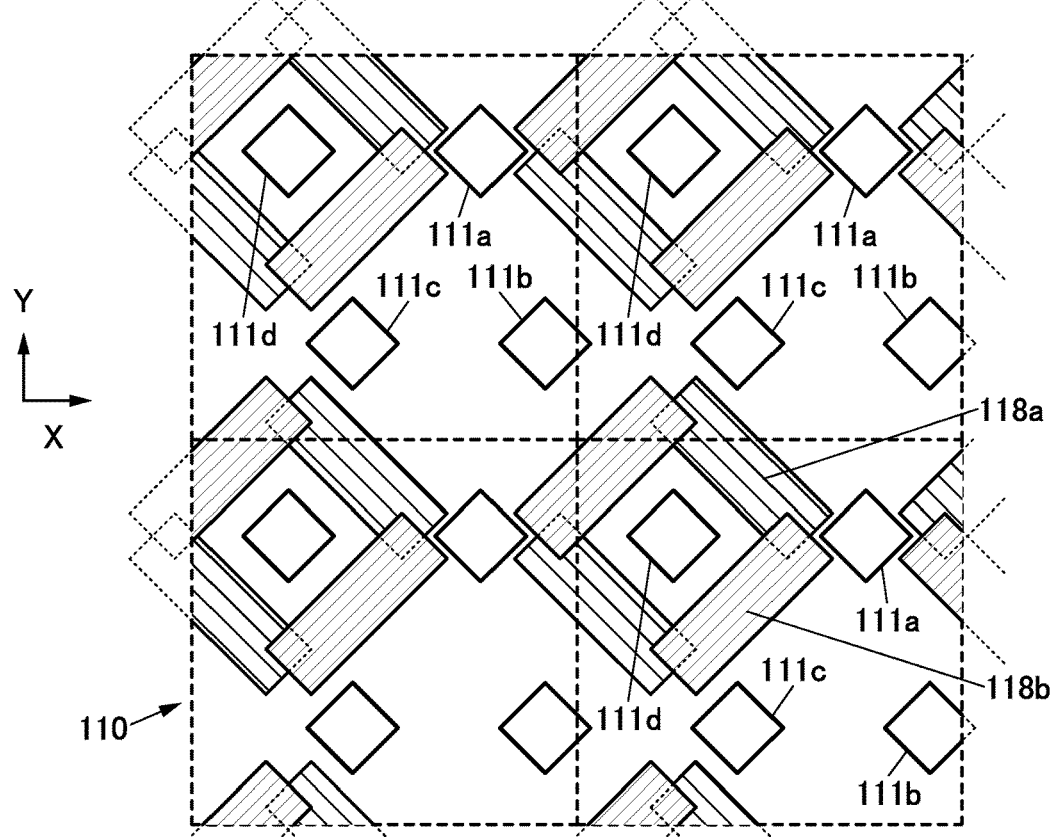

FIGS. 15A and 15B are top views illustrating the arrangements of the pixel electrodes 111a, 111b, 111c, and 111d and the insulating layers 118a and 118b included in the subpixels 110a, 110b, 110c, and 110d, which are different from the structures in FIGS. 14A and 14B. In FIG. 15A, the insulating layer 118a is illustrated without illustration of the insulating layer 118b, whereas in FIG. 15B, both the insulating layers 118a and 118b are illustrated.

In FIGS. 15A and 15B, the pixel electrodes 111a, 111b, 111c, and 111d are each substantially square, and the angles between two opposite sides of the four sides of the square and the X axis or the angles between the other two sides of the four sides of the square and the Y axis are approximately 45°. The pixel electrode 111d and the pixel electrode 111a are alternately arranged in the X direction, the pixel electrode 111c and the pixel electrode 111b are alternately arranged in the X direction. Rows in which the pixel electrode 111d and the pixel electrode 111a are alternately arranged in the X direction and rows in which the pixel electrode 111c and the pixel electrode 111b are alternately arranged in the X direction are alternately arranged in the Y direction. The pixel electrode 111c is arranged such that the X coordinate of the pixel electrode 111c is larger than that of the pixel electrode 111d as the reference. That is, the pixel electrodes 111d and 111c are arranged obliquely to the Y axis.

In FIG. 15B, the pixel electrode 111d is surrounded by the insulating layers 118a and 118b. The insulating layers 118a and 118b are provided between the pixel electrodes 111a, 111b, and 111c that are located around the pixel electrode 111d and in the same pixel as the pixel electrode 111d and the pixel electrodes 111a, 111b, and 111c in the adjacent pixel.

Two opposite sides of the four sides of the pixel electrode 111d in FIG. 15B makes an angle of about 45° with the X axis or the Y axis. The insulating layers 118a and 118b are provided along a side of the pixel electrode 111d. The insulating layer 118a in FIG. 15B can be expressed as that the insulating layer 118a includes two rectangular shapes that are provided along two opposite sides of the four sides of the pixel electrode 111d, while the insulating layer 118b can be expressed as that the insulating layer 118b includes two rectangular shapes that are provided along the other two opposite sides of the four sides of the pixel electrode 111d.

Figure 16A:
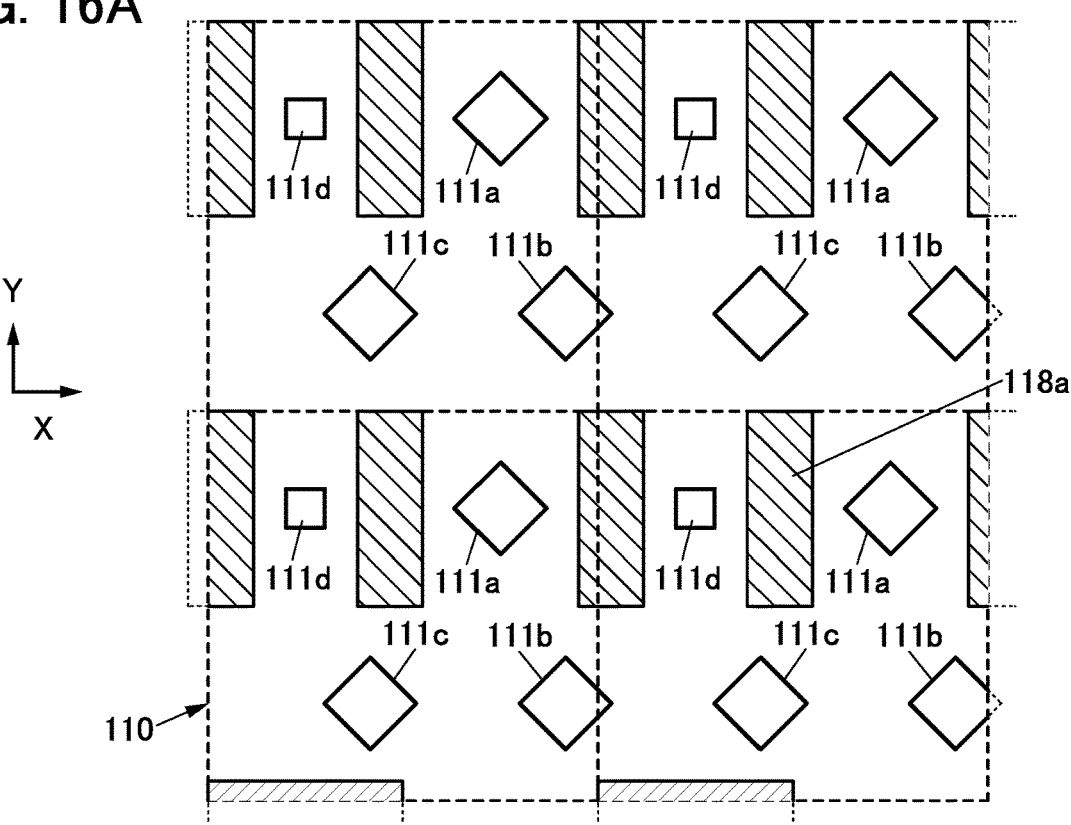
FIGS. 16A and 16B are top views illustrating examples of a display apparatus.
Figure 16B:
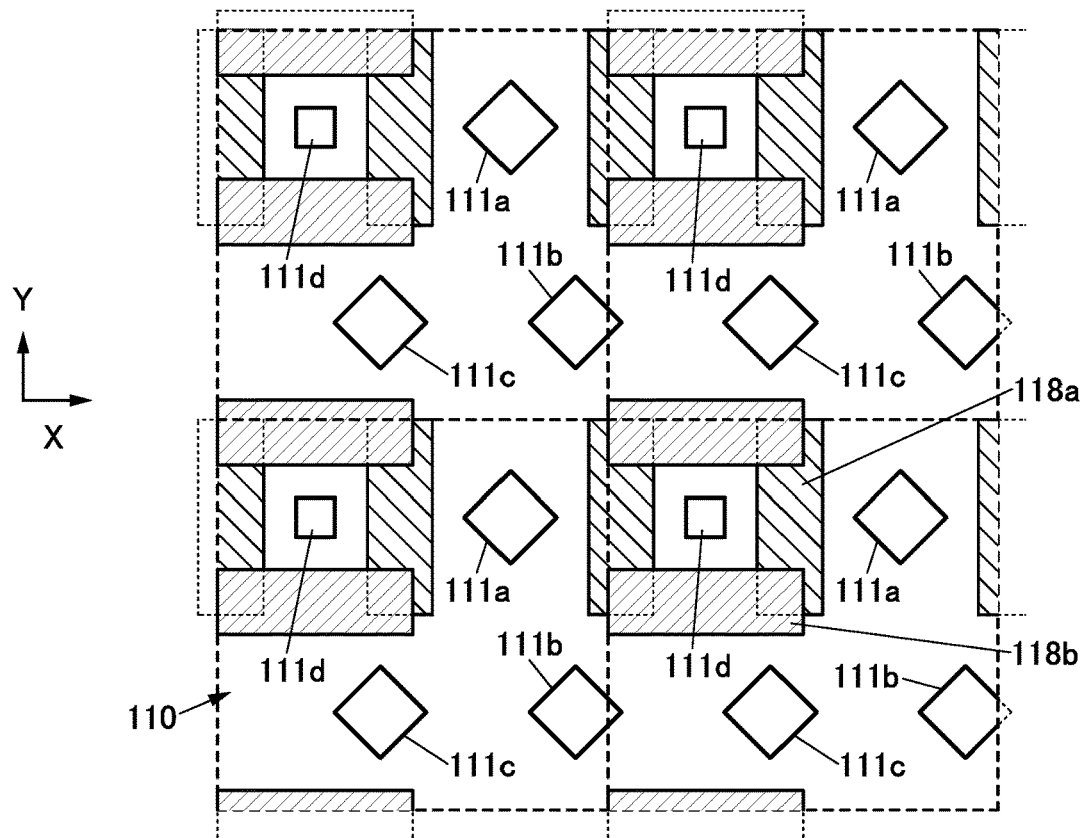

FIGS. 16A and 16B are top views illustrating the arrangements of the pixel electrodes 111a, 111b, 111c, and 111d and the insulating layers 118a and 118b included in the subpixels 110a, 110b, 110c, and 110d, which are different from the structures in FIGS. 14A and 14B. In FIG. 16A, the insulating layer 118a is illustrated without illustration of the insulating layer 118b, whereas in FIG. 16B, both the insulating layers 118a and 118b are illustrated.

FIGS. 16A and 16B have the positions of the pixel electrodes 111a, 111b, 111c, and 111d that are similar to those in FIGS. 15A and 15B, whereas the area and the direction of the pixel electrode 111d in FIGS. 16A and 16B are different from those in FIGS. 15A and 15B. In FIGS. 16A and 16B, the area of the pixel electrode 111d is small and two opposite sides of the four sides of the pixel electrode 111d are substantially parallel to the X axis or the Y axis.

In FIG. 16B, the insulating layer 118a is positioned between the pixel electrode 111d and the pixel electrode 111a. The insulating layer 118b is positioned between the pixel electrode 111d and the pixel electrode 111c. The pixel electrode 111d is surrounded by the insulating layers 118a and 118b.

The insulating layer 118a in FIG. 16B can be expressed as that the insulating layer 118a includes two rectangular shapes that are provided along two opposite sides of the four sides of the pixel electrode 111d, while the insulating layer 118b can be expressed as that the insulating layer 118b includes two rectangular shapes that are provided along the other two opposite sides of the four sides of the pixel electrode 111d.

Figure 17A:
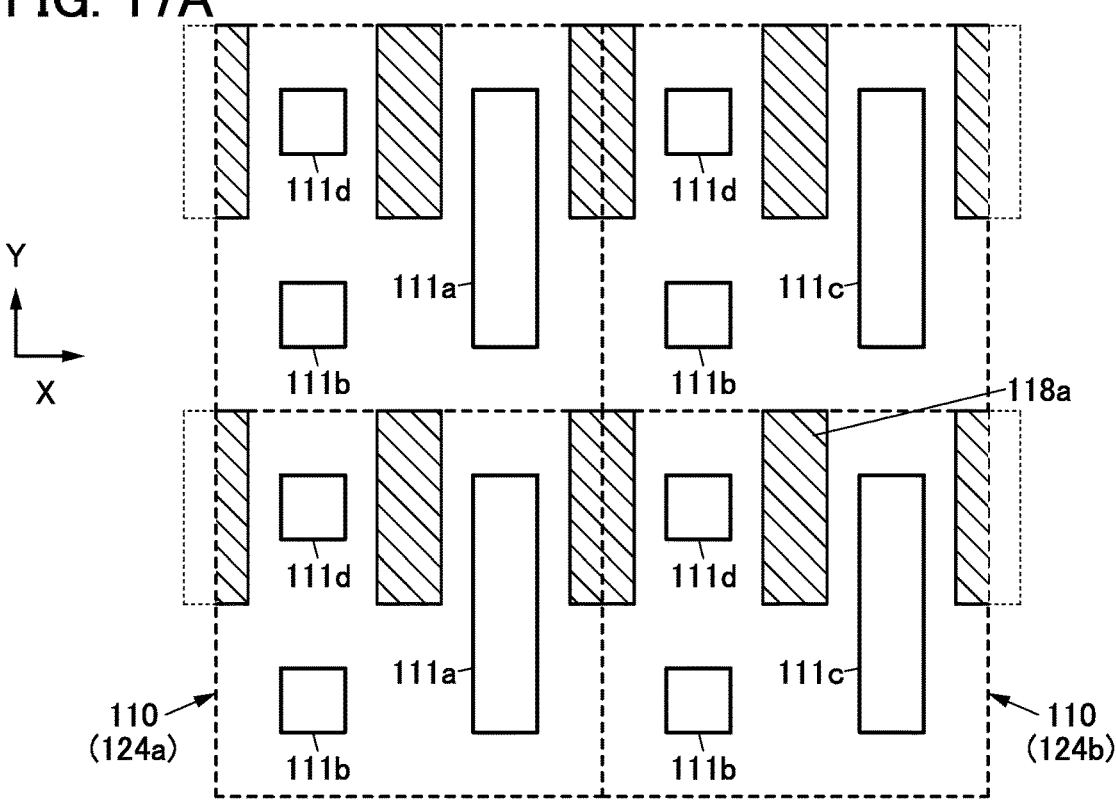
FIGS. 17A and 17B are top views illustrating examples of a display apparatus.
Figure 17B:
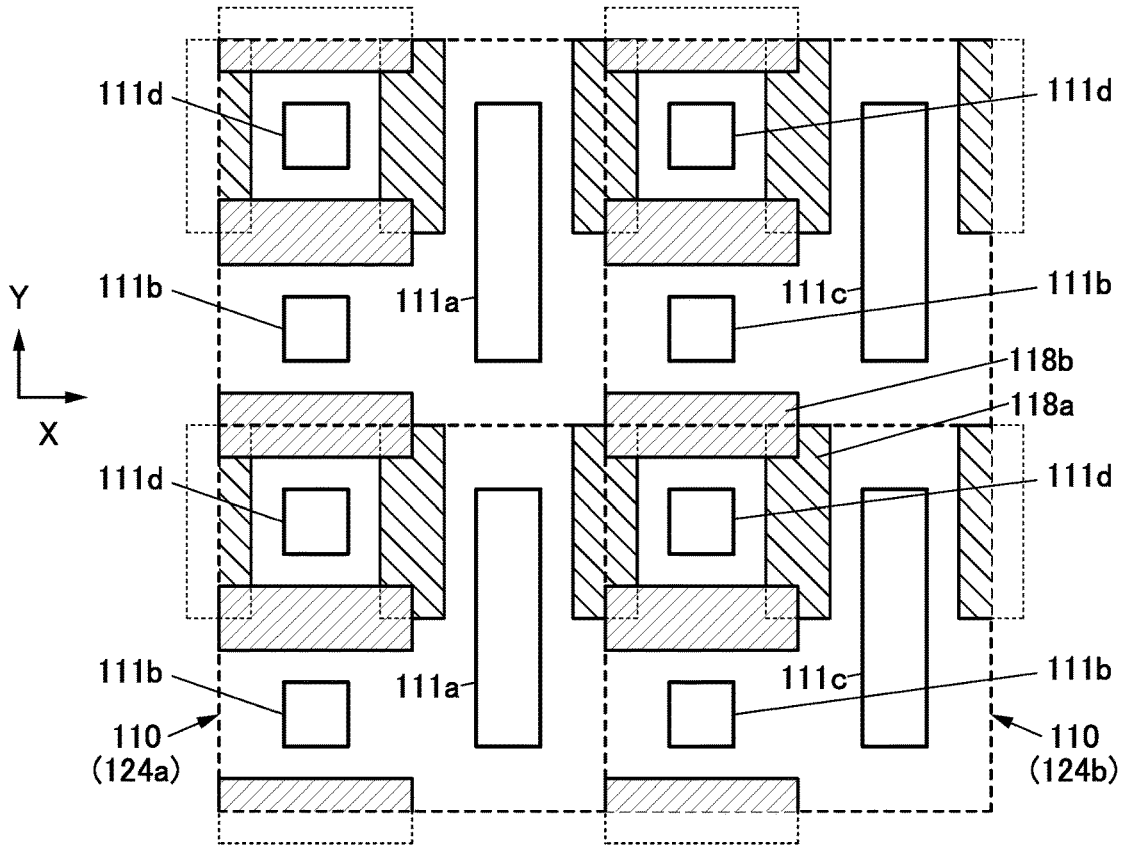

FIGS. 17A and 17B illustrate a structure in which the pixel 110 (pixel 124a and pixel 124b) illustrated in FIG. 13 is used. FIG. 13 is a top view illustrating the arrangements of the pixel electrodes 111a, 111b, and 111d of the subpixels 110a, 110b, and 110d in the pixel 124a, the pixel electrodes 111b, 111c, and 111d of the subpixels 110b, 110c, and 110d in the pixel 124b, and the insulating layers 118a and 118b. In FIG. 17A, the insulating layer 118a is illustrated without illustration of the insulating layer 118b, whereas in FIG. 17B, both the insulating layers 118a and 118b are illustrated.

The pixel electrode 111d is substantially square, and two sides of the four sides of the pixel electrode 111d are substantially parallel to one of the X axis and the Y axis and the other two sides thereof are substantially parallel to the other of the X axis and the Y axis. The pixel electrode 111d is surrounded by the insulating layers 118a and 118b.

In each of the pixels 124a and 124b in FIG. 17B, the insulating layer 118b is positioned between the pixel electrode 111d and the pixel electrode 111b. In the pixel 124a, the insulating layer 118a is positioned between the pixel electrode 111d and the pixel electrode 111a, and in the pixel 124b, the insulating layer 118a is positioned between the pixel electrode 111d and the pixel electrode 111c.

The insulating layer 118a in FIG. 17B can be expressed as that the insulating layer 118a includes two rectangular shapes that are provided along two opposite sides of the four sides of the pixel electrode 111d, while the insulating layer 118b can be expressed as that the insulating layer 118b includes two rectangular shapes that are provided along the other two opposite sides of the four sides of the pixel electrode 111d.

This embodiment can be combined with any of the other embodiments as appropriate.

Embodiment 3

In this embodiment, a display apparatus of one embodiment of the present invention will be described with reference to FIG. 18, FIG. 19, and FIGS. 20A and 20B.

The display apparatus in this embodiment can be a high-definition display apparatus or large-sized display apparatus. Accordingly, the display apparatus in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Apparatus 100G]

Figure 18:
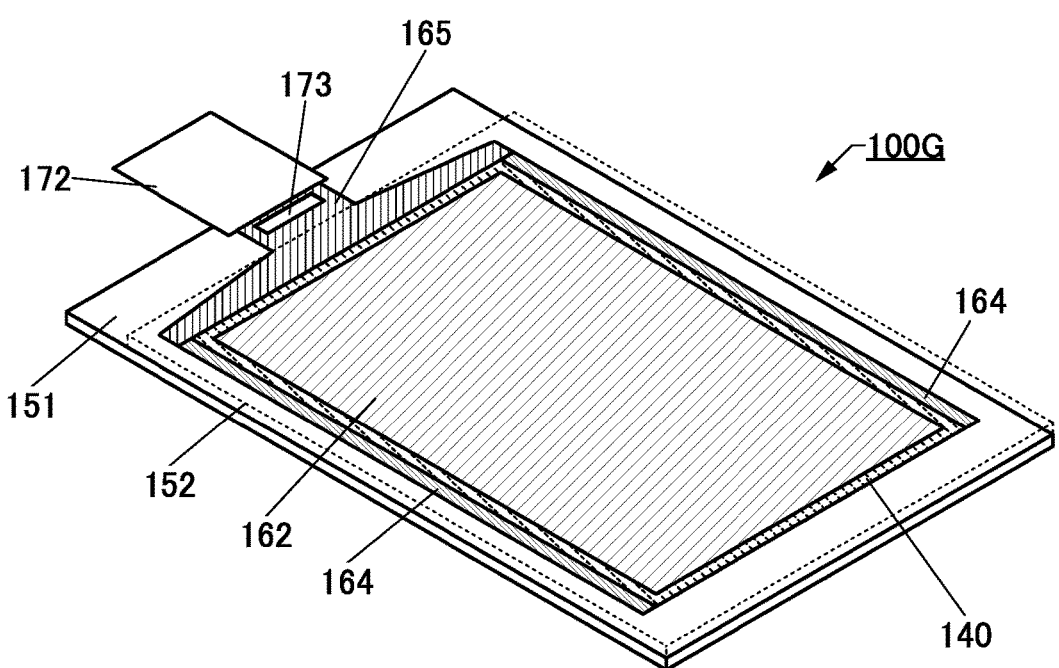
FIG. 18 is a perspective view illustrating an example of a display apparatus.
Figure 19:
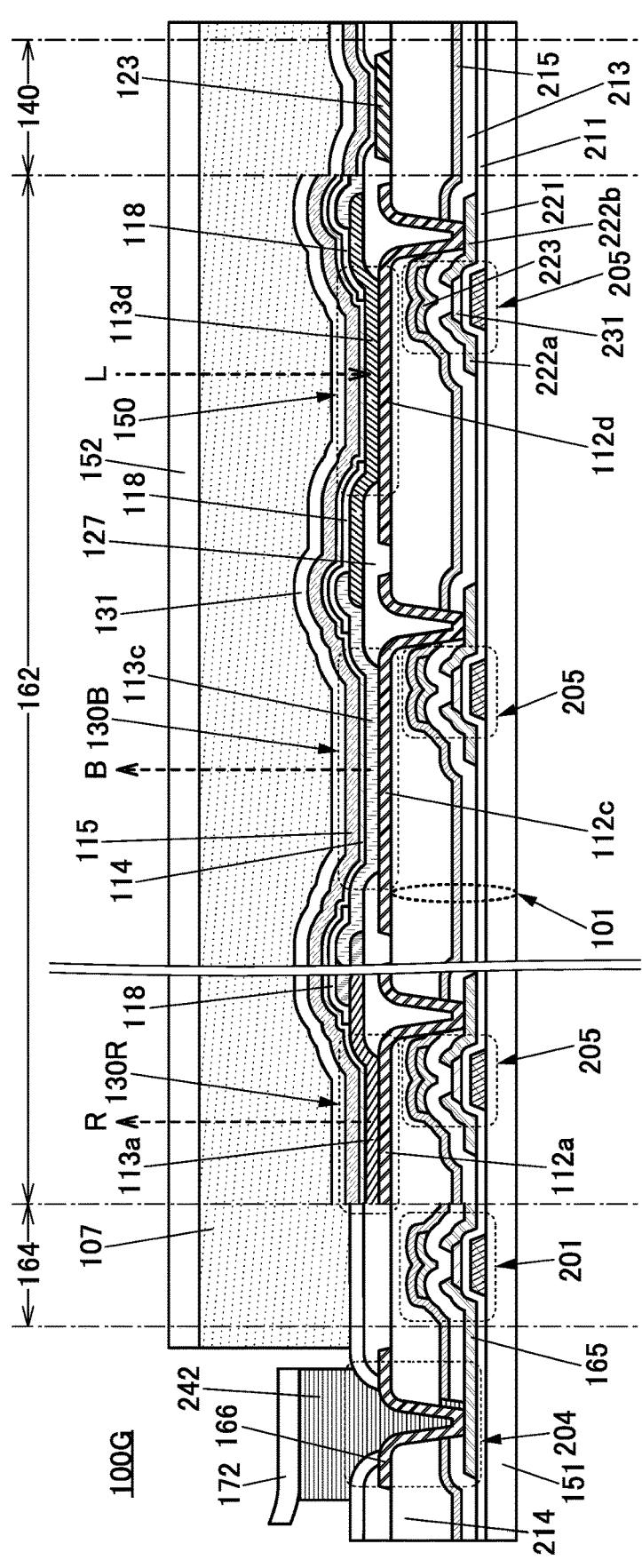
FIG. 19 is a cross-sectional view illustrating an example of a display apparatus.

FIG. 18 is a perspective view of a display apparatus 100G, and FIG. 19 is a cross-sectional view of the display apparatus 100G.

In the display apparatus 100G, a substrate 152 and a substrate 151 are bonded to each other. In FIG. 18, the substrate 152 is denoted by a dashed line.

The display apparatus 100G includes a display portion 162, the connection portion 140, circuits 164, a wiring 165, and the like. FIG. 18 illustrates an example in which an integrated circuit (IC) 173 and a flexible printed circuit (FPC) 172 are mounted on the display apparatus 100G. Thus, the structure illustrated in FIG. 18 can be regarded as a display module including the display apparatus 100G, the IC, and the FPC.

The connection portion 140 is provided outside the display portion 162. The connection portion 140 can be provided along one or more sides of the display portion 162.

The number of connection portions 140 may be one or more. FIG. 18 illustrates an example in which the connection portion 140 is provided to surround the four sides of the display portion. The common electrode of the light-emitting device is electrically connected to a conductive layer in the connection portion 140, and thus a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or from the IC 173.

FIG. 18 illustrates an example in which the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display apparatus 100G and the display module are not necessarily provided with an IC. The IC may be mounted on the FPC by a COF method or the like.

FIG. 19 illustrates an example of cross sections of part of a region including the FPC 172, part of the circuit 164, part of the display portion 162, part of the connection portion 140, and part of a region including an end portion in the display apparatus 100G.

The display apparatus 100G illustrated in FIG. 19 includes a transistor 201, transistors 205, the light-emitting device 130R that emits red light, the light-emitting device 130B that emits blue light, and the light-receiving device 150 that senses light L the like between the substrate 151 and the substrate 152. Note that although not illustrated, the light-emitting device emitting green light is also provided in the display apparatus 100G as in the above embodiment.

Other than a difference in the structure of the pixel electrode, the light-emitting devices 130R and 130B, and the light-receiving device 150 each have the stacked structure illustrated in FIG. 1B. Embodiment 1 can be referred to for the details of the light-emitting devices and the light-receiving device. For example, the light-emitting device 130R, the light-emitting device 130B, and the light-receiving device 150 correspond to the light-emitting device 130a, the light-emitting device 130c, and the light-receiving device 150, respectively, in FIG. 1B. Although not illustrated, the light-emitting device emitting green light corresponds to the light-emitting device 130b illustrated in FIG. 1B.

The light-emitting device 130R includes a conductive layer 112a. The conductive layer 112a can be referred to as a pixel electrode.

The conductive layer 112a can be formed by stacking two or more layers. In such a case, for example, all of the layers included in the conductive layer 112a can be referred to as a pixel electrode, and part of the layers included in the conductive layer 112a can also be referred to as a pixel electrode.

The light-emitting device 130B includes a conductive layer 112c. Although not illustrated, the light-emitting device emitting green light has a similar structure.

The light-receiving device 150 includes a conductive layer 112d.

The conductive layer 112a is connected to a conductive layer 222b included in the transistor 205 through an opening provided in the insulating layer 214.

The conductive layer 112a can have a stacked-layer structure of two layers, for example. In such a case, for example, a conductive layer functioning as a reflective electrode can be used as the lower layer and a conductive layer functioning as a transparent electrode can be used as the upper layer.

Since the conductive layer 112c of the light-emitting device 130B and the conductive layer 112d of the light-receiving device 150 are similar to the conductive layer 112a of the light-emitting device 130R, detailed description of those layers is omitted.

An end portion of the conductive layer 112a is covered with the insulating layer 127, and the layer 113a is provided over the conductive layer 112a and the insulating layer 127. Similarly, an end portion of the conductive layer 112c is covered with the insulating layer 127, and the layer 113c is provided over the conductive layer 112c and the insulating layer 127. Similarly, an end portion of the conductive layer 112d is covered with the insulating layer 127, and the layer 113d is provided over the conductive layer 112d and the insulating layer 127.

The common layer 114 is provided over the layers 113a, 113c, and 113d, and the common electrode 115 is provided over the common layer 114. The common layer 114 and the common electrode 115 are each one continuous film shared by the plurality of light-emitting devices and the light-receiving device.

The protective layer 131 is provided over the light-emitting devices 130R, 130G, and 130B. Providing the protective layer 131 that covers the light-emitting devices can inhibit entry of impurities such as water into the light-emitting devices, thereby increasing the reliability of the light-emitting devices.

The protective layer 131 and the substrate 152 are bonded to each other by an adhesive layer 107. A solid sealing structure, a hollow sealing structure, or the like can be employed for sealing of the light-emitting devices. In FIG. 19, a solid sealing structure is employed, in which a space between the substrate 152 and the substrate 151 is filled with the adhesive layer 107. Alternatively, a hollow sealing structure may be employed, in which the space is filled with an inert gas (e.g., nitrogen or argon). In this case, the adhesive layer 107 may be provided not to overlap with the light-emitting devices. Alternatively, the space may be filled with a resin other than the adhesive layer 107.

The conductive layer 123 is provided over the insulating layer 214 in the connection portion 140. The conductive layer 123 can be obtained by processing the conductive film used for the conductive layers 112a, 112c, and 112d. An end portion of the conductive layer 123 is covered with the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are directly in contact with each other and electrically connected to each other.

The display apparatus 100G has a top-emission structure. Light emitted from the light-emitting devices is emitted toward the substrate 152. For the substrate 152, a material having a high visible-light-transmitting property is preferably used. The pixel electrode contains a material that reflects visible light, and the counter electrode (the common electrode 115) contains a material that transmits visible light.

A stacked-layer structure that includes from the substrate 151 to the insulating layer 214 corresponds to the substrate 101 in Embodiment 1, and the substrate 101 includes a layer including transistors.

The transistor 201 and the transistor 205 are both formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The outermost layer of the insulating layer 214 preferably functions as an etching protective layer. Thus, the formation of a depression portion in the insulating layer 214 can be inhibited in processing the conductive layer 112a, or the like. Alternatively, a depression portion may be formed in the insulating layer 214 in processing the conductive layer 112a, or the like.

Each of the transistors 201 and 205 includes a conductive layer 221 functioning as a gate, the insulating layer 211 functioning as a gate insulating layer, a conductive layer 222a and a conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable that a semiconductor having crystallinity be used, in which case deterioration of the transistor characteristics can be suppressed.

A semiconductor layer of a transistor preferably includes a metal oxide (also referred to as an oxide semiconductor). That is, a transistor including a metal oxide in its channel formation region (hereinafter, also referred to as an OS transistor) is preferably used in the display apparatus of this embodiment.

As the oxide semiconductor having crystallinity, a c-axis aligned crystalline oxide semiconductor (CAAC-OS), a nanocrystalline oxide semiconductor (nc-OS), and the like are given.

Alternatively, a transistor using silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and excellent frequency characteristics.

With the use of Si transistors such as LTPS transistors, a circuit required to be driven at a high frequency (e.g., a source driver circuit) can be formed on the same substrate as the display portion. This allows simplification of an external circuit mounted on the display apparatus and reductions in costs of components and component-mounting costs.

The OS transistor has much higher field-effect mobility than a transistor containing amorphous silicon. In addition, the OS transistor has an extremely low leakage current between a source and a drain in an off state (hereinafter also referred to as off-state current), and charge accumulated in a capacitor that is connected in series to the transistor can be held for a long period. Furthermore, the power consumption of the display apparatus can be reduced with the OS transistor.

The off-state current per micrometer of channel width of the OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current per micrometer of channel width of a Si transistor at room temperature is higher than or equal to 1 fA ($1 \times 10^{-15}$ A) and lower than or equal to 1 pA ($1 \times 10^{-12}$ A). In other words, the off-state current of an OS transistor is lower than that of a Si transistor by approximately ten orders of magnitude.

To increase the luminance of the light-emitting device included in the pixel circuit, the amount of current fed through the light-emitting device needs to be increased. To increase the current amount, the source—drain voltage of a driving transistor included in the pixel circuit needs to be increased. Since the OS transistor has a higher breakdown voltage between the source and the drain than a Si transistor, a high voltage can be applied between the source and the drain of the OS transistor. Thus, with use of an OS transistor as a driving transistor included in the pixel circuit, the amount of current flowing through the light-emitting device can be increased, resulting in an increase in emission luminance of the light-emitting device.

When transistors operate in a saturation region, a change in source—drain current relative to a change in gate—source voltage can be smaller in an OS transistor than in a Si transistor. Accordingly, when an OS transistor is used as the driving transistor in the pixel circuit, the amount of current flowing between the source and the drain can be set minutely by a change in gate—source voltage; hence, the amount of current flowing through the light-emitting device can be controlled. Consequently, the number of gray levels expressed by the pixel circuit can be increased.

Regarding saturation characteristics of current flowing when transistors operate in a saturation region, even in the case where the source—drain voltage of an OS transistor increases gradually, a more stable constant current (saturation current) can be fed through the OS transistor than through a Si transistor. Thus, by using an OS transistor as the driving transistor, a stable current can be fed through light-emitting devices even when the current—voltage characteristics of the light-emitting devices vary, for example. In other words, when the OS transistor operates in the saturation region, the source—drain current hardly changes with an increase in the source—drain voltage; hence, the luminance of the light-emitting device can be stable.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Further alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 1:3:2, 1:3:4, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, when the atomic ratio is described as In:Ga:Zn=4:2:3 or a composition in the vicinity thereof, the case is included where the atomic ratio of Ga is greater than or equal to 1 and less than or equal to 3 and the atomic ratio of Zn is greater than or equal to 2 and less than or equal to 4 with the atomic ratio of In being 4. In addition, when the atomic ratio is described as In:Ga:Zn=5:1:6 or a composition in the vicinity thereof, the case is included where the atomic ratio of Ga is greater than 0.1 and less than or equal to 2 and the atomic ratio of Zn is greater than or equal to 5 and less than or equal to 7 with the atomic ratio of In being 5. Furthermore, when the atomic ratio is described as In:Ga:Zn=1:1:1 or a composition in the vicinity thereof, the case is included where the atomic ratio of Ga is greater than 0.1 and less than or equal to 2 and the atomic ratio of Zn is greater than 0.1 and less than or equal to 2 with the atomic ratio of In being 1.

The transistors included in the circuit 164 and the transistors included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

All of the transistors included in the display portion 162 may be OS transistors or Si transistors. Alternatively, some of the transistors included in the display portion 162 may be OS transistors and the others may be Si transistors.

For example, when both an LTPS transistor and an OS transistor are used in the display portion 162, the display apparatus can have low power consumption and high drive capability. Note that a structure in which an LTPS transistor and an OS transistor are used in combination is referred to as LTPO in some cases. As a favorable example, it is preferable that the OS transistor be used as a transistor functioning as a switch for controlling conduction or non-conduction between wirings and the LTPS transistor be used as a transistor for controlling current.

For example, one transistor included in the display portion 162 may function as a transistor for controlling current flowing through the light-emitting device and be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

By contrast, another transistor included in the display portion 162 may function as a switch for controlling selection or non-selection of a pixel and be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

The structure of the OS transistor is not limited to the structure illustrated in FIG. 19. For example, the structures illustrated in FIGS. 20A and 20B may be employed.

Transistors 209 and 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned at least between the conductive layer 223 and the channel formation region 231i. Furthermore, an insulating layer 218 covering the transistor may be provided.

Figure 20A:
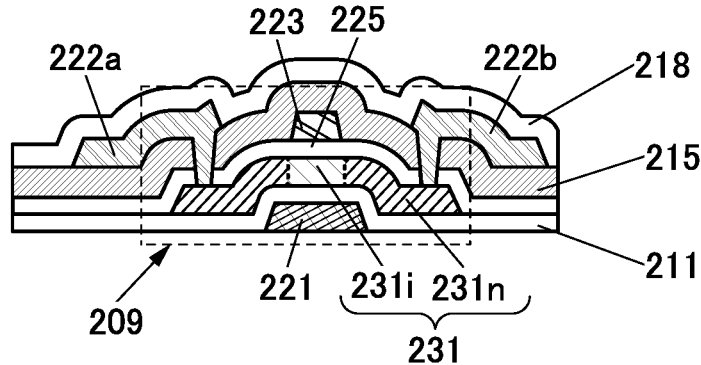
FIGS. 20A and 20B are cross-sectional views illustrating an example of a transistor.

FIG. 20A illustrates an example of the transistor 209 in which the insulating layer 225 covers the top and side surfaces of the semiconductor layer 231. The conductive layers 222a and 222b are connected to the low-resistance regions 231n through openings provided in the insulating layers 225 and 215. One of the conductive layers 222a and 222b functions as a source, and the other functions as a drain.

Figure 20B:
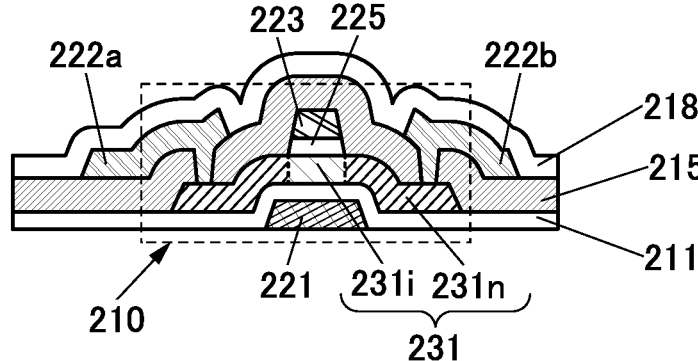

In a transistor 210 illustrated in FIG. 20B, the insulating layer 225 overlaps with the channel formation region 231i of the semiconductor layer 231 and does not overlap with the low-resistance regions 231n. The structure illustrated in FIG. 20B is obtained by processing the insulating layer 225 with the conductive layer 223 as a mask, for example. In FIG. 20B, the insulating layer 215 is provided to cover the insulating layer 225 and the conductive layer 223, and the conductive layers 222a and 222b are connected to the low-resistance regions 231n through the openings in the insulating layer 215.

The connection portion 204 is provided in a region of the substrate 151 not overlapping with the substrate 152. In the connection portion 204, the wiring 165 is electrically connected to the FPC 172 through the conductive layer 166 and a connection layer 242. In the illustrated example, the conductive layer 166 is formed by processing the same conductive film as the conductive layers 112a, 112c, and 112d. On the top surface of the connection portion 204, the conductive layer 166 is exposed. Thus, the connection portion 204 and the FPC 172 can be electrically connected to each other through the connection layer 242.

A light-blocking layer may be provided on a surface on the substrate 151 side of the substrate 152. The light-blocking layer can be provided over a region between adjacent light-emitting devices, in the connection portion 140, in the circuit 164, and the like. A variety of optical members can be arranged on the outer surface of the substrate 152.

Materials that can be used for the substrates 101 and 102 can be used for the substrates 151 and 152.

As the connection layer 242, an anisotropic conductive film (ACF), an anisotropic conductive paste (ACP), or the like can be used.

Structure Examples of Transistor

A cross-sectional structure example of a transistor including silicon in a semiconductor layer where a channel is formed, which can be used for the display apparatus, is described below.

Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) is preferably used.

An OS transistor can be used as at least one of the transistors included in the pixel circuit.

When an LTPS transistor is used as one or more of the transistors included in the pixel circuit and an OS transistor is used as the rest, the display apparatus can have low power consumption and high driving capability. In a favorable example, it is preferable that an OS transistor be used as a transistor functioning as a switch for controlling electrical continuity between wirings and an LTPS transistor be used as a transistor for controlling current, for instance.

For example, one of the transistors included in the pixel circuit functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

Structure Example 1

Figure 21A:
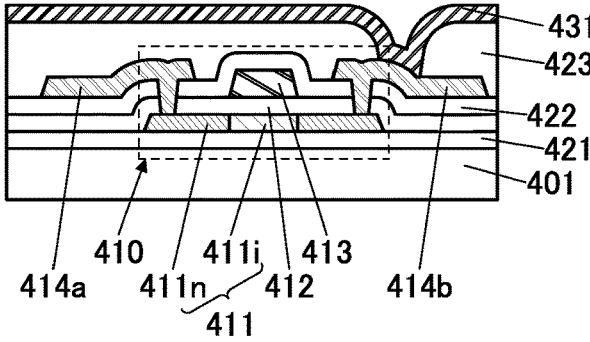
FIGS. 21A to 21D each illustrate an example of a transistor.

FIG. 21A is a cross-sectional view including a transistor 410.

The transistor 410 is provided over a substrate 401 and contains polycrystalline silicon in its semiconductor layer.

The transistor 410 includes a semiconductor layer 411, an insulating layer 412, a conductive layer 413, and the like. The semiconductor layer 411 includes a channel formation region 411i and low-resistance regions 411n. The semiconductor layer 411 contains silicon. The semiconductor layer 411 preferably contains polycrystalline silicon. Part of the insulating layer 412 functions as a gate insulating layer. Part of the conductive layer 413 functions as a gate electrode.

Alternatively, the semiconductor layer 411 can contain a metal oxide exhibiting semiconductor characteristics (also referred to as an oxide semiconductor). In this case, the transistor 410 can be referred to as an OS transistor.

The low-resistance regions 411n contain an impurity element. For example, to form an n-channel transistor 410, phosphorus, arsenic, or the like is added to the low-resistance regions 411n. Meanwhile, to form a p-channel transistor 410, boron, aluminum, or the like is added to the low-resistance regions 411n. Moreover, in order to control the threshold voltage of the transistor 410, the above-described impurity may be added to the channel formation region 411i.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided over the insulating layer 412 so as to overlap with the semiconductor layer 411.

An insulating layer 422 is provided to cover the conductive layer 413 and the insulating layer 412. Conductive layers 414a and 414b are provided over the insulating layer 422. The conductive layers 414a and 414b are electrically connected to the low-resistance regions 411n in openings provided in the insulating layers 422 and 412. Part of the conductive layer 414a functions as one of the source electrode and the drain electrode, and part of the conductive layer 414b functions as the other of the source electrode and the drain electrode. An insulating layer 423 is provided to cover the conductive layers 414a and 414b and the insulating layer 422.

The conductive layer 431 is provided over the insulating layer 423. The conductive layer 431 is provided over the insulating layer 423 and is electrically connected to the conductive layer 414b through an opening provided in the insulating layer 423. Although not illustrated here, an EL layer and a common electrode can be stacked over the conductive layer 431.

The conductive layer 431 can function as a pixel electrode of a light-emitting device or a light-receiving device, for example. For example, the transistor 410 can be favorably used as a transistor whose source or drain is electrically connected to the pixel electrode of the light-emitting device or the light-receiving device.

Structure Example 2

Figure 21B:
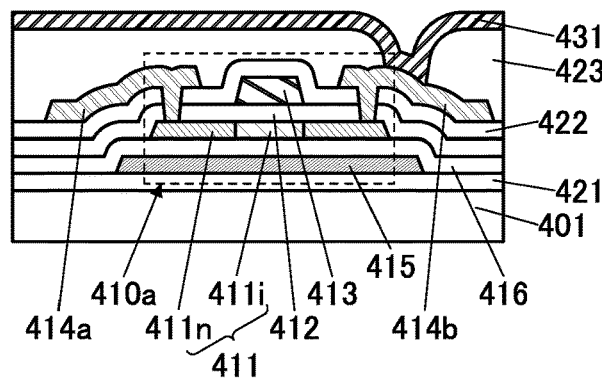

FIG. 21B illustrates a transistor 410a including a pair of gate electrodes. The transistor 410a in FIG. 21B is different from the transistor in FIG. 21A mainly in that a conductive layer 415 and an insulating layer 416 are provided.

The conductive layer 415 is provided over the insulating layer 421. The insulating layer 416 is provided to cover the conductive layer 415 and the insulating layer 421. The semiconductor layer 411 is provided such that at least the channel formation region 411i overlaps with the conductive layer 415 with the insulating layer 416 therebetween.

In the transistor 410a in FIG. 21B, part of the conductive layer 413 functions as a first gate electrode, and part of the conductive layer 415 functions as a second gate electrode. In this case, part of the insulating layer 412 functions as a first gate insulating layer, and part of the insulating layer 416 functions as a second gate insulating layer.

To electrically connect the first gate electrode to the second gate electrode, the conductive layer 413 is electrically connected to the conductive layer 415 through an opening portion provided in the insulating layers 412 and 416 in a region not illustrated. To electrically connect the second gate electrode to a source or a drain, the conductive layer 415 is electrically connected to the conductive layer 414a or the conductive layer 414b through an opening portion provided in the insulating layers 422, 412, and 416 in a region not illustrated.

In the case where all of the transistors included in pixels in the display apparatus are LTPS transistors, the transistor 410 illustrated in FIG. 21A or the transistor 410a illustrated in FIG. 21B can be used. In this case, the transistors included in the pixels in the display apparatus may all be the transistors 410a or the transistors 410 or may be a combination of the transistors 410a and the transistors 410.

Structure Example 3

Described below is an example of a structure including both a transistor containing silicon in its semiconductor layer and a transistor containing a metal oxide in its semiconductor layer.

Figure 21C:
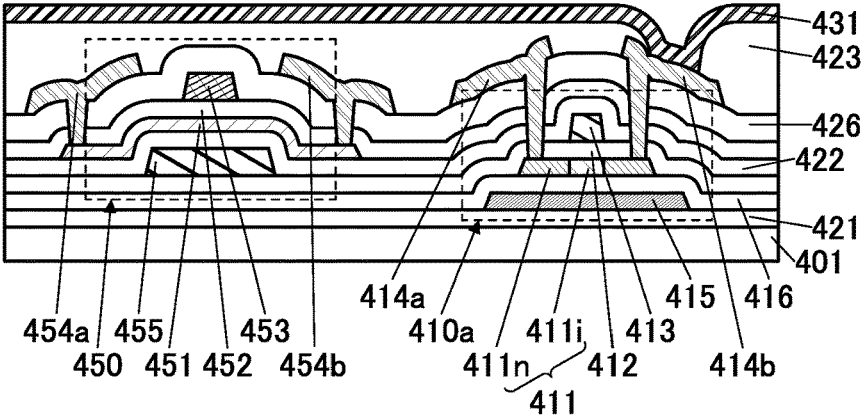

FIG. 21C is a schematic cross-sectional view including the transistor 410a and a transistor 450.

Structure example 1 described above can be referred to for the transistor 410a. Although an example using the transistor 410a is illustrated here, a structure including the transistor 410 and the transistor 450 or a structure including all the transistors 410, 410a, and 450 may alternatively be employed.

The transistor 450 contains a metal oxide in its semiconductor layer.

Moreover, FIG. 21C illustrates an example in which the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. Conductive layers 454a and 454b are provided over the insulating layer 426. The conductive layers 454a and 454b are electrically connected to the semiconductor layer 451 in openings provided in the insulating layers 426 and 452. Part of the conductive layer 454a functions as one of a source electrode and a drain electrode, and part of the conductive layer 454b functions as the other of the source electrode and the drain electrode. The insulating layer 423 is provided to cover the conductive layers 454a and 454b and the insulating layer 426.

Here, the conductive layers 414a and 414b electrically connected to the transistor 410a are preferably formed by processing the same conductive film as the conductive layers 454a and 454b. In FIG. 21C, the conductive layers 414a, 414b, 454a, and 454b are formed on the same plane (i.e., in contact with the top surface of the insulating layer 426) and contain the same metal element. In this case, the conductive layers 414a and 414b are electrically connected to the low-resistance regions 411n through openings provided in the insulating layers 426, 452, 422, and 412. This is preferable because the manufacturing process can be simplified.

Moreover, the conductive layer 413 functioning as the first gate electrode of the transistor 410a and the conductive layer 455 functioning as the second gate electrode of the transistor 450 are preferably formed by processing the same conductive film. In FIG. 21C, the conductive layers 413 and 455 are formed on the same plane (i.e., in contact with the top surface of the insulating layer 412) and contain the same metal element. This is preferable because the manufacturing process can be simplified.

Figure 21D:
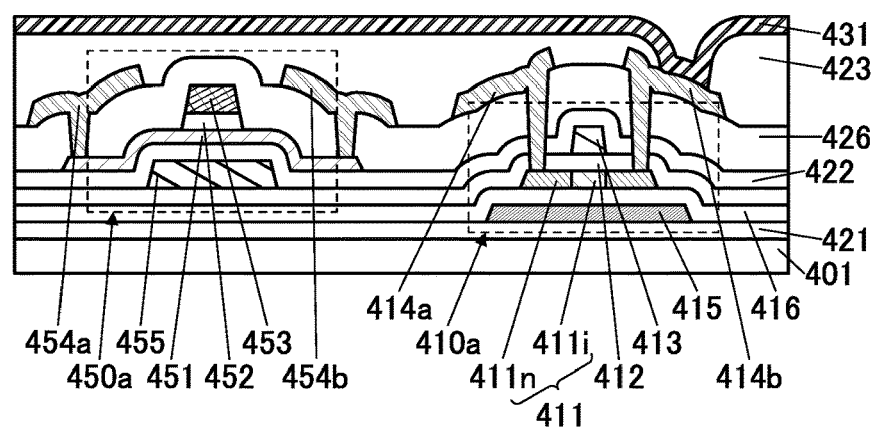

In FIG. 21C, the insulating layer 452 functioning as the first gate insulating layer of the transistor 450 covers an end portion of the semiconductor layer 451. Alternatively, as in a transistor 450a illustrated in FIG. 21D, the insulating layer 452 may be processed to have the same or substantially the same top surface shape as that of the conductive layer 453.

The conductive layer 431 can function as the pixel electrode of the light-emitting device or the light-receiving device, for example. In the structure illustrated in FIG. 21C, the transistor 410a can be favorably used as a transistor whose source or drain is electrically connected to the pixel electrode of the light-emitting device or the light-receiving device. In the case where a pixel in the display apparatus includes a plurality of transistors, one or more of the plurality of transistors can be the transistor 410a and the other(s) of the plurality of the transistors can be the transistor 450.

In FIGS. 23A to 23D described later, the transistor 410 or the transistor 410a can be used as the transistor M2, and the transistor 450 or the transistor 450a can be used as the transistor M1. Alternatively, for example, a structure where the transistor 450 or the transistor 450a corresponds to the transistor M2 may be employed. In that case, the transistor 410a corresponds to the transistor M1, the transistor M3, or another transistor.

Note that in this specification and the like, the expression "having substantially the same top surface shapes" means that at least outlines of stacked layers partly overlap with each other. For example, the case of patterning or partly patterning an upper layer and a lower layer with the use of the same mask pattern is included in the expression. The expression "having substantially the same top surface shapes" also includes the case where the outlines do not overlap completely with each other; for instance, the edge of the upper layer may be positioned on the inner side or the outer side of the edge of the lower layer.

This embodiment can be combined with any of the other embodiments as appropriate.

Embodiment 4

In this embodiment, structure examples and driving method examples of a display apparatus according to one embodiment of the present invention will be described.

One embodiment of the present invention is a display apparatus including light-emitting devices and pixel circuits. For example, the display apparatus includes three kinds of light-emitting devices emitting red (R), green (G), and blue (B) light and the light-receiving device, whereby a full-color display apparatus having an imaging function can be obtained.

Figure 22:
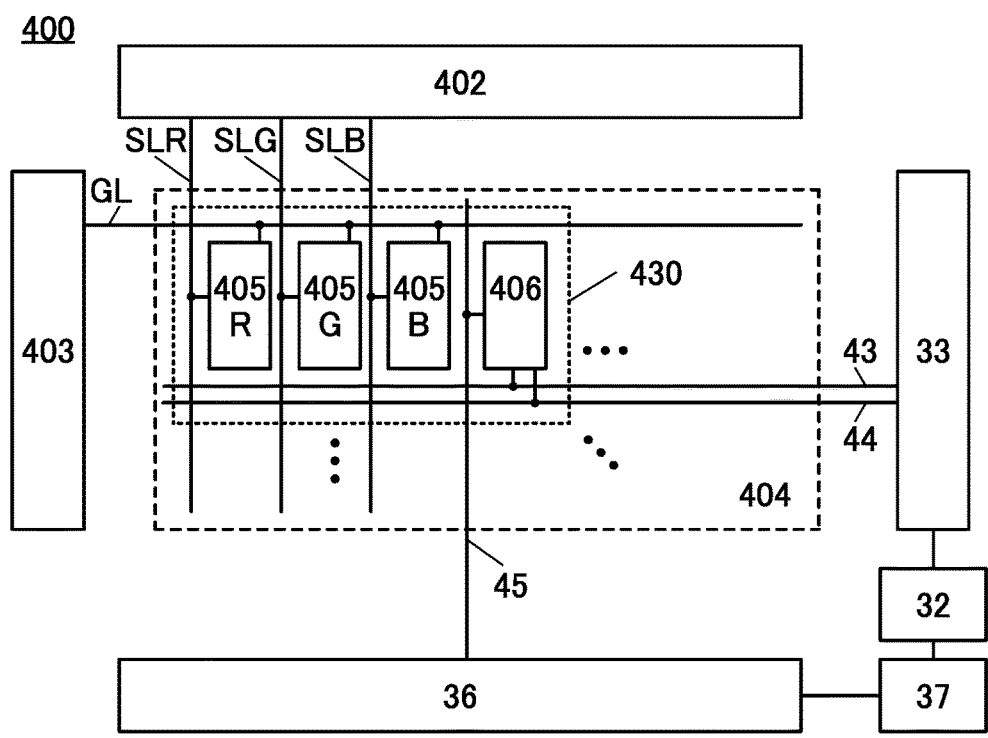
FIG. 22 is a block diagram illustrating an example of a display apparatus.

FIG. 22 is a block diagram of a display apparatus 400. The display apparatus 400 includes a pixel portion 404, a driver circuit portion 402, a driver circuit portion 403, a control circuit portion 32, a row driver circuit portion 33, a readout circuit portion 36, a sensing circuit portion 37, and the like. The pixel portion 404 includes a display device. The pixel portion 404 can be referred to as a display portion. Note that the pixel portion 404 in FIG. 22 includes a light-receiving device in addition to the display device. Thus, the pixel portion 404 can function as part of an imaging device. The pixel portion 404 can also be referred to as an imaging portion. The structure in FIG. 22 is called an imaging device in some cases.

The pixel portion 404 includes a plurality of pixels 430 arranged in a matrix. The pixels 430 each include subpixels 405R, 405G, 405B, and 406. The subpixels 405R, 405G, and 405B each include a light-emitting device functioning as a display device. The subpixel 406 includes a light-receiving device.

The pixel 430 is electrically connected to wirings GL, SLR, SLG, SLB, 43, 44, and 45.

The wirings SLR, SLG, and SLB are electrically connected to the driver circuit portion 402. The wiring GL is electrically connected to the driver circuit portion 403. The driver circuit portion 402 functions as a source line driver circuit (also referred to as a source driver), and the driver circuit portion 403 functions as a gate line driver circuit (also referred to as a gate driver). The wiring GL functions as a gate line, and the wirings SLR, SLG, and SLB function as source lines.

The wirings 43 and 44 are electrically connected to the driver circuit portion 33. The wiring 45 is electrically connected to the readout circuit portion 36. The row driver circuit portion 33 has a function of selecting the pixel 430 from which data of a captured image (hereinafter, also referred to as captured image data) is read out. The row driver circuit portion 33 also has a function of selecting the pixel 430 to be subjected to the reset of the captured image data. Note that the row driver circuit portion can also be referred to as a gate driver circuit portion or a scan driver circuit portion. The readout circuit portion 36 has a function of sequentially outputting captured image data output from the pixel 430 to the sensing circuit portion 37 or the like.

The control circuit portion 32 has a function of generating a signal for controlling driving of the row driver circuit portion 33. The sensing circuit portion 37 has a function of sensing an object or the like based on data output from the readout circuit portion 36, for example. A result sensed by the sensing circuit portion 37 is supplied to the control circuit portion 32. Thus, the row driver circuit portion 33 can perform driving in accordance with the result sensed by the sensing circuit portion 37.

The subpixel 405R includes a light-emitting device that emits red light. The subpixel 405G includes a light-emitting device that emits green light. The subpixel 405B includes a light-emitting device that emits blue light. Thus, the display apparatus 400 can perform full-color display. Note that the pixel 430 may include a subpixel including a light-emitting device that emits light of another color. For example, the pixel 430 may include, in addition to the three subpixels, a subpixel including a light-emitting device emitting white light or a subpixel including a light-emitting device emitting yellow light. The light-emitting devices 130a, 130b, and 130c can be used for the light-emitting devices included in the subpixels 405R, 405G, and 405B.

The subpixel 406 includes the light-receiving device. As the light-receiving device included in the subpixel 406, the light-receiving device 150 described in the above embodiment can be used.

The wiring GL is electrically connected to the subpixels 405R, 405G, and 405B arranged in the row direction (the extending direction of the wiring GL). The wiring SLR, the wiring SLG, and the wiring SLB are respectively electrically connected to the subpixels 405R, the subpixels 405G, and the subpixels 405B arranged in the column direction (the extending direction of the wiring SLR and the like). The wirings 43 and 44 are electrically connected to the subpixel 406 arranged in the row direction (the extending direction of the wirings 43 and 44). The wiring 45 is electrically connected to the subpixel 406 arranged in the column direction (the extending direction of the wiring 45).

Example of Structure of Pixel Circuit

Figure 23A:
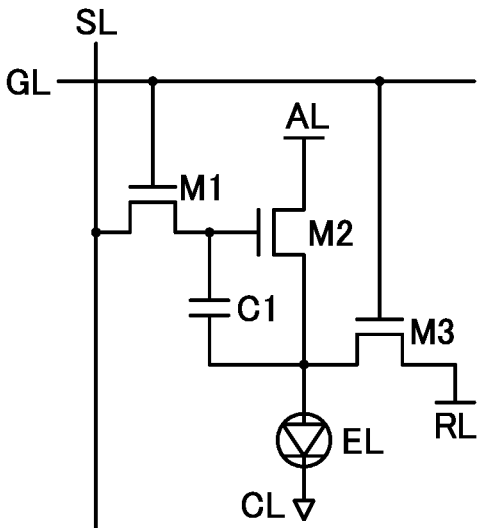
FIGS. 23A to 23D each illustrate an example of a pixel circuit.

FIG. 23A illustrates an example of a circuit diagram that can be used for the subpixels 405R, 405G, and 405B. Note that the subpixels 405R, 405G, and 405B are collectively referred to as the subpixel 405 in some cases below. The subpixel 405 includes the transistors M1, M2, M3, a capacitor C1, and a light-emitting device EL. The wirings GL and SL are electrically connected to the subpixel 405. The wiring SL corresponds to any of the wirings SLR, SLG, and SLB illustrated in FIG. 22.

A gate of the transistor M1 is electrically connected to the wiring GL, one of a source and a drain of the transistor M1 is electrically connected to the wiring SL, and the other of the source and the drain of the transistor M1 is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential D is supplied to the wiring SL. A selection signal is supplied to the wiring GL. The selection signal includes a potential for turning on a transistor and a potential for turning off the transistor.

A reset potential is supplied to the wiring RL. An anode potential is supplied to the wiring AL. A cathode potential is supplied to the wiring CL. In the subpixel 405, the anode potential is higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistors M1 and M3 function as switches. The transistor M2 functions as a transistor for controlling a current flowing through the light-emitting device EL. For example, it can be regarded that the transistor M1 functions as a selection transistor and the transistor M2 functions as a driving transistor.

Here, it is preferable to use LTPS transistors as all of the transistors M1 to M3. Alternatively, it is preferable to use OS transistors as the transistor M1 and the transistor M3 and to use an LTPS transistor as the transistor M2.

Alternatively, OS transistors may be used as all the transistors M1 to M3. In that case, an LTPS transistor can be used as at least one of a plurality of transistors included in the driver circuit portion 402 and a plurality of transistors included in the driver circuit portion 403, and OS transistors can be used as the other transistors. For example, OS transistors can be used as the transistors provided in the pixel portion 404, and LTPS transistors can be used as the transistors provided in the driver circuit portions 402 and 403.

A transistor using an oxide semiconductor having a wider band gap and a lower carrier density than silicon can achieve an extremely low off-state current. Therefore, owing to the low off-state current, charge accumulated in a capacitor that is connected in series to the transistor can be held for a long time. Hence, it is preferable to use transistors containing an oxide semiconductor as, especially, the transistors M1 and M3 connected in series to the capacitor C1. The use of the transistors containing an oxide semiconductor as the transistors M1 and M3 can prevent leakage of charge held in the capacitor C1 through the transistor M1 or the transistor M3.

Furthermore, since charge in the capacitor C1 can be held for a long period, a still image can be displayed for a long period without rewriting data in the subpixel 405.

When an OS transistor is used as the transistor M1 functioning as a selection transistor, the gray level of the pixel can be maintained even when the frame frequency is extremely low (for example, 1 fps or less). Furthermore, in the case of displaying a still image for which rewriting every frame is not required, displaying an image can be kept even when the operation of the driver is stopped. In such a manner, a driving method in which the operation of a peripheral driver circuit is stopped during displaying a still image is also referred to as idling stop driving. The power consumption of the display apparatus can be reduced by performing idling stop driving.

Although all the transistors are n-channel transistors in FIG. 23A, a p-channel transistor can also be used.

The transistors included in the subpixel 405 are preferably arranged over one substrate.

A transistor including a pair of gates that overlap with each other with a semiconductor layer therebetween can be used as the transistor included in the subpixel 405.

In the transistor including a pair of gates, the same potential is supplied to the pair of gates electrically connected to each other, whereby the on-state current of the transistor can be increased and the saturation characteristics can be improved. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 23B:
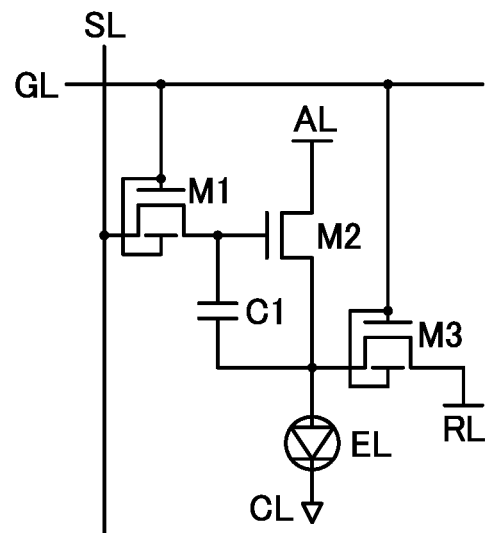

FIG. 23B illustrates an example of the subpixel 405 in which a transistor including a pair of gates is used as each of the transistors M1 and M3. The gates of each of the transistors M1 and M3 are electrically connected to each other. Such a structure makes it possible to shorten the period in which data is written to the subpixel 405.

Figure 23C:
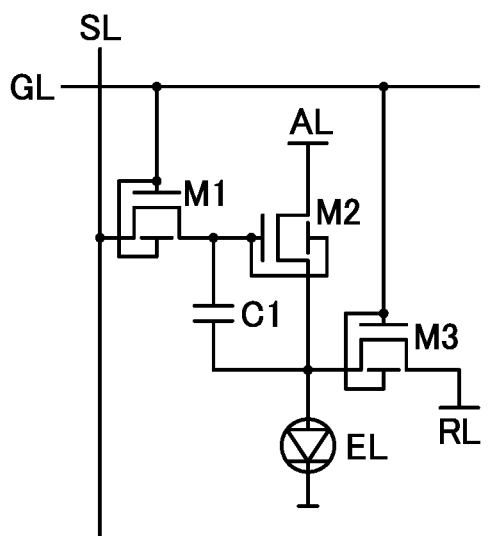

FIG. 23C illustrates an example of the subpixel 405 in which a transistor including a pair of gates (hereinafter, referred as a first gate and a second gate) is used as the transistor M2 in addition to the transistors M1 and M3. The gates of the transistor M2 are electrically connected to each other. The transistor M2 having such a structure enables the saturation characteristics to be improved, whereby the luminance of the light-emitting device EL can be easily controlled and the display quality can be increased.

Figure 23D:
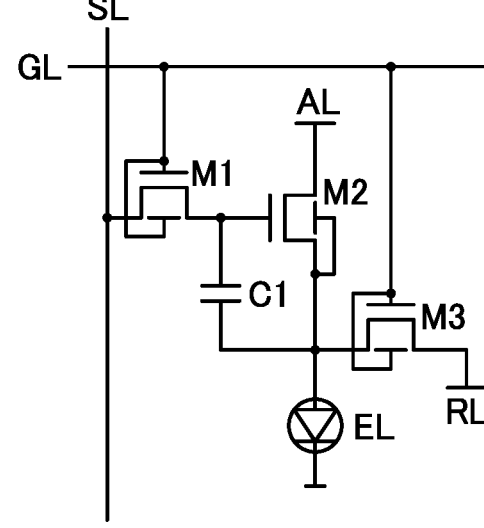

FIG. 23C illustrates an example where the first gate and the second gate of the transistor M2 are electrically connected to each other, but the present invention is not limited to the example. As illustrated in FIG. 23D, the first gate of the transistor M2 may be electrically connected to the other of the source and the drain of the transistor M1 and one electrode of the capacitor C1, and the second gate of the transistor M2 may be electrically connected to the other of the source and the drain of the transistor M2, one of the source and the drain of the transistor M3, the other electrode of the capacitor C1, and one electrode of the light-emitting device EL.

FIG. 24A is a circuit diagram illustrating a structure example of the subpixel 406. The subpixel 406 with a structure illustrated in FIG. 24A includes a light-receiving device 50, transistors 51, 52, 53, and 54, and capacitors 56 and 57. Note that the capacitor 56 is not necessarily provided when the parasitic capacitance between a transistor 52 and a wiring 49 can be sufficiently high for the operation. In addition, the capacitor 57 is not necessarily provided when the parasitic capacitance of the light-receiving device 50 can be sufficiently high for the operation. Hereinafter, descriptions are made on the assumption that the transistors 51 to 54 described in this embodiment are n-channel transistors; however, the description below can also be referred to for the case where a p-channel transistor is included by reversing the large—small relation between potentials as appropriate, for example. Moreover, the connection direction of the light-receiving device 50 can be reversed by changing the large—small relation between potentials as appropriate.

One electrode of the light-receiving device 50 is electrically connected to one electrode of the capacitor 57. The one electrode of the capacitor 57 is electrically connected to one of the source and the drain of the transistor 51. The other of the source and the drain of the transistor 51 is electrically connected to a gate of the transistor 52. One of a source and a drain of the transistor 52 is electrically connected to one of the source and the drain of the transistor 53. The gate of the transistor 52 is electrically connected to one of a source and a drain of the transistor 54. The one of the source and the drain of the transistor 54 is electrically connected to one electrode of the capacitor 56. Note that a node where the other of the source and the drain of the transistor 51, the gate of the transistor 52, the one of the source and the drain of the transistor 54, and the one electrode of the capacitor 56 are electrically connected to each other is referred to as a node FD.

The gate of the transistor 51 is electrically connected to a wiring 41. A gate of the transistor 53 is electrically connected to a wiring 43. A gate of the transistor 54 is electrically connected to a wiring 44. The other of the source and the drain of the transistor 53 is electrically connected to the wiring 45. The other electrode of the light-receiving device 50 and the other electrode of the capacitor 57 are electrically connected to a wiring 46. The other of the source and the drain of the transistor 52 is electrically connected to a wiring 47. The other of the source and the drain of the transistor 54 is electrically connected to a wiring 48. The other electrode of the capacitor 56 is electrically connected to the wiring 49.

A power potential can be supplied to the wirings 46 to 49. Thus, it can be said that the wirings 46 to 49 each have a function of a power supply line. For example, a high potential can be supplied to the wiring 47, and a low potential can be supplied to the wiring 49. In the case where the cathode of the light-receiving device 50 is electrically connected to the wiring 46 as illustrated in FIG. 24A, the wiring 46 can have a high potential and the wiring 48 can have a low potential. In contrast, in the case where the anode of the light-receiving device 50 is electrically connected to the wiring 46, the wiring 46 can have a low potential and the wiring 48 can have a high potential.

Example of Driving Method of Display Apparatus

An example in which finger authentication is performed using the display apparatus of one embodiment of the present invention will be described.

First, in the pixel portion 404, light is emitted from the light-emitting device included in the pixel 430 and part of the light is reflected by the contact portion between a finger and the surface of the display apparatus. Part of the reflected light enters the light-receiving device included in the pixel 430.

Next, captured image data is read out in the pixel portion 404. At this time, light emission of the light-emitting device in the pixel portion 404 is preferably performed with a frame frequency of 1 fps or less. When captured image data is read out in the pixel portion 404, it is preferable that the drive frequency of the peripheral circuit, e.g., the driver circuit portions 402 and 403, which have a function of performing display in the pixel portion 404, be lowered or the operation of the driver circuit portions be stopped. The driving frequency of the driver circuit portion 402, the driver circuit portion 403, or the like is lowered or the operation thereof is stopped, whereby noise in reading out captured image data can be reduced.

For example, for finger authentication, display in the pixel portion 404 can be performed by idling stop driving in a period during which captured image data is read out in the pixel portion 404.

Example of Driving Method of Pixel Circuit

FIG. 24B is a timing chart illustrating an example of a method for driving the subpixel 406 in FIG. 24A. Here, the potential of the wiring 46 is set to a high potential, and the potential of the wiring 48 is set to a low potential. Note that in FIG. 24B, "H" means a high potential and "L" means a low potential. The same applies to other timing charts. In FIG. 24B, periods T1 to T5 are illustrated as periods for driving the subpixel 406 included in the pixel 430.

In the period Ti, the potentials of the wirings 41 and 44 are set to high potentials and the potential of the wiring 43 is set to a low potential. Accordingly, the transistors 51 and 54 are turned on and the transistor 53 is turned off. The transistor 54 is turned on, whereby the potential of the node FD becomes a low potential that is the potential of the wiring 48. Furthermore, since the transistor 51 is turned on in addition to the transistor 54, the potential of one electrode of the light-receiving device 50 also becomes a low potential that is the potential of the wiring 48; this is not illustrated in FIG. 24B. Therefore, electric charges accumulated in the capacitors 56 and 57, and the like are reset. Thus, the period T1 can be called a reset period and the operation in the period T1 can be called a reset operation.

In the period T2, the potentials of the wirings 41 and 44 are set to low potentials. Thus, the transistors 51 and 54 are turned off. When the light-receiving device 50 is irradiated with light at this time, electric charges corresponding to an energy of the light that enters the light-receiving device 50 are accumulated in the capacitor 57. Thus, the period T2 can be called an exposure period, and the operation in the period T2 can be called an exposure operation.

In the period T3, the potential of the wiring 41 is set to a high potential. Thus, the transistor 51 is turned on, whereby electric charges accumulated in the capacitor 57 are transferred to the node FD. Accordingly, the potential of the node FD is increased. Thus, the period T3 can be called a transfer period and the operation in the period T3 can be called a transfer operation.

In the period T4, the potential of the wiring 41 is set to a low potential. Accordingly, the transistor 51 is turned off, whereby a transfer of electric charges from the capacitor 57 to the node FD is finished.

In the above manner, the subpixel 406 included in the pixel 430 acquires captured image data. Specifically, the potential of the node FD becomes a potential corresponding to the captured image data. Thus, the periods T1 to T4 can be called an acquisition period, and the operation in the periods T1 to T4 can be called an acquisition operation.

Next, an example of the driving method for the period T5 will be described. In the period T5, the potential of the wiring 43 is set to a high potential. Thus, the transistor 53 is turned on, and a signal indicating the captured image data acquired by the subpixel 406 included in the pixel 430 is output to the wiring 45. Specifically, the potential of the wiring 45 becomes a potential corresponding to the potential of the node FD. Thus, the captured image data acquired by the pixel 430 is read out.

As described above, the high potential signal is supplied to the wiring 43, whereby the captured image data acquired by the pixel 430 is read out. In other words, the pixel 430 from which the captured image data is to be read out can be selected by a signal supplied to the wiring 43. Thus, the signal supplied to the wiring 43 can be referred to as a selection signal.

After the captured image data is read out, the potential of the wiring 44 is set to a high potential. Thus, the transistor 54 is turned on, and the captured image data acquired by the subpixel 406 included in the pixel 430 is reset. Specifically, the potential of the node FD becomes a low potential that is the potential of the wiring 48. Here, since the transistor 53 is in the on state, the potential of the wiring 45 is changed in accordance with the potential change of the node FD. The readout circuit portion 36 electrically connected to the wiring 45 may perform correlated double sampling. The correlated double sampling can reduce noise in the captured image data that is read out.

As described above, a high potential signal is supplied to the wiring 44, whereby the captured image data acquired by the pixel 430 is reset. Thus, a signal supplied to the wiring 44 can be referred to as a reset signal.

Next, the potential of the wiring 44 is set to a low potential to turn off the transistor 54 and the potential of the wiring 43 is set to a low potential to turn off the transistor 53.

The above is an example of the driving method in the period T5. In the period T5, the captured image data acquired by the pixel 430 is read out. Thus, the period T5 can be called a readout period, and the operation in the period T5 can be called a readout operation.

Acquisition of captured image data in the pixel portion 404 is preferably performed by a global shutter mode. Here, the global shutter mode refers to a method of acquiring captured image data in all the pixels at the same time. By acquiring captured image data with a global shutter mode, simultaneousness of image-capturing can be secured, and an image with little distortion can be easily taken even when an object moves at high speed.

In contrast, readout of captured image data in the pixel portion 404 is performed row by row, for example. Therefore, in the case of acquiring captured image data with the global shutter mode, some of the pixels 430 have a long period of from acquiring captured image data to reading the captured image data. Therefore, in the case of acquiring captured image data with the global shutter mode, electric charges transferred from the capacitor 57 to the node FD can be preferably held for a long time.

In order to hold electric charges in the node FD for a long time, the transistor electrically connected to the node FD is preferably a transistor with a low off-state current. As the transistor with a low off-state current, an OS transistor can be favorably used, for example. The transistors 51 and 54 are preferably OS transistors.

As the transistors 51 and 54, a transistor other than the OS transistor can be used as long as the transistor other than the OS transistor has a low off-state current. For example, a transistor including a wide-bandgap semiconductor may be used. In some cases, the wide-bandgap semiconductor refers to a semiconductor with a bandgap of 2.2 eV or greater. Examples of the wide-bandgap semiconductor include silicon carbide, gallium nitride, and diamond.

Note that the transistors 51 and 54 may be transistors containing silicon in their channel formation regions (hereinafter, Si transistors) or the like. A Si transistor has a higher off-state current than an OS transistor. However, by making the capacitance of the capacitor 56 high, for example, acquisition of captured image data in the pixel portion 404 can be performed with the global shutter mode even when the off-state currents of the transistors 51 and 54 are high. Alternatively, acquisition of captured image data in the pixel portion 404 can be performed by a rolling shutter mode. In that case, the capacitance of the capacitor 56 need not be increased even when the transistors 51 and 54 are transistors with high off-state currents.

The transistors 52 and 53 may be Si transistors or OS transistors. For example, when transistors including crystalline silicon (typically, low-temperature polysilicon (also referred to as LTPS), single crystal silicon, or the like) are used as the transistors 52 and 53, the on-state current of the transistors 52 and 53 can be increased. This enables a high-speed readout operation of captured image data. In contrast, when all the transistors 51 to 54 are OS transistors, all the transistors included in the pixel 430 can be formed in the same layer. When all the transistors including the transistors 51 to 54 included in the display apparatus 400 are OS transistors, all the transistors included in the display apparatus 400 can be formed in the same layer. Therefore, the manufacturing process of the display apparatus 400 can be simplified. Note that transistors containing amorphous silicon in a channel formation region may be used as the transistors 51 to 54. For the transistors 51 to 54, Si transistors (typically, LTPS transistors) and OS transistors may be used in combination. Note that a structure in which the LTPS transistor and the OS transistor are combined is referred to as LTPO in some cases. For example, it is preferable that an OS transistor be used as a transistor or the like functioning as a switch for controlling electrical continuity between wirings and an LTPS transistor be used as a transistor or the like for controlling current, in which case the display apparatus can have a high display quality.

In the case where finger authentication is performed using the display apparatus of one embodiment of the present invention, first, the row driver circuit selects pixels in a particular row of the pixel portion and reads out first captured image data. Thus, for example, a position in the pixel portion of a finger which contacts or is close to the pixel portion is sensed, for example. Next, the row driver circuit selects only pixels in a row which the finger contacts or is close to and in the periphery of the row, and reads out second captured image data, that is, the fingerprint of the user. In this manner, the display apparatus of one embodiment of the present invention performs finger authentication.

Here, in the case where the first captured image data is read out, the position of the finger is sensed only and there is no need to read out the image of the fingerprint. Therefore, the readout of the first captured image data is not necessarily performed on the pixels in all the rows and columns in the pixel portion. For example, the readout of the first captured image data may be performed on a limited number of pixels in every plurality of rows and every plurality of columns. Accordingly, as compared with the case where the first captured image data is read out from all the pixels in the pixel portion, the readout period for the pixels in one row can be shortened. On the other hand, in the case where the second captured image data is read out, it is necessary to read out the image of the fingerprint from all the pixels in a specified region; thus, the readout period for the pixels in one row is longer than that in the case where the first captured image data is read out. In the display apparatus of one embodiment of the present invention, the pixels from which the second captured image data is read out for finger authentication can be pixels in only part of the pixel portion. Thus, finger authentication can be performed in a short time, as compared with the case where the second captured image data is readout from all the pixels.

This embodiment can be combined with any of the other embodiments as appropriate.

Embodiment 5

In this embodiment, another example of a structure of the display apparatus (display panel) which is one embodiment of the present invention will be described. A display apparatus (display panel) described below as an example can be used for the display apparatus described in the above embodiments. The display apparatus (display panel) described below as an example includes a transistor.

The display apparatus in this embodiment can be a high-resolution display apparatus. Thus, the display apparatus of one embodiment of the present invention can be used for display portions of information terminals (wearable devices) such as watch-type or bracelet-type information terminals and display portions of wearable devices capable of being worn on a head, such as a VR device such as a head-mounted display and a glasses-type AR device.

[Display Module]

Figure 25A:
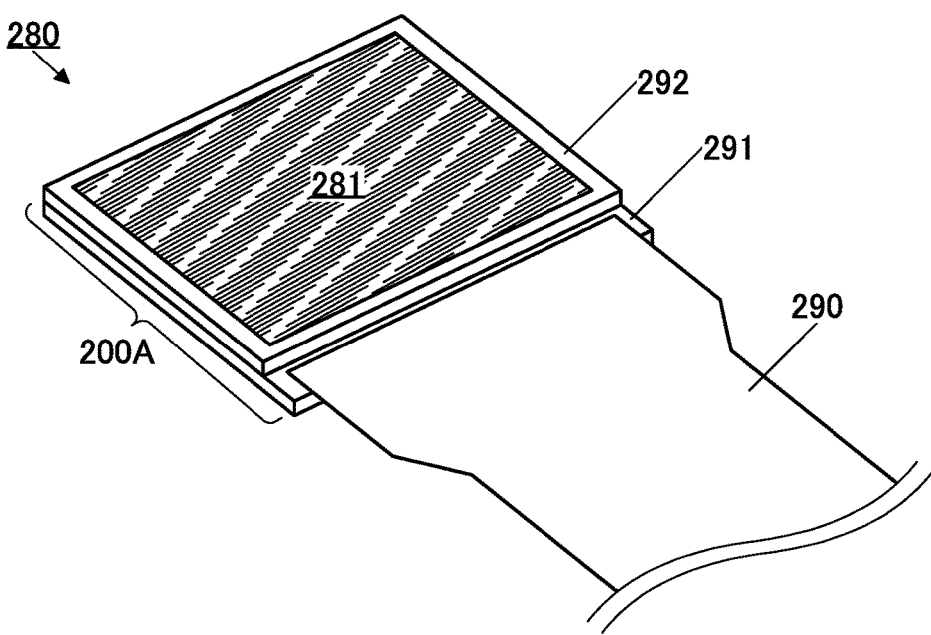
FIGS. 25A and 25B illustrate a structure example of a display apparatus.

FIG. 25A is a perspective view of a display module 280. The display module 280 includes a display apparatus 200A and an FPC 290.

The display module 280 includes a substrate 291 and a substrate 292. The display module 280 includes a display portion 281. The display portion 281 is a region where an image is displayed.

Figure 25B:
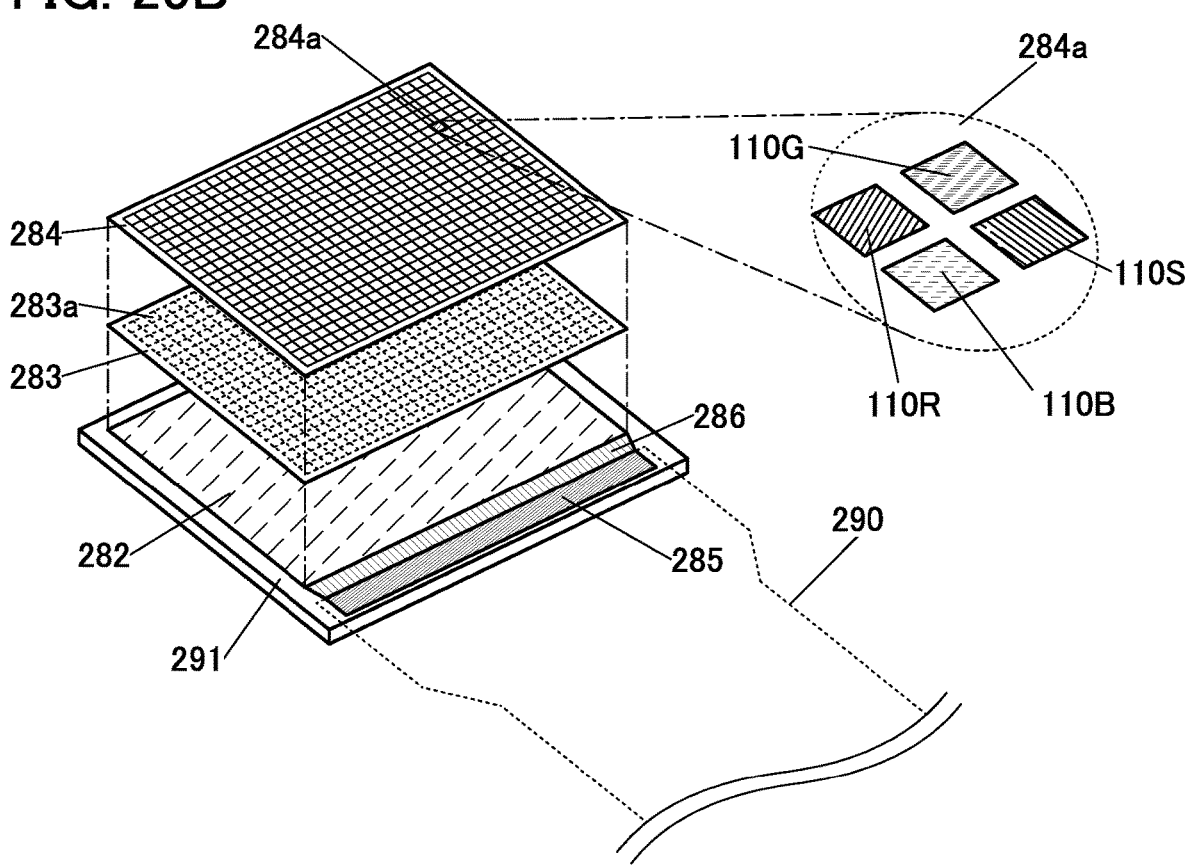

FIG. 25B is a perspective view schematically illustrating the structure on the substrate 291 side. Over the substrate 291, a circuit portion 282, a pixel circuit portion 283 over the circuit portion 282, and a pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 25B. The pixel 284a includes a subpixel 110R including a light-emitting device that emits red light, a subpixel 110G including a light-emitting device that emits green light, a subpixel 110B including a light-emitting device that emits blue light, and a subpixel 1105 including a light-receiving device. For example, the light-emitting device included in the subpixel 110R corresponds to the light-emitting device 130a illustrated in FIG. 1B, the light-emitting device included in the subpixel 110G corresponds to the light-emitting device 130b illustrated in FIG. 1B, the light-emitting device included in the subpixel 110B corresponds to the light-emitting device 130c illustrated in FIG. 1B, and the light-receiving device included in the subpixel 1105 corresponds to the light-receiving device 150 illustrated in FIG. 1B.

The pixel circuit portion 283 includes a plurality of pixel circuits 283a arranged periodically. One pixel circuit 283a is a circuit that controls light emission from the light-emitting devices and the light-receiving device included in one pixel 284a. One pixel circuit 283a may be provided with four circuits each of which controls light emission of one light-emitting device (light-receiving device). For example, the pixel circuit 283a can include at least one selection transistor, one current control transistor (driving transistor), and a capacitor for one light-emitting device. In this case, a gate signal is input to a gate of the selection transistor, and a source signal is input to a source of the selection transistor. Thus, an active matrix display panel is achieved.

The circuit portion 282 includes a circuit for driving the pixel circuits 283a in the pixel circuit portion 283. For example, one or both of a gate line driver circuit and a source line driver circuit are preferably included. The circuit portion 282 may also include at least one of an arithmetic circuit, a memory circuit, a power supply circuit, and the like. A transistor included in the circuit portion 282 may constitute part of the pixel circuit 283a. That is, the pixel circuit 283a may be constituted by a transistor included in the pixel circuit portion 283 and a transistor included in the circuit portion 282.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, further more preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even with a structure in which the display portion of the display module 280 is seen through a lens, pixels of the extremely-high-resolution display portion 281 included in the display module 280 are prevented from being perceived when the display portion is enlarged by the lens, so that display providing a high level of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Apparatus 200A]

Figure 26:
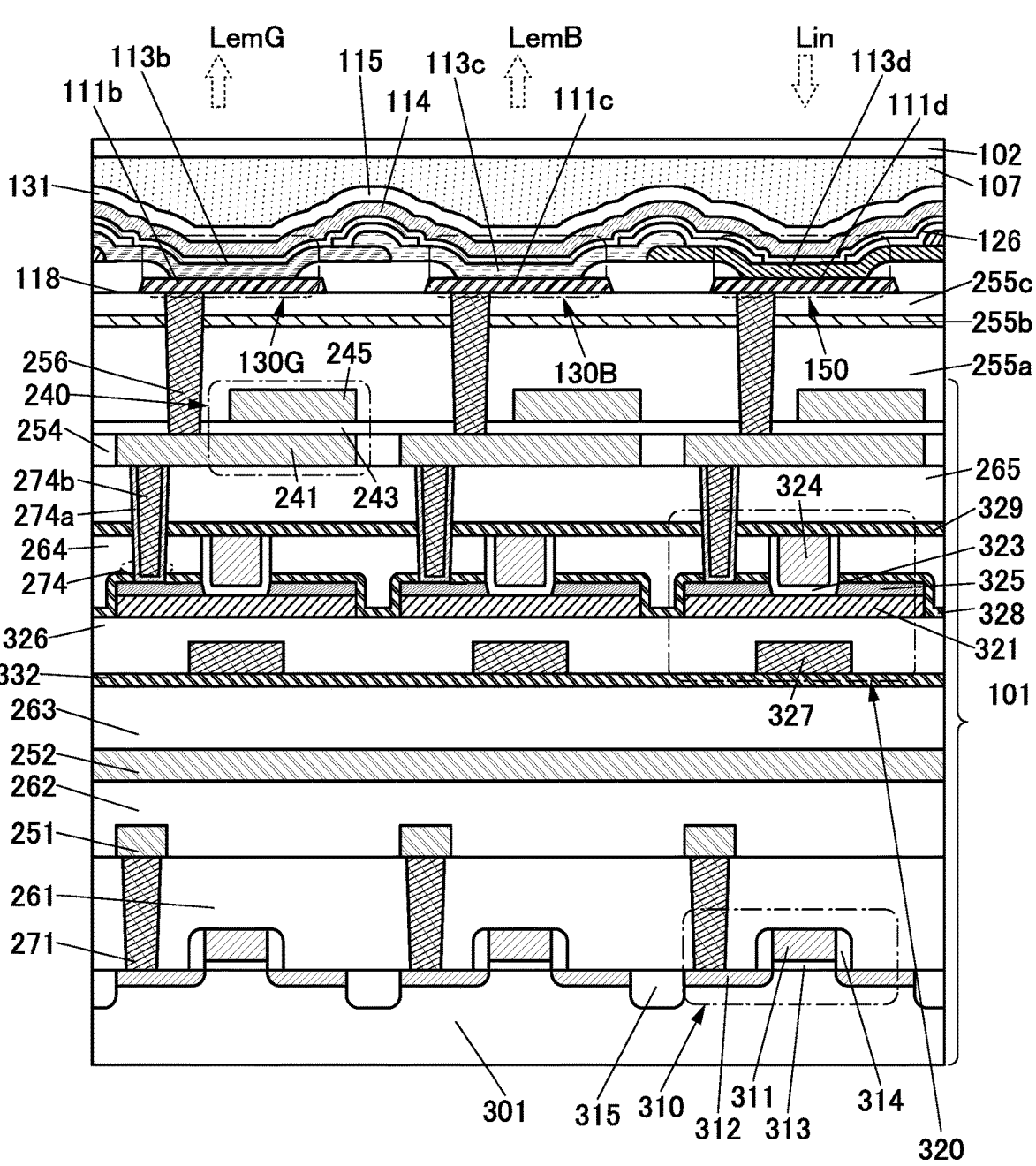
FIG. 26 is a cross-sectional view illustrating a structure example of a display apparatus.

The display apparatus 200A illustrated in FIG. 26 includes a substrate 301, the light-emitting device 130R emitting red light (not illustrated), the light-emitting device 130G emitting green light LemG, the light-emitting device 130B emitting blue light LemB, the light-receiving device 150 that senses light Lin, a capacitor 240, and transistors 310 and 320.

The substrate 301 corresponds to the substrate 291 illustrated in FIGS. 10A and 10B.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through a plug 274.

The transistor 320 can be used as a transistor included in the pixel circuit. The transistor 310 can be used as a transistor included in the pixel circuit or a transistor included in a driver circuit (one or both of a gate line driver circuit and a source line driver circuit) for driving the pixel circuit. The transistors 310 and 320 can also be used as transistors included in a variety of circuits such as an arithmetic circuit and a memory circuit.

The capacitor 240 includes a conductive layer 241, a conductive layer 245, and an insulating layer 243 between the conductive layer 241 and the conductive layer 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 265 and is embedded in an insulating layer 254. The conductive layer 241 is electrically connected to one of a source and a drain of the transistor 320 through the plug 274 embedded in insulating layers 264 and 329 and the insulating layer 265. The insulating layer 243 is provided to cover the conductive layer 241. The conductive layer 245 is provided in a region overlapping with the conductive layer 241 with the insulating layer 243 therebetween.

The insulating layer 255a is provided to cover the capacitor 240.

The insulating layer 255b is provided over the insulating layer 255a, the insulating layer 255c is provided over the insulating layer 255b, and the light-emitting devices 130G and 130B, and the light-receiving device 150 are provided over the insulating layer 255c. Embodiment 1 can be referred to for the structures of the light-emitting devices 130G and 130B and the light-receiving device 150.

The pixel electrode 111*b* of the light-emitting device 130G, the pixel electrode 111*c* of the light-emitting device 130B, and the pixel electrode 111*d* of the light-receiving device 150 are each electrically connected to one of the source and the drain of the transistor 320 through a plug 256 embedded in the insulating layers 255*a*, 255*b*, and 255*c*, the conductive layer 241 embedded in the insulating layer 254, and the plug 274 embedded in the insulating layers 264, 329, and 265. A top surface of the insulating layer 255*c* and a top surface of the plug 256 are level with or substantially level with each other. Any of a variety of conductive materials can be used for the plugs.

The protective layer 131 is provided over the light-emitting devices 130R, 130G, and the light-receiving device 150. A substrate 102 is attached to the protective layer 131 by an adhesive layer 107.

In FIG. 26, a structure not including transistors 320 is acceptable.

The transistors 320 are each a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327. The insulating layer 332 functions as a barrier layer that prevents diffusion of impurities such as water or hydrogen from below the insulating layer 332 into the transistor 320 and release of oxygen from the semiconductor layer 321 to the insulating layer 332 side. As the insulating layer 332, a film that can suppress diffusion of hydrogen or oxygen as compared with a silicon oxide film can be used, for example. Examples of such a silicon oxide film include an aluminum oxide film, a hafnium oxide film, and a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least the part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. The pair of conductive layers 325 is provided on and in contact with the semiconductor layer 321, and functions as a source electrode and a drain electrode.

An insulating layer 328 is provided to cover the top and side surfaces of the pair of conductive layers 325, the side surface of the semiconductor layer 321, and the like, and the insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening portion reaching the semiconductor layer 321 is provided in the insulating layers 328 and 264. The insulating layer 323 that is in contact with the top surface of the semiconductor layer 321 and the conductive layer 324 are embedded in the opening portion. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so that they are level with or substantially level with each other, and the insulating layer 329 and an insulating layer 265 are provided to cover these layers.

The insulating layers 264 and 265 each function as an interlayer insulating layer. The insulating layer 329 functions as a barrier layer that prevents diffusion of impurities such as water or hydrogen from the insulating layer 265 or the like to the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274*a* that covers the side surface of an opening portion formed in the insulating layers 265, 329, 264, and 328 and part of the top surface of the conductive layer 325, and a conductive layer 274*b* in contact with the top surface of the conductive layer 274*a*. For the conductive layer 274*a*, a conductive material that can suppress diffusion of hydrogen and oxygen is preferably used.

Furthermore, a transistor including a metal oxide film in the semiconductor layer does not need a laser crystallization step that is required for a transistor including low-temperature polysilicon. Thus, the manufacturing cost of a display apparatus can be reduced even when the display apparatus is formed using a large substrate. In addition, it is preferable to use the transistor including a cloud-aligned composite oxide semiconductor (CAC-OS) in the semiconductor layer for a driver circuit and a display portion in a large display apparatus having high definition such as ultra-high definition ("4K resolution," "4K2K," and "4K") or super high definition ("8K resolution," "8K4K," and "8K"), in which case writing can be performed in a short time and display defects can be reduced. In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed. Note that a clear boundary between the first region and the second region is difficult to observe in some cases.

This embodiment can be combined with any of the other embodiments as appropriate.

Embodiment 6

In this embodiment, a light-emitting device and a light-receiving device that can be used in the display apparatus of one embodiment of the present invention are described.

As illustrated in FIG. 27A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (hole-injection layer), a layer containing a substance having a high hole-transport property (hole-transport layer), and a layer containing a substance having a high electron-blocking property (electron-blocking layer).

Furthermore, the layer 790 includes one or more of a layer containing a substance having a high electron-injection property (electron-injection layer), a layer containing a substance having a high electron-transport property (electron-transport layer), and a layer containing a substance having a high hole-blocking property (hole-blocking layer). In the case where the lower electrode 761 is a cathode and the upper electrode 762 is an anode, the structures of the layer 780 and the layer 790 are interchanged.

The structure including the layer 780, the light-emitting layer 771, and the layer 790, which is provided between the pair of electrodes, can function as a single light-emitting unit, and the structure in FIG. 27A is referred to as a single structure in this specification.

FIG. 27B is a variation example of the EL layer 763 included in the light-emitting device illustrated in FIG. 27A. Specifically, the light-emitting device illustrated in FIG. 27B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layered structure, carriers can be efficiently injected to the light-emitting layer 771, and the efficiency of the recombination of carriers in the light-emitting layer 771 can be enhanced.

Note that structures in which a plurality of light-emitting layers (light-emitting layers 771, 772, and 773) are provided between the layer 780 and the layer 790 as illustrated in FIGS. 27C and 27D are variations of a single structure. Although FIGS. 27C and 27D each illustrate an example in which three light-emitting layers are included, the number of light-emitting layers in the light-emitting device having a single structure may be two or four or more. The light-emitting device having a single structure may include a buffer layer between two light-emitting layers.

A structure in which a plurality of light-emitting units (light-emitting units 763a and 763b) are connected in series through a charge-generation layer 785 (also referred to as an intermediate layer) as illustrated in FIGS. 27E and 27F is referred to as a tandem structure in this specification. The tandem structure may be referred to as a stack structure. The tandem structure enables a light-emitting device capable of high-luminance light emission. Furthermore, the tandem structure allows the amount of current needed for obtaining the same luminance to be reduced as compared to the case of using a single structure, and thus can improve the reliability.

Note that FIGS. 27D and 27F each illustrate an example in which the display apparatus includes a layer 764 overlapping with the light-emitting device. FIG. 27D is an example in which the layer 764 overlaps with the light-emitting device illustrated in FIG. 27C and FIG. 27F illustrates an example in which the layer 764 overlaps with the light-emitting device illustrated in FIG. 27E.

A color conversion layer or a color filter (a coloring layer), or both can be used as the layer 764.

In FIGS. 27C and 27D, light-emitting substances that emit light of the same color or the same light-emitting substance may be used for the light-emitting layers 771, 772, and 773. For example, a light-emitting substance that emits blue light may be used for the light-emitting layers 771, 772, and 773. In a subpixel that emits blue light, blue light from the light-emitting device can be extracted. In each of a subpixel that emits red light and a subpixel that emits green light, a color conversion layers is provided as the layer 764 illustrated in FIG. 27D, whereby blue light emitted from light-emitting device can be converted into light with a longer wavelength and thus red light or green light can be extracted.

Alternatively, light-emitting substances that emit light of different colors may be used for the light-emitting layers 771, 772, and 773. White light is obtained when the light-emitting layers 771, 772, and 773 emit light of complementary colors. The light-emitting device having a single structure preferably includes a light-emitting layer containing a light-emitting substance emitting blue light and a light-emitting layer containing a light-emitting substance emitting visible light with a longer wavelength than blue light, for example.

In the case where the light-emitting device having a single structure includes three light-emitting layers, for example, a light-emitting layer containing a light-emitting substance emitting red (R) light, a light-emitting layer containing a light-emitting substance emitting green (G) light, and a light-emitting layer containing a light-emitting substance emitting blue (B) light are preferably included. The stacking order of the light-emitting layers can be RGB or RBG from an anode side, for example. In this case, a buffer layer may be provided between R and G or between R and B.

For example, in the case where the light-emitting device with a single structure includes two light-emitting layers, the light-emitting device preferably includes a light-emitting layer containing a light-emitting substance emitting blue (B) light and a light-emitting layer containing a light-emitting substance emitting yellow (Y) light. This structure may be referred to as a device with a BY single structure.

A coloring layer may be provided as the layer 764 illustrated in FIG. 27D. When white light passes through the coloring layer, light of a desired color can be obtained.

In the light-emitting device that emits white light, two or more kinds of light-emitting substances are preferably contained. To obtain white light emission, two or more kinds of light-emitting substances are selected so as to emit light of complementary colors. For example, when emission colors of a first light-emitting layer and a second light-emitting layer are complementary colors, the light-emitting device can emit white light as a whole. The same applies to a light-emitting device including three or more light-emitting layers.

In FIGS. 27E and 27F, light-emitting substances that emit light of the same color or the same light-emitting substance may be used for the light-emitting layers 771 and 772.

For example, in light-emitting devices included in subpixels emitting light of different colors, a light-emitting substance that emits blue light can be used for each of the light-emitting layer 771 and the light-emitting layer 772. In a subpixel that emits blue light, blue light from the light-emitting device can be extracted. In each of the subpixel that emits red light and the subpixel that emits green light, a color conversion layer is provided as the layer 764 illustrated in FIG. 27F for converting blue light from the light-emitting device into light with a longer wavelength, so that red light or green light can be extracted.

In the case where light-emitting devices with the structure illustrated in FIG. 27E or FIG. 27F are used in subpixels emitting light of different colors, light-emitting substances may be different between the subpixels. Specifically, in the light-emitting device included in the subpixel emitting red light, a light-emitting substance that emits red light can be used for each of the light-emitting layers 771 and 772. In the light-emitting device included in the subpixel emitting green light, a light-emitting substance that emits green light can be used for each of the light-emitting layers 771 and 772. In the light-emitting device included in the subpixel emitting blue light, a light-emitting substance that emits blue light can be used for each of the light-emitting layers 771 and 772. A display apparatus with such a structure includes a light-emitting device with a tandem structure and can be regarded as an SBS structure. Thus, the display apparatus can have advantages of both of a tandem structure and an SBS structure. Accordingly, a highly reliable light-emitting device capable of high-luminance light emission can be provided.

In FIGS. 27E and 27F, light-emitting substances that emit light of different colors may be used for the light-emitting layers 771 and 772. White light is obtained when the light-emitting layers 771 and 772 emit light of complementary colors. A coloring layer may be provided as the layer 764 illustrated in FIG. 27F. When white light passes through the coloring layer, light of a desired color can be obtained.

Although FIGS. 27E and 27F each illustrate an example in which the light-emitting unit 763a includes one light-emitting layer 771 and the light-emitting unit 763b includes one light-emitting layer 772, one embodiment of the present invention is not limited to example. Each of the light-emitting unit 763a and the light-emitting unit 763b may include two or more light-emitting layers.

Although FIGS. 27E and 27F each illustrate the example of the light-emitting device including two light-emitting units, one embodiment of the present invention is not limited to the example. The light-emitting device may include three or more light-emitting units.

Figure 28A:
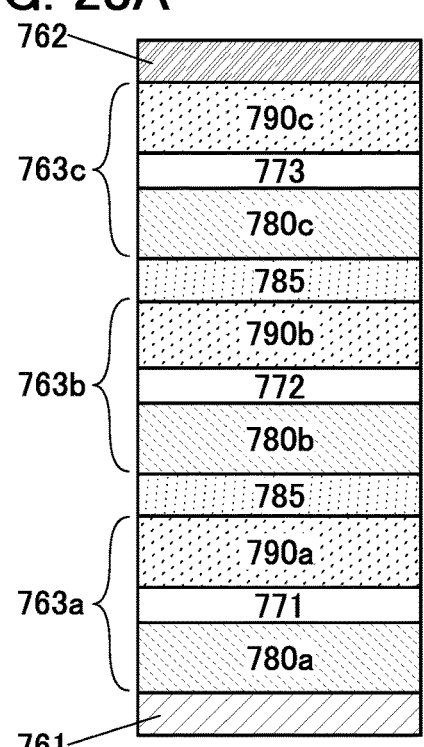
FIGS. 28A to 28C each illustrate a structure example of a light-emitting device.
Figure 28B:
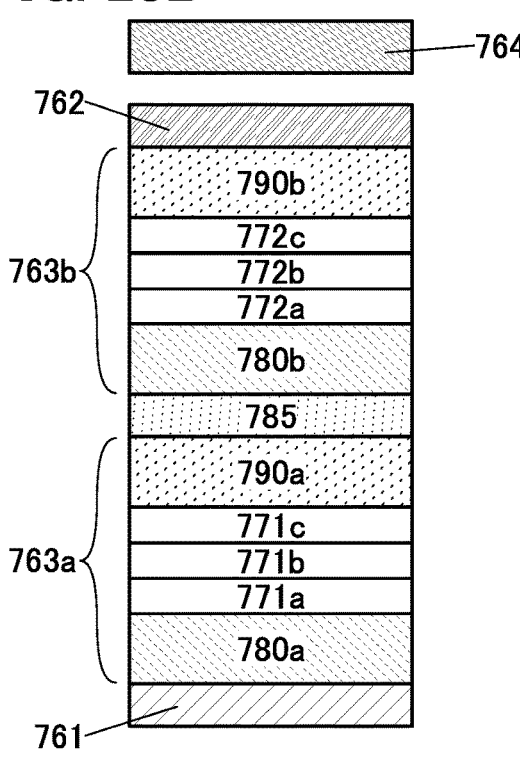
Figure 28C:
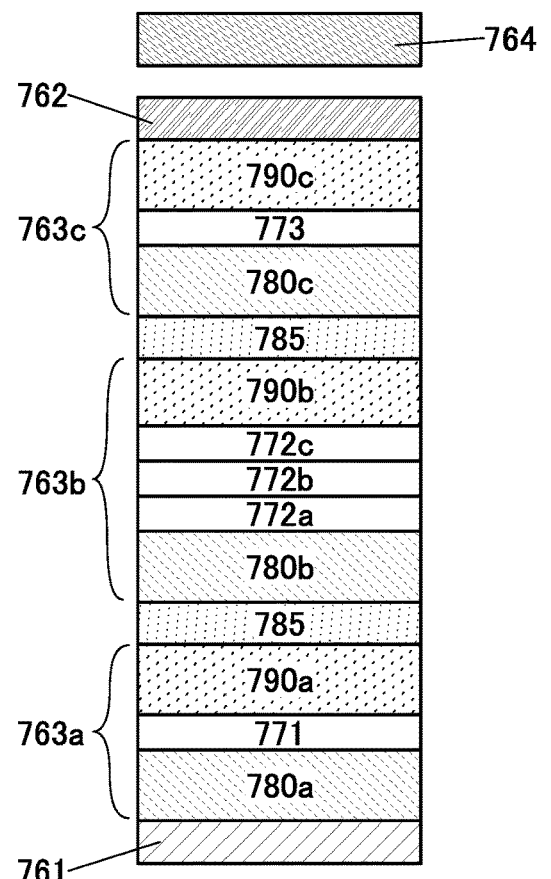

Specifically, the light-emitting device can have any of structures illustrated in FIGS. 28A to 28C.

FIG. 28A illustrates a structure including three light-emitting units. Note that a structure including two light-emitting units and a structure including three light-emitting units may be referred to as a two-unit tandem structure and a three-unit tandem structure, respectively.

Specifically, in the structure illustrated in FIG. 28A, a plurality of light-emitting units (the light-emitting units 763a, 763b, and 763c) are connected in series through the charge-generation layers 785. The light-emitting unit 763a includes a layer 780a, the light-emitting layer 771, and a layer 790a. The light-emitting unit 763b includes a layer 780b, the light-emitting layer 772, and a layer 790b. The light-emitting unit 763c includes a layer 780c, the light-emitting layer 773, and a layer 790c.

In FIG. 28A, the light-emitting layers 771, 772, and 773 each preferably contain a light-emitting substance that emits light of the same color. Specifically, the light-emitting layers 771, 772, and 773 can each contain a light-emitting substance that emits red (R) light (i.e., an \R\R\R three-unit tandem structure), can each contain a light-emitting substance that emits green (G) light (i.e., a G\G\G three-unit tandem structure), or can each contain a light-emitting substance that emits blue (B) light (i.e., a B\B\B three-unit tandem structure).

Note that the structures of the light-emitting substances that emit light of the same color are not limited to the above structure. For example, a light-emitting device may have a tandem structure in which light-emitting units each containing a plurality of light-emitting substances are stacked as illustrated in FIG. 28B. FIG. 28B illustrates a structure in which a plurality of light-emitting units (light-emitting units 763a and 763b) are connected in series with the charge-generation layer 785 therebetween. The light-emitting unit 763a includes the layer 780a, a light-emitting layer 771a, a light-emitting layer 771b, a light-emitting layer 771c, and the layer 790a. The light-emitting unit 763b includes the layer 780b, a light-emitting layer 772a, a light-emitting layer 772b, a light-emitting layer 772c, and the layer 790b.

In the structure illustrated in FIG. 28B, light-emitting substances for the light-emitting layers 771a, 771b, and 771c are selected so as to emit light of complementary colors for white (W) light emission. Furthermore, light-emitting substances for the light-emitting layers 772a, 772b, and 772c are selected so as to emit light of complementary colors for white (W) light emission. That is, the structure illustrated in FIG. 28C is a two-unit tandem structure of W\W. Note that there is no particular limitation on the stacking order of the light-emitting layers 771a, 771b, and 771c containing light-emitting substances that emit light of complementary colors. The practitioner can select the optimal stacking order as appropriate. Although not illustrated, a three-unit tandem structure of W\W\W or a tandem structure with four or more units may be employed.

Other examples of the structure of a light-emitting device having a tandem structure include a MY two-unit tandem structure including a light-emitting unit that emits yellow (Y) light and a light-emitting unit that emits blue (B) light; an RG\B two-unit tandem structure including a light-emitting unit that emits red (R) light and green (G) light and a light-emitting unit that emits blue (B) light; a B\Y\B three-unit tandem structure including a light-emitting unit that emits blue (B) light, a light-emitting unit that emits yellow (Y) light, and a light-emitting unit that emits blue (B) light in this order; a B\YG\B three-unit tandem structure including a light-emitting unit that emits blue (B) light, a light-emitting unit that emits yellow green (YG) light, and a light-emitting unit that emits blue (B) light in this order; and a B\G\B three-unit tandem structure including a light-emitting unit that emits blue (B) light, a light-emitting unit that emits green (G) light, and a light-emitting unit that emits blue (B) light in this order.

Alternatively, a light-emitting unit containing one light-emitting substance and a light-emitting unit containing a plurality of light-emitting substances may be used in combination as illustrated in FIG. 28C.

Specifically, in the structure illustrated in FIG. 28C, a plurality of light-emitting units (the light-emitting units 763a, 763b, and 763c) are connected in series with the charge-generation layer 785 provided between each two light-emitting units. The light-emitting unit 763a includes the layer 780a, the light-emitting layer 771, and the layer 790a. The light-emitting unit 763b includes the layer 780b, the light-emitting layer 772a, the light-emitting layer 772b, the light-emitting layer 772c, and the layer 790b. The light-emitting unit 763c includes the layer 780c, the light-emitting layer 773, and the layer 790c.

The structure illustrated in FIG. 28C can be, for example, a three-unit tandem structure of B\G·Y·G\B in which the light-emitting unit 763a is a light-emitting unit that emits blue (B) light, the light-emitting unit 763b is a light-emitting unit that emits red (R), green (G), and yellow-green (YG) light, and the light-emitting unit 763c is a light-emitting unit that emits blue (B) light.

Examples of the stacked structure of light-emitting units include, from an anode side, a two-unit structure of B and Y; a two-unit structure of B and a light-emitting unit X; a three-unit structure of B, Y, and B; and a three-unit structure of B, X, and B. Examples of the stacked structure of light-emitting layers in the light-emitting unit X include, from an anode side, a two-layer structure of R and Y; a two-layer structure of R and G; a two-layer structure of G and R; a three-layer structure of G, R, and G; and a three-layer structure of R, G, and R. Another layer may be provided between two light-emitting layers.

In FIGS. 27C and 27D, the layers 780 and 790 may each have a stacked-layer structure of two or more layers as illustrated in FIG. 27B.

In FIGS. 27E and 27F, the light-emitting unit 763a includes the layer 780a, the light-emitting layer 771, and the layer 790a, and the light-emitting unit 763b includes the layer 780b, the light-emitting layer 772, and the layer 790b.

In the case where the lower electrode 761 is an anode and the upper electrode 762 is a cathode, the layers 780a and 780b each include one or more of a hole-injection layer, a hole-transport layer, and an electron-blocking layer. Furthermore, the layers 790a and 790b each include one or more of an electron-injection layer, an electron-transport layer, and a hole-blocking layer. In the case where the lower electrode 761 is the cathode and the upper electrode 762 is the anode, the above structures of the layer 780a and the layer 790a are switched, and the above structures of the layer 780b and the layer 790b are switched.

In the case where the lower electrode 761 is the anode and the upper electrode 762 is the cathode, for example, the layer 780a includes a hole-injection layer and a hole-transport layer over the hole-injection layer and may also include an electron-blocking layer over the hole-transport layer. The layer 790a includes an electron-transport layer and may also include a hole-blocking layer between the light-emitting layer 771 and the electron-transport layer. The layer 780b includes a hole-transport layer and may also include an electron-blocking layer over the hole-transport layer. The layer 790b includes an electron-transport layer and an electron-injection layer over the electron-transport layer and may also include a hole-blocking layer between the light-emitting layer 772 and the electron-transport layer. In the case where the lower electrode 761 is the cathode and the upper electrode 762 is the anode, for example, the layer 780a includes an electron-injection layer and an electron-transport layer over the electron-injection layer and may also include a hole-blocking layer over the electron-transport layer. The layer 790a includes a hole-transport layer and may also include an electron-blocking layer between the light-emitting layer 771 and the hole-transport layer. The layer 780b includes an electron-transport layer and may also include a hole-blocking layer over the electron-transport layer. The layer 790b includes a hole-transport layer and a hole-injection layer over the hole-transport layer and may also include an electron-blocking layer between the light-emitting layer 772 and the hole-transport layer.

In the case of fabricating a light-emitting device having a tandem structure, two light-emitting units are stacked with the charge-generation layer 785 positioned therebetween. The charge-generation layer 785 includes at least a charge-generation region. The charge-generation layer 785 has a function of injecting electrons into one of the two light-emitting units and injecting holes to the other when voltage is applied between the pair of electrodes.

Next, materials that can be used for the light-emitting device will be described.

A conductive film transmitting visible light is used for the electrode through which light is extracted, which is either the lower electrode 761 or the upper electrode 762. A conductive film reflecting visible light is preferably used for the electrode through which light is not extracted. In the case where the display apparatus includes a light-emitting device emitting infrared light, a conductive film transmitting visible light and infrared light is used for the electrode through which light is extracted, and a conductive film reflecting visible light and infrared light is preferably used for the electrode through which light is not extracted.

A conductive film that transmits visible light may be used also as the electrode through which light is not extracted. In that case, the electrode is preferably provided between a reflective layer and the EL layer 763. In other words, light emitted from the EL layer 763 may be reflected by the reflective layer to be extracted from the display apparatus.

As a material for the pair of electrodes of the light-emitting device, a metal, an alloy, an electrically conductive compound, a mixture thereof, or the like can be used as appropriate. Specific examples of the material include metals such as aluminum, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing appropriate combination of any of these metals. Other examples of the material include an indium tin oxide (In—Sn oxide, also referred to as ITO), an In—Si—Sn oxide (also referred to as ITSO), an indium zinc oxide (In—Zn oxide), and an In—W—Zn oxide. Other examples of the material include an alloy containing aluminum (aluminum alloy) such as an alloy of aluminum, nickel, and lanthanum (Al—Ni—La), and an alloy of silver, palladium, and copper (Ag—Pd—Cu, also referred to as APC). Other examples of the material include an element belonging to Group 1 or Group 2 of the periodic table that is not described above (e.g., lithium, cesium, calcium, or strontium), a rare earth metal such as europium or ytterbium, an alloy containing an appropriate combination of any of these elements, and graphene.

The light-emitting device preferably employs a microcavity structure. Therefore, one of the pair of electrodes of the light-emitting device is preferably an electrode having properties of transmitting and reflecting visible light (transflective electrode), and the other is preferably an electrode having a property of reflecting visible light (reflective electrode). When the light-emitting device has a microcavity structure, light obtained from the light-emitting layer can be resonated between the electrodes, whereby light emitted from the light-emitting device can be intensified.

Note that the transflective electrode can have a stacked-layer structure of a conductive layer that can be used as a reflective electrode and a conductive layer that can be used as an electrode having a property of transmitting visible light (also referred to as a transparent electrode).

The transparent electrode has a light transmittance higher than or equal to 40%. For example, an electrode having a visible light (light with wavelengths greater than or equal to 400 nm and less than 750 nm) transmittance higher than or equal to 40% is preferably used in the transparent electrode of the light-emitting device. The transflective electrode has a visible light reflectivity higher than or equal to 10% and lower than or equal to 95%, preferably higher than or equal to 30% and lower than or equal to 80%. The reflective electrode has a visible light reflectivity higher than or equal to 40% and lower than or equal to 100%, preferably higher than or equal to 70% and lower than or equal to 100%. These electrodes preferably have a resistivity lower than or equal to $1 \times 10^{-2}$ Ωcm.

The light-emitting device includes at least a light-emitting layer. In addition to the light-emitting layer, the light-emitting device may further include a layer containing any of a substance having a high hole-injection property, a substance having a high hole-transport property, a hole-blocking material, a substance having a high electron-transport property, an electron-blocking material, a substance having a high electron-injection property, a substance having a bipolar property (a substance with a high electron- and hole-transport property), and the like. For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

The light-emitting layer can contain one or more kinds of light-emitting substances. As the light-emitting substance, a substance whose emission color is blue, violet, bluish violet, green, yellowish green, yellow, orange, red, or the like is appropriately used. Furthermore, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (specifically an iridium complex) having a 4H-triazole skeleton, a 1H-triazole skeleton, an imidazole skeleton, a pyrimidine skeleton, a pyrazine skeleton, or a pyridine skeleton; an organometallic complex (specifically an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a substance with a high hole-transport property (hole-transport material) and a substance with a high electron-transport property (electron-transport material) can be used. As the hole-transport material, a later-described material having a high hole-transport property that can be used for the hole-transport layer can be used. As the electron-transport material, a later-described material having a high electron-transport property that can be used for the electron-transport layer can be used. In addition, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex—triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

The hole-injection layer injects holes from the anode to the hole-transport layer and contains a material having a high hole-injection property. Examples of a material having a high hole-injection property include an aromatic amine compound and a composite material containing a hole-transport material and an acceptor material (electron-accepting material).

As the hole-transport material, a later-described material having a high hole-transport property that can be used for the hole-transport layer can be used.

As the acceptor material, for example, an oxide of a metal belonging to any of Group 4 to Group 8 of the periodic table can be used. Specific examples include molybdenum oxide, vanadium oxide, niobium oxide, tantalum oxide, chromium oxide, tungsten oxide, manganese oxide, and rhenium oxide. Among these, molybdenum oxide is especially preferable since it is stable in the air, has a low hygroscopic property, and is easy to handle. Furthermore, an organic acceptor material containing fluorine can be used. In addition, organic acceptor materials such as a quinodimethane derivative, a chloranil derivative, and a hexaazatriphenylene derivative can be used.

As the material having a high hole-injection property, a material containing a hole-transport material and the above-described oxide of a metal belonging to Group 4 to Group 8 of the periodic table (typified by molybdenum oxide) may be used, for example.

The hole-transport layer transports holes injected from the anode by the hole-injection layer, to the light-emitting layer. The hole-transport layer contains a hole-transport material. The hole-transport material preferably has a hole mobility higher than or equal to $1 \times 10^{-6}$ cm$^2$/Vs. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-blocking layer is provided in contact with the light-emitting layer. The electron-blocking layer is a layer having a hole-transport property and containing a material that can block an electron. Among the above-described hole-transport materials, a material having an electron-blocking property can be used for the electron-blocking layer.

Since the electron-blocking layer has a hole-transport property, the electron-blocking layer can also be referred to as a hole-transport layer. Among hole-transport layers, a layer having an electron-blocking property can also be referred to as an electron-blocking layer.

The electron-transport layer transports electrons injected from the cathode by the electron-injection layer, to the light-emitting layer. The electron-transport layer contains an electron-transport material. The electron-transport material preferably has an electron mobility higher than or equal to $1 \times 10^{-6}$ cm$^2$/Vs. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a n-electron deficient heteroaromatic compound such as a nitrogen-containing heteroaromatic compound.

The hole-blocking layer is provided in contact with the light-emitting layer. The hole-blocking layer is a layer having an electron-transport property and containing a material that can block a hole. Among the above-described electron-transport materials, a material having a hole-blocking property can be used for the hole-blocking layer.

Since the hole-blocking layer has an electron-transport property, the hole-blocking layer can also be referred to as an electron-transport layer. Among electron-transport layers, a layer having a hole-blocking property can also be referred to as a hole-blocking layer.

The electron-injection layer injects electrons from the cathode to the electron-transport layer and contains a material having a high electron-injection property. As the material with a high electron-injection property, an alkali metal, an alkaline earth metal, or a compound thereof can be used. As the material having a high electron-injection property, a composite material containing an electron-transport material and a donor material (electron-donating material) can also be used.

The LUMO level of the material having a high electron-injection property preferably has a small difference (specifically, 0.5 eV or less) from the work function of a material for the cathode.

The electron-injection layer can be formed using an alkali metal, an alkaline earth metal, or a compound thereof, such as lithium, cesium, ytterbium, lithium fluoride (LiF), cesium fluoride (CsF), calcium fluoride (CaF$_x$, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate, for example. The electron-injection layer may have a stacked-layer structure of two or more layers. As an example of the stacked-layer structure, a structure in which lithium fluoride is used for the first layer and ytterbium is used for the second layer is given.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of the organic compound having an unshared electron pair is preferably greater than or equal to $-3.6$ eV and less than or equal to $-2.3$ eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

As described above, the charge-generation layer includes at least a charge-generation region. The charge-generation region preferably contains an acceptor material. For example, the charge-generation region preferably contains the above-described hole-transport material and acceptor material that can be used for the hole-injection layer.

The charge-generation layer preferably includes a layer containing a material having a high electron-injection property. The layer can also be referred to as an electron-injection buffer layer. The electron-injection buffer layer is preferably provided between the charge-generation region and the electron-transport layer. The electron-injection buffer layer can reduce an injection barrier between the charge-generation region and the electron-transport layer; thus, electrons generated in the charge-generation region can be easily injected into the electron-transport layer.

The electron-injection buffer layer preferably contains an alkali metal or an alkaline earth metal, and can contain an alkali metal compound or an alkaline earth metal compound, for example. Specifically, the electron-injection buffer layer preferably contains an inorganic compound containing an alkali metal and oxygen or an inorganic compound containing an alkaline earth metal and oxygen, and further preferably contains an inorganic compound containing lithium and oxygen (e.g., lithium oxide (Li$_2$O)). In addition, any of materials that can be used for the electron-injection layer can be favorably used for the electron-injection buffer layer.

The charge-generation layer preferably includes a layer containing a material having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing an interaction between the charge-generation region and the electron-injection buffer layer (or the electron-transport layer) and transferring electrons smoothly.

For the electron-relay layer, a phthalocyanine-based material such as copper(II) phthalocyanine (abbreviation: CuPc), or a metal complex having a metal-oxygen bond and an aromatic ligand is preferably used.

Note that the charge-generation region, the electron-injection buffer layer, and the electron-relay layer cannot be clearly distinguished from one another depending on the cross-sectional shape or properties in some cases.

The charge-generation layer may contain a donor material instead of an acceptor material. For example, the charge-generation layer may include a layer containing the above-described electron-transport material and donor material that can be used for the electron-injection layer.

When the charge-generation layer is provided between two light-emitting units stacked, an increase in driving voltage can be inhibited.

FIGS. 29A to 29E illustrate a structure example of the light-receiving device that can be used in the display apparatus. In the components illustrated in FIGS. 29A to 29E, components similar to the components in FIGS. 27A to 27F are denoted by the same reference numerals.

As illustrated in FIG. 29A, the light-receiving device includes a PS layer 787 between a pair of electrodes (the lower electrode 761 and the upper electrode 762). The lower electrode 761 functions as a pixel electrode and is provided in each light-receiving device. The electrode 762 functions as a common electrode and is shared by a plurality of light-emitting devices and the light-receiving device.

The PS layer 787 illustrated in FIG. 29A can be formed as an island-shaped layer. In other words, the PS layer 787 illustrated in FIG. 29A corresponds to the layer 113$d$ in FIG. 1B and the like. Note that the light-receiving device corresponds to the light-receiving device 150. Furthermore, the lower electrode 761 corresponds to the pixel electrode 111$d$. The upper electrode 762 corresponds to the common electrode 115.

The PS layer 787 includes the layers 781 and 782, the photoelectric conversion layer 783, the layers 791 and 792, and the like. The layers 781, 782, 791, 792 and the like are similar to those used for the light-emitting device. Here, the layer 792 and the upper electrode 762 can be provided in common for the light-emitting device and the light-receiving device.

The photoelectric conversion layer 783 includes a semiconductor. Examples of the semiconductor include an inorganic semiconductor such as silicon and an organic semiconductor including an organic compound. This embodiment shows an example in which an organic semiconductor is used as the semiconductor included in the photoconversion layer 783. The use of an organic semiconductor is preferable because the light-emitting layer and the photoconversion layer 783 can be formed by the same method (e.g., a vacuum evaporation method) and thus a manufacturing apparatus can be shared.

As the photoelectric conversion layer 783, a PN photodiode or a PIN photodiode can be used, for example. An n-type semiconductor material and a p-type semiconductor material that can be used as the photoelectric conversion layer 783 are described below. The n-type semiconductor material and the p-type semiconductor material may be formed as layers to be stacked or may be mixed to form one layer.

Examples of an n-type semiconductor material included in the photoelectric conversion layer 783 include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads on a plane as in benzene, an electron-donating property (donor property) usually increases; however, fullerene has a spherical shape, and thus has a high electron-accepting property although π-electron conjugation widely spread therein. The high electron-accepting property efficiently causes rapid charge separation and thus is useful for light-receiving devices. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Other examples of fullerene derivatives include [6,6]-phenyl-$C_{71}$-butyric acid methyl ester (abbreviation: PC70BM), [6,6]-phenyl-$C_{61}$-butyric acid methyl ester (abbreviation: PC60BM), and 1',1'',4',4''-tetrahydro-di[1,4]methanonaphthaleno[1,2:2',3',56,60:2'',3''][5,6]fullerene-$C_{60}$ (abbreviation: ICBA).

Another example of an n-type semiconductor material includes a perylenetetracarboxylic derivative such as N,N'-dimethyl-3,4,9,10-perylenetetracarboxylic diimide (abbreviation: Me-PTCDI).

Another example of an n-type semiconductor material is 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the photoelectric conversion layer 783 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolo-carbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the photoelectric conversion layer 783 is preferably formed by co-evaporation of an n-type semiconductor and a p-type semiconductor. Alternatively, the photoelectric conversion layer 783 may be formed by stacking an n-type semiconductor and a p-type semiconductor.

Either a low molecular compound or a high molecular compound can be used for the light-emitting devices and the light-receiving device, and an inorganic compound may also be included. Each of the layers included in the light-emitting devices and the light-receiving device can be formed by any of the following methods: an evaporation method (including a vacuum evaporation method), a transfer method, a printing method, an inkjet method, a coating method, and the like.

As the hole-transport material or the electron-blocking material, a high molecular compound such as poly(3,4-ethylenedioxythiophene)/poly(styrenesulfonic acid) (PE-DOT/PSS), or an inorganic compound such as a molybdenum oxide or copper iodide (CuT) can be used, for example. As the electron-transport material or the hole-blocking material, an inorganic compound such as zinc oxide (ZnO), or an organic compound such as polyethylenimine ethoxylate (PETE) can be used. The light-receiving device may include a mixed film of PETE and ZnO, for example.

For the photoelectric conversion layer 783, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The photoelectric conversion layer 783 may contain a mixture of three or more kinds of materials. For example, a third material may be mixed with an n-type semiconductor material and a p-type semiconductor material in order to extend the wavelength range. In this case, the third material may be a low molecular compound or a high molecular compound.

As illustrated in FIG. 29A, the layer 781 (hole-injection layer), the layer 782 (hole-transport layer), the photoelectric conversion layer 783, the layer 791 (electron-transport layer), and the layer 792 (electron-injection layer) are stacked in this order in the PS layer 787. This stacking order is the same as the stacking order of the EL layer 763 illustrated in FIG. 27B. In this case, the lower electrode 761 can function as an anode and the upper electrode 762 can function as a cathode in any of the light-emitting devices and the light-receiving device. In other words, the light-receiving device is driven by application of reverse bias between the lower electrode 761 and the upper electrode 762, whereby light incident on the light-receiving device can be sensed and electric charges can be generated and extracted as current.

However, the present invention is not limited thereto. For example, the layer 781 may include an electron-injection layer, the layer 782 may include an electron-transport layer, the layer 791 may include a hole-transport layer, and the layer 792 may include a hole-injection layer. In that case, in the light-receiving device, the lower electrode 761 functions as a cathode and the upper electrode 762 can function as an anode. As described in the above embodiment, the light-emitting devices and the light-receiving device can be separately formed in the present invention. Therefore, even when the structures of the light-emitting devices are greatly different from the structure of the light-receiving device, the light-emitting devices and the light-receiving device can be easily manufactured.

It is not always necessary to provide all of the layers 781, 782, 791, and 792 illustrated in FIG. 29A. For example, the layer 782 including a hole-injection layer may be in contact with the lower electrode 761 as illustrated in FIG. 29B without providing the layer 781 including a hole-injection layer. Note that as illustrated in FIGS. 29A and 29B, at least one of the layer 782 including a hole-transport layer and the layer 791 including an electron-transport layer is preferably provided in contact with the photoelectric conversion layer 783. Thus, in the light-receiving device, leakage current is generated between the lower electrode 761 and the upper electrode 762, so that a reduction in the sensitivity of imaging can be inhibited.

Furthermore, either one of the layers 782 and 791 may be omitted. For example, the photoelectric conversion layer 783 may be in contact with the layer 792 without providing the layer 791 including an electron-transport layer as illustrated in FIG. 29C.

Moreover, the PS layer 787 can include only the photoelectric conversion layer 783. For example, the photoelectric conversion layer 783 may be in contact with the lower electrode 761, without formation of the layer 782 including a hole-transport layer as illustrated in FIG. 29D.

In addition, in the case where the layer 792 is provided for each light-emitting device without being formed as a common layer, the layer 792 in the light-receiving device can be omitted. For example, the photoelectric conversion layer 783 may be in contact with the upper electrode 762, without formation of the layer 792 including an electron-injection layer as illustrated in FIG. 29E.

This embodiment can be combined with any of the other embodiments as appropriate.

Embodiment 7

In this embodiment, electronic devices of embodiments of the present invention will be described with reference to FIGS. 30A to 30D, FIGS. 31A to 31D, and FIGS. 32A to 32G.

Electronic devices of this embodiment include the display apparatus of one embodiment of the present invention in their display portions. The display apparatus of one embodiment of the present invention can be easily increased in resolution and definition and can achieve high display quality. Thus, the display apparatus of one embodiment of the present invention can be used for display portions of a variety of electronic devices. As described in the above embodiment, the display apparatus of one embodiment of the present invention can have a high aperture ratio and can be equipped with a touch sensor.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, the display apparatus of one embodiment of the present invention can have high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display apparatus of one embodiment of the present invention is preferably higher than or equal to 100 ppi, further preferably higher than or equal to 300 ppi, further preferably higher than or equal to 500 ppi, further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. The use of the display apparatus having one or both of such high definition and high resolution can further increase realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 30A:
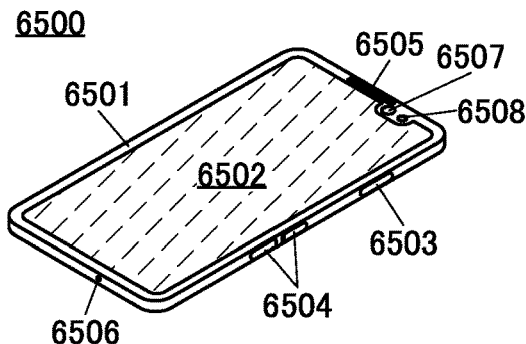
FIGS. 30A to 30D illustrate examples of electronic devices.

An electronic device 6500 illustrated in FIG. 30A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 30B:
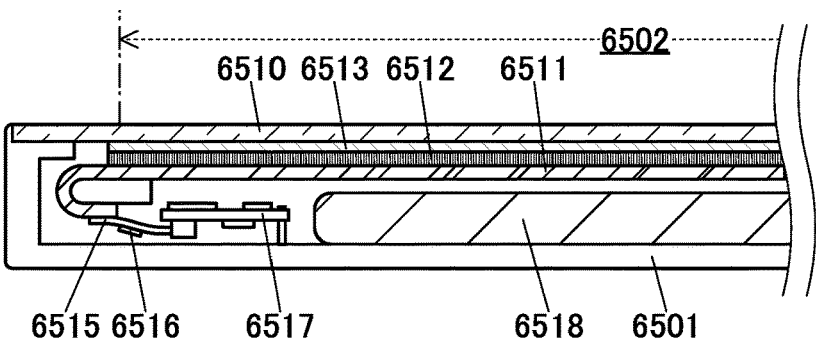

FIG. 30B is a schematic cross-sectional view including an end portion of the housing 6501 on the microphone 6506 side.

A protection member 6510 having a light-transmitting property is provided on the display surface side of the housing 6501. A display apparatus 6511, an optical member 6512, a touch sensor panel 6513, a printed circuit board 6517, a battery 6518, and the like are provided in a space surrounded by the housing 6501 and the protection member 6510. In the case where a touch sensor is built in the display portion 6502 as described in the above embodiments, the touch sensor panel 6513 can be omitted.

The display apparatus 6511, the optical member 6512, and the touch sensor panel 6513 are fixed to the protection member 6510 with an adhesive layer (not illustrated).

Part of the display apparatus 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display apparatus 6511. Thus, an extremely lightweight electronic device can be achieved. Since the display apparatus 6511 is extremely thin, the battery 6518 with high capacity can be mounted without an increase in the thickness of the electronic device. Moreover, part of the display apparatus 6511 is folded back so that a connection portion with the FPC 6515 is provided on the back side of the pixel portion, whereby an electronic device with a narrow bezel can be provided.

Figure 30C:
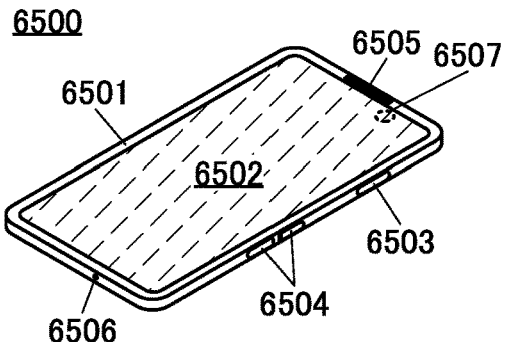
Figure 30D:
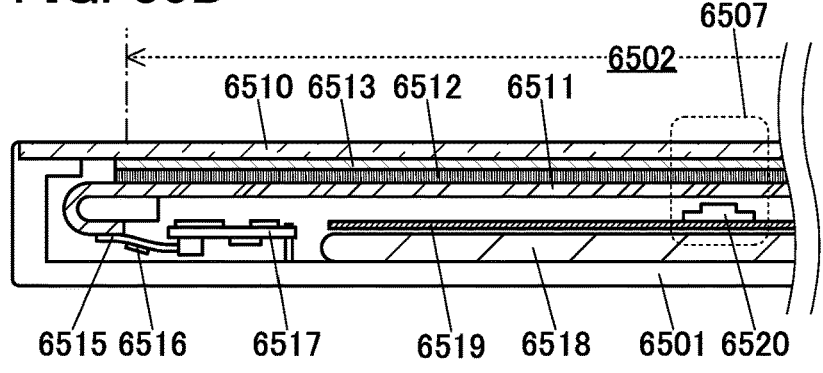

In the example of the electronic device 6500 illustrated in FIGS. 30A and 30B, the camera 6507 is placed in a notch provided in the display portion 6502, but the present invention is not limited to the example. As illustrated in FIGS. 30C and 30D, the camera 6507 may be provided to overlap with the display portion 6502. Note that FIGS. 30C and 30D correspond to FIGS. 30A and 30B, respectively and the description of FIGS. 30A and 30B can be referred to for components represented by the same reference numerals.

As illustrated in FIG. 30D, a housing 6519 may be provided over the battery 6518, and a sensor portion 6520 included in the camera 6507 may be provided over the housing 6519. As the sensor portion 6520, a package including an image sensor chip or a sensor module can be used, for example. The specific structure of the sensor portion 6520 will be described in an embodiment below. By the camera 6507, the user can take an image as the user sees on the display portion 6502. In addition, personal authentication can be performed by taking an image of the face of the user.

Here, the display apparatus in FIG. 6A or FIG. 6B is preferably used for the display portion 6502. As described above, the display apparatus illustrated in FIG. 6A or FIG. 6B can suppress reflection of external light without using an optical component such as a circularly polarizing plate. Thus, at least part of the optical member 6512 (e.g., a circularly polarizing plate) can be omitted in the electronic device 6500. With such a structure, light entering the sensor portion 6520 can be prevented from being attenuated by the circularly polarizing plate or the like. Thus, even when the sensor portion 6520 is placed below the display portion 6502, satisfactory sensing is possible.

Moreover, the number of pixels in a region overlapping with the sensor portion 6520 in the display portion 6502 may be reduced. Such a structure can increase the intensity of light entering the sensor portion 6520 and improve the sensitivity of sensing.

The sensor portion 6520 is preferably fixed to the housing 6519. When the light-receiving portion of the sensor portion 6520 is fixed, more accurate sensing is possible. Note that the housing 6519 may be fixed to the housing 6501, or the housing 6519 may be unified with the housing 6501.

With the structure illustrated in FIGS. 30C and 30D, the camera 6507 can be built in the electronic device 6500, without providing a notch on the display portion 6502.

As illustrated in FIGS. 2A and 2B, finger authentication can be performed in the display portion 6502 according to one embodiment of the present invention. Thus, the electronic device 6500 can perform face authentication and finger authentication. With this structure, face authentication and finger authentication can be combined in accordance with the degree of security. For example, face authentication can be adopted for a normal level of security like unlocking a screen, and finger authentication can be adopted for a higher level of security like purchasing a thing.

FIG. 31A illustrates an example of a television set. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 31A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and images displayed on the display portion 7000 can be operated.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

FIG. 31B illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used for the display portion 7000.

FIGS. 31C and 31D illustrate examples of digital signage.

Digital signage 7300 illustrated in FIG. 31C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 31D illustrates digital signage 7400 attached to a cylindrical pillar 7401. The digital signage 7400 includes the display portion 7000 provided along a curved surface of the pillar 7401.

The display apparatus of one embodiment of the present invention can be used in the display portion 7000 illustrated in each of FIGS. 31C and 31D.

A larger area of the display portion 7000 can increase the amount of information that can be provided at a time. The display portion 7000 having a larger area attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 31C and 31D, it is preferable that the digital signage 7300 or the digital signage 7400 can work with an information terminal 7311 or an information terminal 7411, such as a smartphone of a user, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 32A to 32G include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 32A to 32G have a variety of functions. For example, the electronic device can have a function of displaying a variety of information (a still image, a moving image, a text image, and the like) on the display portion, a touch panel function, a function of displaying a calendar, date, time, and the like, a function of controlling processing with a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic device illustrated in FIGS. 32A to 32G are described in detail below.

FIG. 32A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 32A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

FIG. 32B is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 32C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

FIG. 32D is a perspective view illustrating a wrist-watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

FIGS. 32E to 32G are perspective views of a foldable portable information terminal 9201. FIG. 32E is a perspective view illustrating the portable information terminal 9201 that is opened. FIG. 32G is a perspective view illustrating the portable information terminal 9201 that is folded. FIG. 32F is a perspective view illustrating the portable information terminal 9201 that is shifted from one of the states in FIGS. 32E and 32G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

The display portion 9001 may include the display apparatus illustrated in FIG. 6A or FIG. 6B. Thus, the portable information terminal 9201 can be manufactured without an optical member such as a circularly polarizing plate provided on the display portion 9001. The curvature radius can be reduced by employing a structure without a circularly polarizing plate with a relatively large thickness for the display portion 9001.

This embodiment can be combined with any of the other embodiments as appropriate.

Embodiment 8

In this embodiment, examples of a package including an image sensor chip and a sensor module will be described.

The package including an image sensor chip and the sensor module can be used as the sensor portion 6520 or the like illustrated in FIG. 30D.

Here, the image sensor chip includes a pixel portion in which a plurality of light-receiving devices are arranged in a matrix, a driver circuit for controlling the pixel portion, and the like. For example, a photodiode in which a photoelectric conversion layer is formed in a silicon substrate can be used as the light-receiving device.

The photodiode can also be formed using a compound semiconductor. The use of the compound semiconductor, which can change the bandgap depending on the combination of constituent elements and the atomic ratio of the elements, enables formation of a photodiode having sensitivity to infrared light. For example, to form a photodiode having sensitivity to light from visible light to mid-infrared light, InGaAs or the like can be used for the photoelectric conversion layer.

FIG. 33A1 is an external perspective view of the top surface side of a package in which an image sensor chip is placed. The package includes a package substrate 610 to which an image sensor chip 650 is fixed, a cover glass 620, an adhesive 630 for bonding them, and the like.

FIG. 33A2 is an external perspective view of the bottom surface side of the package. A ball grid array (BGA) in which solder balls are used as bumps 640 on the bottom surface of the package is employed. Note that, without being limited to the BGA, a land grid array (LGA), a pin grid array (PGA), or the like may be employed.

FIG. 33A3 is a perspective view of the package, in which parts of the cover glass 620 and the adhesive 630 are not illustrated. Electrode pads 660 are formed over the package substrate 610, and the electrode pads 660 and the bumps 640 are electrically connected to each other via through-holes. The electrode pads 660 are electrically connected to the image sensor chip 650 through wires 670.

Furthermore, FIG. 33B1 is an external perspective view of the top surface side of a sensor module in which an image sensor chip is placed in a package with a built-in lens. The sensor module includes a package substrate 611 to which an image sensor chip 651 is fixed, a lens cover 621, a lens 635, and the like. Furthermore, an IC chip 690 having a function of a driver circuit, a signal conversion circuit, or the like of a light-receiving device is provided between the package substrate 611 and the image sensor chip 651; thus, the structure as a system in package (SiP) is formed.

FIG. 33B2 is an external perspective view illustrating the bottom surface side of the sensor module. A quad flat no-lead package (QFN) structure in which lands 641 for mounting are provided on the bottom surface and side surfaces of the package substrate 611 is employed. Note that this structure is only an example, and a quad flat package (QFP) or the above-mentioned BGA may also be provided.

FIG. 33B3 is a perspective view of the module, in which parts of the lens cover 621 and the lens 635 are not illustrated. The lands 641 are electrically connected to electrode pads 661, and the electrode pads 661 are electrically connected to the image sensor chip 651 or the IC chip 690 through wires 671.

The image sensor chip placed in a package having the above form can be easily mounted on a printed substrate or the like, and the image sensor chip can be incorporated into a variety of semiconductor devices and electronic devices.

Furthermore, noise may be generated in the output of the image sensor chip by interference of incident light. In this case, it is preferable to perform image processing on the output of the image sensor chip to reduce a noise. The image processing is performed by AI or the like, for example.

Note that this embodiment can be combined with any of the other embodiments in this specification as appropriate. This application is based on Japanese Patent Application Serial No. 2022-049798 filed with Japan Patent Office on Mar. 25, 2022, the entire contents of which are hereby incorporated by reference.

What is claimed is:

1. An imaging device comprising:
   a first light-receiving device comprising:
     a first pixel electrode;
     a first layer over the first pixel electrode;
     a first insulating layer covering a first part of the first layer; and
     a common electrode covering the first layer and the first insulating layer,
   wherein the first layer comprises a photoelectric conversion layer.

2. The imaging device according to claim 1, further comprising:
   a second light-receiving device comprising:
     a second pixel electrode adjacent to the first pixel electrode;
     a second layer over the second pixel electrode;
     the first insulating layer covering a first part of the second layer; and
     the common electrode covering the second layer,
   wherein the second layer comprises a photoelectric conversion layer.

3. The imaging device according to claim 1,
   wherein the first insulating layer comprises an inorganic material, and
   wherein the inorganic material comprises an oxide, a nitride, an oxynitride, or a nitride oxide.

4. The imaging device according to claim 1,
   wherein the first insulating layer comprises at least one of hafnium oxide, aluminum oxide, silicon oxide, gallium oxide, germanium oxide, yttrium oxide, zirconium oxide, lanthanum oxide, neodymium oxide, tantalum oxide, silicon nitride, aluminum nitride, silicon oxynitride, aluminum oxynitride, silicon nitride oxide, and aluminum nitride oxide.

5. A display apparatus comprising:
   the imaging device according to claim 1; and
   a light-emitting device adjacent to the first light-receiving device,
   wherein the light-emitting device comprises:
     a second pixel electrode adjacent to the first pixel electrode;
     a second layer over the second pixel electrode;
     the first insulating layer covering a first part of the second layer; and
     the common electrode covering the second layer,
   wherein the second layer comprises a light-emitting layer.

6. A display apparatus comprising:
   a light-receiving device comprising:
     a first pixel electrode;
     a first layer over the first pixel electrode;
     a first insulating layer covering a first part of the first layer; and
     a common electrode covering the first layer and the first insulating layer;
   a light-emitting device comprising:
     a second pixel electrode adjacent to the first pixel electrode;
     a second layer over the second pixel electrode;

the first insulating layer covering a first part of the second layer, layer; and
the common electrode covering the second layer,
wherein the first layer comprises a photoelectric conversion layer,
wherein the second layer comprises a light-emitting layer,
wherein the first insulating layer comprises a first opening portion, and
wherein the first opening portion overlaps with the first pixel electrode, the first layer, and the common electrode.

7. The display apparatus according to claim 5,
   wherein the first insulating layer comprises an inorganic material, and
   wherein the inorganic material is an oxide, a nitride, an oxynitride, or a nitride oxide.

8. The display apparatus according to claim 5,
   wherein the first insulating layer comprises at least one of hafnium oxide, aluminum oxide, silicon oxide, gallium oxide, germanium oxide, yttrium oxide, zirconium oxide, lanthanum oxide, neodymium oxide, tantalum oxide, silicon nitride, aluminum nitride, silicon oxynitride, aluminum oxynitride, silicon nitride oxide, and aluminum nitride oxide.

9. The display apparatus according to claim 8,
   wherein the first insulating layer comprises an inorganic material, and
   wherein the inorganic material is an oxide, a nitride, an oxynitride, or a nitride oxide.

10. The display apparatus according to claim 8,
    wherein the first insulating layer comprises at least one of hafnium oxide, aluminum oxide, silicon oxide, gallium oxide, germanium oxide, yttrium oxide, zirconium oxide, lanthanum oxide, neodymium oxide, tantalum oxide, silicon nitride, aluminum nitride, silicon oxynitride, aluminum oxynitride, silicon nitride oxide, and aluminum nitride oxide.

11. The display apparatus according to claim 6, further comprising:
    a second insulating layer covering a first part of the first pixel electrode and a first part of the second pixel electrode;
    wherein the first layer and the second layer are provided over the second insulating layer.

12. The display apparatus according to claim 11,
    wherein the first layer comprises a second part overlapping with neither the first insulating layer nor the second insulating layer, and
    wherein the second layer comprises a second region part overlapping with neither the first insulating layer nor the second insulating layer.

13. The display apparatus according to claim 11,
    wherein the second insulating layer comprises an organic material,
    wherein the first insulating layer comprises an inorganic material, and
    wherein the inorganic material is an oxide, a nitride, an oxynitride, or a nitride oxide.

14. The display apparatus according to claim 11,
    wherein the second insulating layer comprises at least one of an acrylic resin, an epoxy resin, a polyimide resin, a polyamide resin, a polyimide-amide resin, a polysiloxane resin, a benzocyclobutene-based resin, and a phenol resin, and
    wherein the first insulating layer comprises at least one of hafnium oxide, aluminum oxide, silicon oxide, gallium oxide, germanium oxide, yttrium oxide, zirconium oxide, lanthanum oxide, neodymium oxide, tantalum oxide, silicon nitride, aluminum nitride, silicon oxynitride, aluminum oxynitride, silicon nitride oxide, and aluminum nitride oxide.

\* \* \* \* \*